(12) United States Patent
Kawakami et al.

(10) Patent No.: US 11,088,328 B2
(45) Date of Patent: Aug. 10, 2021

(54) METHOD OF ANALYZING ORGANIC SEMICONDUCTOR ELEMENT

(71) Applicant: Semiconductor Energy Laboratory Co., Ltd., Kanagawa-ken (JP)

(72) Inventors: Sachiko Kawakami, Kanagawa (JP); Nozomi Komatsu, Kanagawa (JP); Satoshi Seo, Kanagawa (JP)

(73) Assignee: Semiconductor Energy Laboratory Co., Ltd.

(*) Notice: Subject to any disclaimer, the term of this patent is extended or adjusted under 35 U.S.C. 154(b) by 122 days.

(21) Appl. No.: 16/498,141

(22) PCT Filed: Mar. 26, 2018

(86) PCT No.: PCT/IB2018/052022
§ 371 (c)(1),
(2) Date: Sep. 26, 2019

(87) PCT Pub. No.: WO2018/185599
PCT Pub. Date: Oct. 11, 2018

(65) Prior Publication Data
US 2021/0119126 A1    Apr. 22, 2021

(30) Foreign Application Priority Data
Apr. 4, 2017    (JP) .............................. JP2017-074690

(51) Int. Cl.
*H01L 21/66*    (2006.01)
*H01L 51/00*    (2006.01)
(Continued)

(52) U.S. Cl.
CPC ....... *H01L 51/003* (2013.01); *G01N 30/7233* (2013.01); *G01N 30/74* (2013.01);
(Continued)

(58) Field of Classification Search
CPC ............... H01L 51/003; H01L 51/5072; H01L 51/5056; H01L 51/5016; G01N 30/74; G01N 30/7233; G01N 30/88
See application file for complete search history.

(56) References Cited

U.S. PATENT DOCUMENTS 5,522,918 A * 6/1996 Shiramizu .............. G01N 30/12
                                                      95/87
8,772,712 B2    7/2014 Kimura et al.
(Continued)

FOREIGN PATENT DOCUMENTS

JP    2007-324233 A    12/2007
JP    2012-215554 A    11/2012
(Continued)

OTHER PUBLICATIONS

International Search Report re AppplicationNo. PCT/IB2018/052022, dated Jul. 3, 2018.
Written Opinion re Application No. PCT/IB2018/052022, dated Jul. 3, 2018.

*Primary Examiner* — Caleb E Henry
(74) *Attorney, Agent, or Firm* — Husch Blackwell LLP

(57) ABSTRACT

A method of analyzing a light-emitting element is provided. The method analyzes an organic semiconductor element including an organic semiconductor layer including one or a plurality of layers between a pair of electrodes. The organic semiconductor element is analyzed with use of a step of separating one of the electrodes of the organic semiconductor element, a step of analyzing a stacked layer and/or a mixed state of the exposed organic semiconductor layer by a first mass analysis method, a step of forming a solution by eluting at least any one or a plurality of organic compounds included in layers in the organic semiconductor layer with a solvent, a step of isolating an organic compound included in the solution by liquid chromatography and analyzing the isolated organic compound by a second mass analysis (Continued)

method, a step of comparing a mass-to-charge ratio detected by the first mass analysis method and a mass-to-charge ratio detected by the second mass analysis method, and a step of measuring the physical properties of the isolated organic compound.

24 Claims, 36 Drawing Sheets

(51) Int. Cl.
  *H01L 51/50* (2006.01)
  *G01N 30/74* (2006.01)
  *H01L 51/56* (2006.01)
  *G01N 30/72* (2006.01)
  *G01N 30/88* (2006.01)

(52) U.S. Cl.
  CPC ......... *G01N 30/88* (2013.01); *H01L 51/5016* (2013.01); *H01L 51/5056* (2013.01); *H01L 51/5072* (2013.01); *H01L 51/56* (2013.01)

(56) References Cited

U.S. PATENT DOCUMENTS

| | | | |
|---|---|---|---|
| 2006/0166370 A1* | 7/2006 | Bailey | H01L 21/67253 436/173 |
| 2007/0172952 A1* | 7/2007 | Lee | G01N 23/2258 436/18 |
| 2013/0277549 A1 | 10/2013 | Kimura et al. | |
| 2014/0084274 A1 | 3/2014 | Yamazaki et al. | |
| 2014/0107338 A1 | 4/2014 | Ahn et al. | |
| 2016/0118605 A1 | 4/2016 | Kawakami et al. | |
| 2018/0166605 A1* | 6/2018 | Nagai | H01L 33/0075 |

FOREIGN PATENT DOCUMENTS

| | | |
|---|---|---|
| JP | 2013-024570 A | 2/2013 |
| JP | 2013-242302 A | 12/2013 |
| JP | 2014-078699 A | 5/2014 |
| JP | 2015-165015 A | 9/2015 |
| JP | 2015-165491 A | 9/2015 |
| JP | 5903448 | 4/2016 |
| JP | 2016-086171 A | 5/2016 |
| WO | WO 2012/121561 A1 | 9/2012 |

* cited by examiner

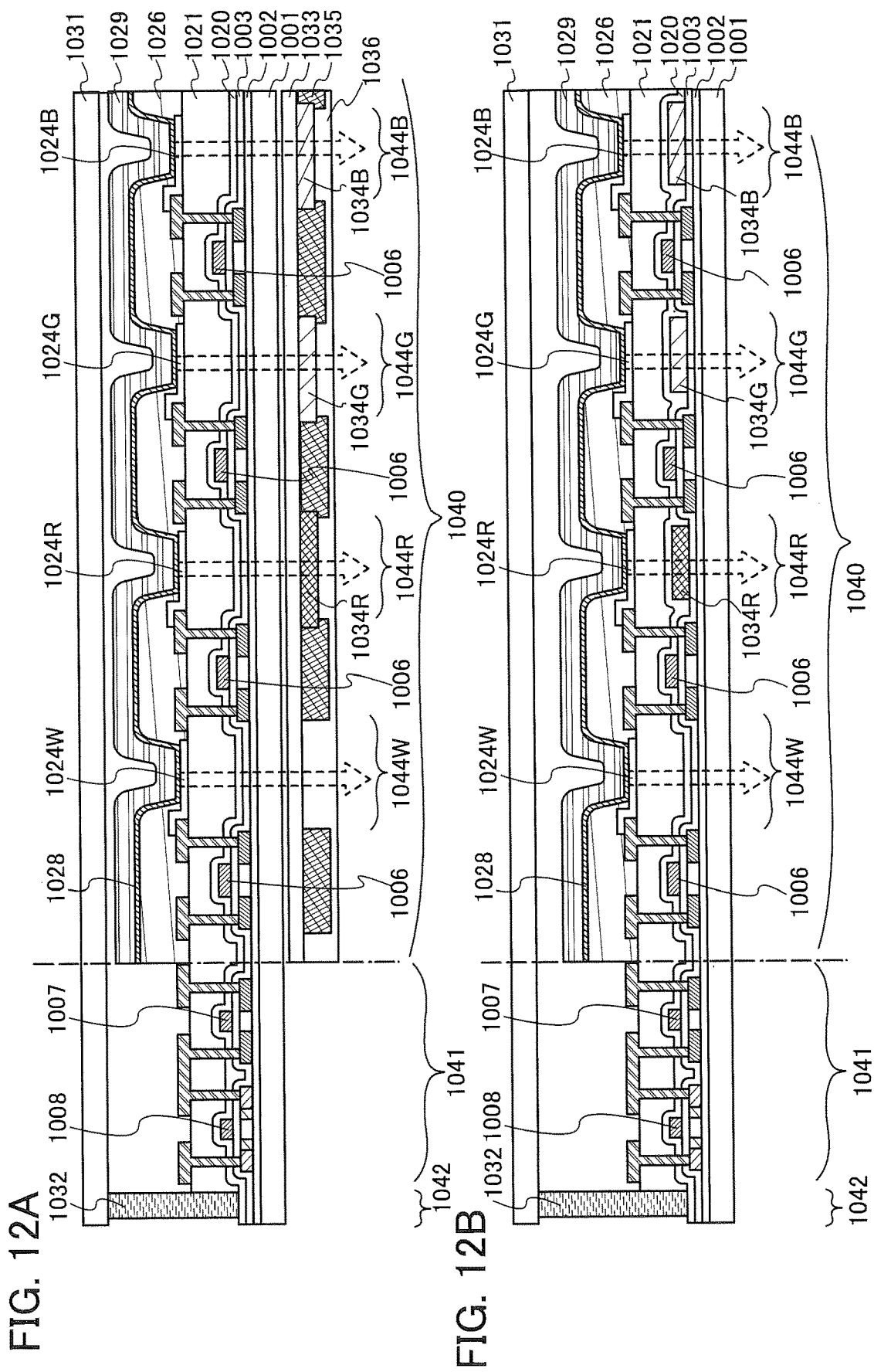

METHOD OF ANALYZING ORGANIC SEMICONDUCTOR ELEMENT

This application is a 371 of international application PCT/IB2018/052022 filed on Mar. 26, 2018 which is incorporated herein by reference.

TECHNICAL FIELD

One embodiment of the present invention relates to a novel method of analyzing an organic semiconductor element. In particular, one embodiment of the present invention relates to a method of analyzing an organic semiconductor element using a mass analysis method and a liquid chromatography.

BACKGROUND ART

Light-emitting elements (organic EL elements) that use organic compounds and utilize electroluminescence (EL) and organic semiconductor elements such as organic solar cells have been put to practical use. The basic structure of such organic semiconductor elements is a structure in which an organic semiconductor layer including a light-emitting material is interposed between a pair of electrodes.

Such an organic semiconductor element is lightweight, flexible, and highly designed. The organic semiconductor element has various advantages, for example, coating process is possible, and thus its research and development have actively proceeded. In particular, light-emitting elements are of self-light-emitting type, and have advantages, such as high visibility and no need for backlight when used for pixels of a display; accordingly, the light-emitting elements are suitable as flat panel display elements.

In such an organic semiconductor element, an organic semiconductor layer obtained by thinning an organic compound is mainly formed. The organic compound and the layer structure largely influence the organic semiconductor element; accordingly, selection of the organic compound and the layer structure is important.

Examples of a method for forming the organic semiconductor layer include a vacuum evaporation method by which an organic compound is deposited by being heated in a vacuum, and a wet method by which an organic compound is dissolved in a solvent and applied to a substrate. However, in both the methods, stress such as heat is applied to the organic compound. For this reason, there is a case where an organic compound used for formation of the organic semiconductor layer is decomposed when being deposited, for example, and thus desired characteristics of an organic semiconductor element cannot be obtained, or a case where a decomposition product adversely affects the element characteristics, as an impurity. Patent Document 1 discloses that an impurity adversely affects the light-emitting element characteristics.

Since the element characteristics are adversely affected in the deposition, it is necessary to analyze an organic compound in an organic semiconductor element. However, it has been difficult to analyze the organic compound. It has also been difficult to analyze whether a desired layer structure is formed on the basis of the organic semiconductor element.

PRIOR ART DOCUMENT

Patent Document

[Patent Document 1] Japanese Published Patent Application No. 2016-86171
[Patent Document 2] Japanese Patent No. 5903448

SUMMARY OF THE INVENTION

Problems to be Solved by the Invention

In view of the above, an object of one embodiment of the present invention is to provide a method of analyzing an organic compound in an organic semiconductor element. Another object of one embodiment of the present invention is to provide a method of analyzing a molecular structure of an organic compound in an organic semiconductor element. Another object of one embodiment of the present invention is to provide a method of analyzing the optical characteristics of an organic compound in an organic semiconductor element. Another object of one embodiment of the present invention is to provide a method of analyzing a layer structure in an organic semiconductor element. Another object of one embodiment of the present invention is to provide a method of analyzing a light emission mechanism in an organic semiconductor element. Another object of one embodiment of the present invention is to provide a method of analyzing a novel organic semiconductor element.

Note that the description of the above objects does not preclude the existence of other objects. In one embodiment of the present invention, there is no need to achieve all the objects. Objects other than the above will be apparent from the description of the specification and the like, and objects other than the above can be derived from the description of the specification and the like.

One embodiment of the present invention is a method of analyzing an organic semiconductor element including an organic semiconductor layer including one or a plurality of layers between a pair of electrodes. The method of analyzing an organic semiconductor element includes a step of separating one of the electrodes of the organic semiconductor element, a step of analyzing a layer structure and/or a mixed state of the exposed organic semiconductor layer by a first mass analysis method, a step of forming a solution by eluting one or a plurality of organic compounds included in layers in the organic semiconductor layer with a solvent, a step of isolating the organic compound included in the solution by liquid chromatography and analyzing the isolated organic compound by a second mass analysis method, a step of comparing a mass-to-charge ratio (m/z) detected by the first mass analysis method and a mass-to-charge ratio detected by the second mass analysis method, and a step of measuring a physical property of the isolated organic compound.

In the above-described structure, as the measurement of the physical property of the isolated organic compound, the measurement of at least any one of an NMR spectrum, an absorption spectrum, a light emission spectrum, and a light emission lifetime is preferably performed.

In the above-described structure, at least a first organic compound is detected by the second mass analysis method which includes a step of estimating a compositional formula from a mass-to-charge ratio of the first organic compound, a step of obtaining a first NMR spectrum of the first organic compound by NMR measurement of the first organic compound, a step of estimating a second organic compound with use of the compositional formula and the NMR spectrum, a step of synthesizing the second organic compound, a step of obtaining a second NMR spectrum of the second organic compound by the NMR measurement, and a step of comparing the first NMR spectrum and the second NMR spectrum. With such a structure, the structure of the organic compound included in the organic semiconductor element can be identified.

In the above-described structure, the analysis method with the above-described structure preferably further includes a step of measuring $^1$H-NMR of the solution, a step of isolating at least two organic compounds, a step of measuring $^1$H-NMR of each of the at least two organic compounds, and a step of calculating molar ratios of the at least two organic compounds by comparing $^1$H-NMR of the solution and $^1$H-NMR of each of the at least two organic compounds. With such a structure, the mixing ratio of at least two organic compounds included in the organic semiconductor element can be calculated.

Another embodiment of the present invention is a method of analyzing an organic semiconductor element including an organic semiconductor layer including one or a plurality of layers between a pair of electrodes. The method of analyzing an organic semiconductor element includes a step of separating one of the electrodes of the organic semiconductor element, a step of analyzing a layer structure and/or a mixed state of the exposed organic semiconductor layer by a first mass analysis method, a step of identifying a first layer including a plurality of organic compounds by the first mass analysis method, a step of forming a solution by eluting one or a plurality of organic compounds included in layers in the organic semiconductor layer with a solvent, a step of isolating an organic compound included in the solution by liquid chromatography and analyzing the isolated organic compound by a second mass analysis method, a step of comparing a mass-to-charge ratio detected by the first mass analysis method and a mass-to-charge ratio detected by the second mass analysis method, a step of determining a first organic compound and a second organic compound, which are included in the first layer in the organic semiconductor layer, from the isolated compounds, a step of measuring a first light emission spectrum of the first organic compound, a step of measuring a second light emission spectrum of the second organic compound, and a step of measuring a third light emission spectrum of a mixture of the first organic compound and the second organic compound.

Another embodiment of the present invention is a method of analyzing an organic semiconductor element including an organic semiconductor layer including one or a plurality of layers between a pair of electrodes. The method of analyzing an organic semiconductor element includes a step of separating one of the electrodes of the organic semiconductor element, a step of analyzing a layer structure and/or a mixed state of the exposed organic semiconductor layer by a first mass analysis method and identifying a first layer including a plurality of organic compounds, a step of forming a solution by eluting one or a plurality of organic compounds included in layers in the organic semiconductor layer with a solvent, a step of isolating an organic compound included in the solution by liquid chromatography and analyzing the isolated organic compound by a second mass analysis method, a step of comparing a mass-to-charge ratio detected by the first mass analysis method and a mass-to-charge ratio detected by the second mass analysis method and presuming a first organic compound, a second organic compound, and a third organic compound, which are included in the first layer in the organic semiconductor layer, a step of measuring a light emission lifetime of the first organic compound, a step of measuring an absorption spectrum of the first organic compound, a step of measuring a first light emission spectrum of the second organic compound, a step of measuring a second light emission spectrum of the third organic compound, and a step of measuring a third light emission spectrum of a mixture of the second organic compound and the third organic compound.

Another embodiment of the present invention is a method of analyzing an organic semiconductor element including an organic semiconductor layer including one or a plurality of layers between a pair of electrodes. The organic semiconductor layer includes a first organic compound including Ir. The method of analyzing an organic semiconductor element includes a step of separating one of the electrodes of the organic semiconductor element, a step of analyzing a layer structure and/or a mixed state of the exposed organic semiconductor layer by a first mass analysis method and identifying a first layer including a plurality of organic compounds, a step of forming a solution by eluting one or a plurality of organic compounds included in layers in the organic semiconductor layer with a solvent, a step of isolating an organic compound included in the solution by liquid chromatography and analyzing the isolated organic compound by a second mass analysis method, a step of comparing a mass-to-charge ratio detected by the first mass analysis method and a mass-to-charge ratio detected by the second mass analysis and presuming a first organic compound and a second organic compound, which are included in the first layer in the organic semiconductor layer, a step of measuring an absorption spectrum of the first organic compound, and a step of measuring a light emission spectrum of the second organic compound.

Another embodiment of the present invention is a method of analyzing an organic semiconductor element including an organic semiconductor layer including one or a plurality of layers between a pair of electrodes. The organic semiconductor layer includes a first organic compound including Ir. The method of analyzing an organic semiconductor element includes a step of separating one of the electrodes of the organic semiconductor element, a step of analyzing a layer structure and/or a mixed state of the exposed organic semiconductor layer by a first mass analysis method and identifying a first layer including a plurality of organic compounds, a step of forming a solution by eluting one or a plurality of organic compounds included in layers in the organic semiconductor layer with a solvent, a step of isolating an organic compound included in the solution by liquid chromatography and analyzing the isolated organic compound by a second mass analysis method, a step of comparing a mass-to-charge ratio detected by the first mass analysis method and a mass-to-charge ratio detected by the second mass analysis and presuming a first organic compound, a second organic compound, and a third organic compound, which are included in the first layer in the organic semiconductor layer, a step of measuring an absorption spectrum of the first organic compound, a step of measuring a first light emission spectrum of the second organic compound, a step of measuring a second light emission spectrum of the third organic compound, and a step of measuring a third light emission spectrum of a mixture of the second organic compound and the third organic compound.

In the above-described structure, the organic semiconductor element is preferably an EL element or a photoelectric conversion element.

In the above-described structure, the organic semiconductor layer is preferably formed of a single organic compound.

In the above-described structure, the organic semiconductor layer preferably includes the first layer including a hole-transport material, a second layer including a light-emitting substance, and a third layer including an electron-transport material; the first layer, the second layer, and the third layer are preferably stacked in this order from the anode side; the first layer and the second layer are preferably in contact with each other; and the second layer and the third layer are preferably in contact with each other.

In the above-described structure, a phosphorescent compound is preferably included as the light-emitting substance.

In the above-described structure, the second layer preferably includes a phosphorescent substance, a first compound, and a second compound, and the first compound and the second compound preferably form an exciplex.

In the above-described structure, the second layer preferably includes a material exhibiting thermally activated delayed fluorescence.

In the above-described structure, the first mass analysis is preferably any one of GCIB (Gas Cluster Ion Beam)-TOF-SIMS (Time-of-flight secondary ion mass spectrometer) analysis, TOF-SIMS after oblique cutting, and MALDI (Matrix Assisted Desorption Ionization)-TOF-MS after oblique cutting. With such a structure, a layer structure of a light-emitting element can be analyzed in detail.

In the above-described structure, the second mass analysis is preferably LC (Liquid Chromatography)-MS analysis. With such a structure, the analysis can be performed efficiently.

In the above-described structure, in the second mass analysis, a mass-to-charge ratio detected is preferably measured to three or more decimal places. With such a structure, a compositional formula of an organic compound included in the organic semiconductor element can be obtained.

In the above-described structure, the thickness of the organic semiconductor layer is preferably greater than or equal to 100 nm and less than or equal to 1 μm. With such a structure, the analysis can be performed efficiently.

In the above-described structure, a step of processing the organic semiconductor element to have an area less than or equal to 100 cm$^2$ is preferably included. With such a structure, the analysis can be performed efficiently.

In the above-described structure, the area of the organic semiconductor element is preferably greater than or equal to 4 mm$^2$ and less than or equal to 100 cm$^2$. With such a structure, the analysis can be performed efficiently.

In the above-described structure, the weight of the organic semiconductor layer per unit area is preferably greater than or equal to 1 μg/cm$^2$ and less than or equal to 100 μg/cm$^2$. With such a structure, the analysis can be performed efficiently.

In the above-described structure, the weight of the organic semiconductor layer is preferably greater than or equal to 0.04 μg and less than or equal to 1 mg. With such a structure, the analysis can be performed efficiently.

One embodiment of the present invention can provide a method of analyzing an organic compound in an organic semiconductor element. One embodiment of the present invention can provide a method of analyzing a molecular structure of an organic compound in an organic semiconductor element. One embodiment of the present invention can provide a method of analyzing the optical characteristics of an organic compound in an organic semiconductor element. One embodiment of the present invention can provide a method of analyzing a layer structure in an organic semiconductor element. One embodiment of the present invention can provide a method of analyzing the light emission mechanism in an organic semiconductor element. One embodiment of the present invention can provide a method of analyzing a novel organic semiconductor element.

Note that the description of these effects does not preclude the existence of other effects. Note that one embodiment of the present invention does not necessarily have all these effects. Note that other effects will be apparent from the description of the specification, the drawings, the claims, and the like, and other effects can be derived from the description of the specification, the drawings, the claims, and the like.

BRIEF DESCRIPTION OF DRAWINGS

FIGS. 12A and 12B are conceptual diagrams of an active matrix light-emitting device to which an analysis method of one embodiment of the present invention can be applied.

BEST MODE FOR CARRYING OUT THE INVENTION

Figure 1:
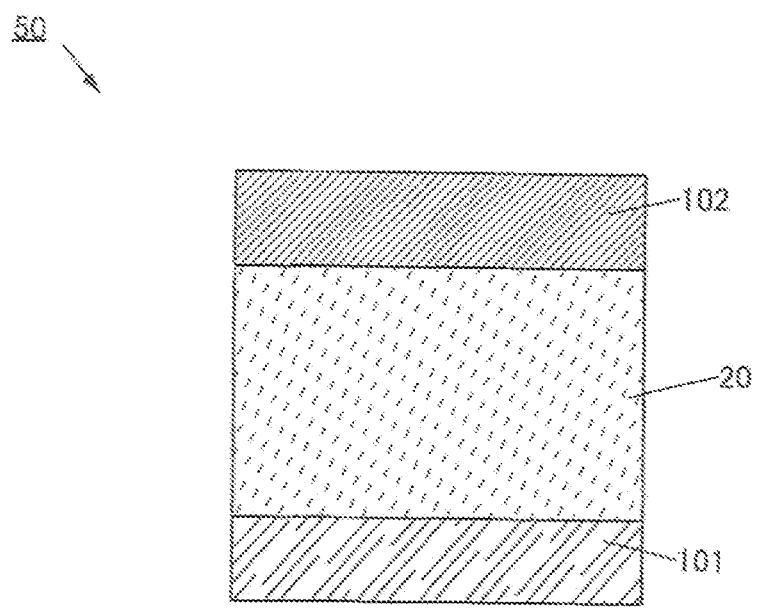
FIG. 1 is a schematic cross-sectional view of an organic semiconductor element to which an analysis method of one embodiment of the present invention can be applied.

Embodiments of the present invention are described in detail below using the drawings. Note that the present invention is not limited to description below, and modes and details thereof can be variously modified without departing from the purpose and the scope of the present invention. Thus, the present invention should not be interpreted as being limited to the description of the embodiments described below.

Note that the position, the size, the range, or the like of each structure shown in drawings and the like does not represent the actual position, size, range, or the like in some cases for easy understanding. Therefore, the disclosed invention is not necessarily limited to the position, the size, the range, or the like disclosed in the drawings and the like.

The ordinal numbers such as first and second in this specification and the like are used for convenience and do not denote the order of steps or the stacking order of layers in some cases. Therefore, for example, description can be made even when "first" is replaced with "second", "third", or the like as appropriate. In addition, the ordinal numbers in this specification and the like are not the same as those which specify one embodiment of the present invention in some cases.

In describing structures of the invention using the drawings in this specification and the like, common numerals are used for the same components in different drawings in some cases.

In this specification and the like, the terms "film" and "layer" can be interchanged with each other. For example, the term "conductive layer" can be changed into the term "conductive film" in some cases. Alternatively, for example, the term "insulating film" can be changed into the term "insulating layer" in some cases.

Note that in this specification and the like, room temperature refers to a temperature in the range of higher than or equal to 0° C. and lower than or equal to 40° C.

In this specification, the term "around" in description of measured values (a mass-to-charge ratio; m/z) in measurement results of ToF-SIMS or LC-MS is used to allow for variations in measured values due to the presence or absence of hydrogen ions and the presence of isotopes.

Embodiment 1

In this embodiment, an analysis method of one embodiment of the present invention will be described below using an organic semiconductor element shown in FIG. 1.

Structure Example 1 of Organic Semiconductor Element

An organic semiconductor element 50 includes a pair of electrodes (an electrode 101 and an electrode 102) and an organic semiconductor layer 20. The organic semiconductor layer 20 may include a plurality of functional layers.

In the case where the organic semiconductor layer 20 is formed, a thin film formed of an organic compound is formed by applying a load to the organic compound, such as heat treatment or dissolution in a solvent. At this time, the load for the film formation might cause a change in the organic compound, such as decomposition. Therefore, the state of the organic compound before an EL layer is formed might differ from the state of the organic compound after the EL layer is formed. It is important that the organic semiconductor layer 20 have a desired element structure because it largely influences the characteristics of the organic semiconductor element 50.

Analyzing the layer structure and the organic compound of the organic semiconductor layer 20 is useful because various kinds of information can be obtained, such as the states of the organic compound before and after the film formation, the existence or non-existence of a decomposition product and an impurity, the structure of the organic compound, and functions of layers included in the EL layer. However, the thickness of the organic semiconductor layer in FIG. 1 is extremely small, which is several nanometers to several micrometers, and each layer is formed using an organic substance; therefore, analysis with a microscope or the like is difficult and analyzing whether an organic semiconductor layer with a desired thickness or a desired layer structure can be formed and what layer structure is included is very difficult.

Here, the present inventors have found that the layer structure of an organic semiconductor element and organic compounds included in layers can be analyzed by performing: a step of separating one of the electrode 101 and the electrode 102; a step of analyzing the stacked structure of the exposed organic semiconductor layer 20 and mass-to-charge ratios of organic compounds included in the layers by the first mass analysis method; a step of eluting at least one of or a plurality of organic compounds included in the layers of the organic semiconductor layer 20 into a solvent to form a solution; a step of isolating an organic compound included in the solution by liquid chromatography to detect the mass-to-charge ratio of the isolated organic compound by a second mass analysis method; a step of comparing the mass-to-charge ratio detected by the first mass analysis and the mass-to-charge ratio detected by the second mass analysis to analyze which layer in the organic semiconductor layer includes the isolated organic compound; and a step of measuring the physical properties of the isolated organic compound.

A TOF-SIMS method can be preferably used as the first mass analysis method. In particular, a GCIB-TOF-SIMS analysis is further preferably used. In the GCIB-TOF-SIMS analysis, ion sputtering is utilized, and MS analysis is possible while the surface is being etched. That is, MS analysis in the depth direction of the organic semiconductor layer is possible; accordingly, the GCIB-TOF-SIMS analysis can be suitably used for analysis of stacked structures. Furthermore, the mass-to-charge ratio of organic compounds included in each layer in the organic semiconductor layer can be obtained, and a mixing state of the organic compounds included in each layer can be analyzed.

Figure 2A:
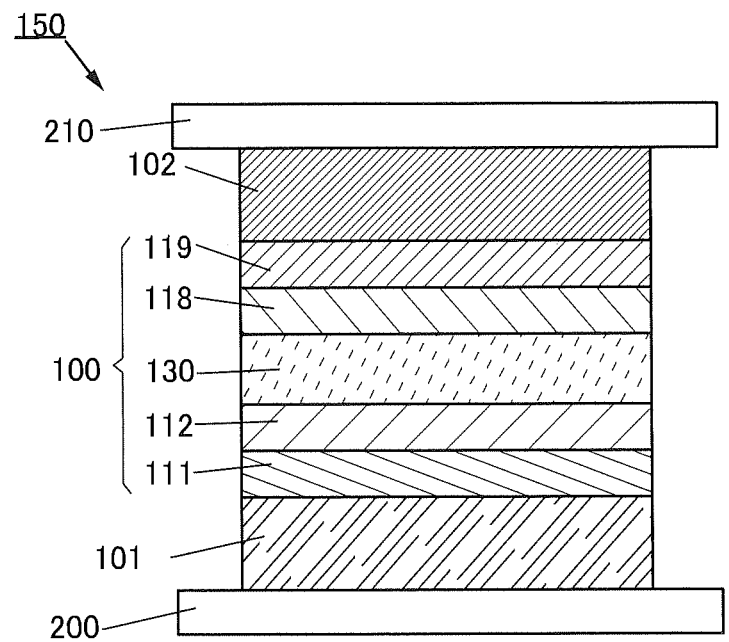
FIGS. 2A-2C are schematic cross-sectional views of an organic semiconductor element to which an analysis method of one embodiment of the present invention can be applied, and a schematic view of a light-emitting layer.
Figure 2B:
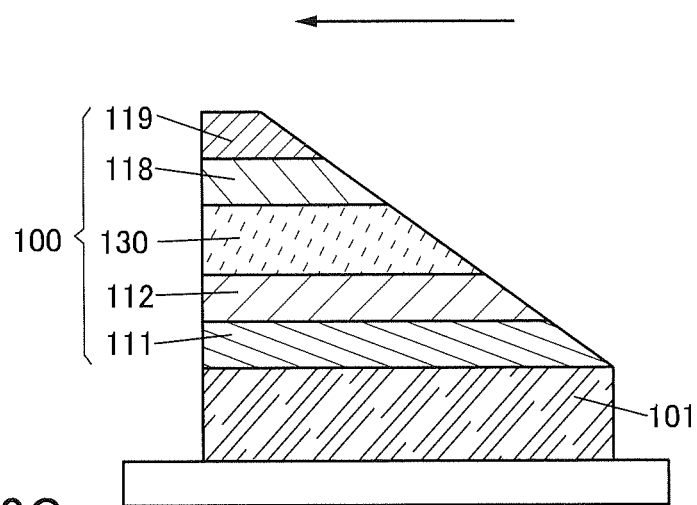

As the first mass analysis method, after organic semiconductor layers are cut obliquely when viewed in a direction in which the organic semiconductor layers are stacked, as shown in FIG. 2(B) to be described later, the TOF-SIMS analysis or a MALDI-TOF-MS analysis method can be used. By oblique cutting of the organic semiconductor layers, each layer included in the organic semiconductor layer can be exposed at the outermost surface; thus, the layer structure of the organic semiconductor layer can be analyzed.

The total thickness of the organic semiconductor layer is preferably greater than or equal to 100 nm and less than or equal to 1 μm. With the above structure, the TOF-SIMS analysis and the MALDI-TOF-MS analysis can be performed easily. Furthermore, analysis can be performed by the analysis method of one embodiment of the present invention, even when the sample amount is extremely small.

The area of the organic semiconductor element is preferably greater than or equal to 4 mm$^2$ and less than or equal to 100 cm$^2$. This structure is preferable because it facilitates sample fabrication in an anaerobic atmosphere; sample fabrication in an anaerobic atmosphere brings more accurate analysis results. Furthermore, the TOF-SIMS analysis, the MALDI-TOF-MS analysis, and formation of the above-described solution can be easily performed. For the above reasons, in the case where the area of the organic semiconductor element exceeds 100 cm$^2$, analysis is preferably performed after the organic semiconductor element is processed to be 4 mm$^2$ or more and 100 cm$^2$ or less.

It is preferable that the weight of the organic semiconductor layer per unit area be 1 μg/cm$^2$ or more and 100 μg/cm$^2$ or less and the weight of the semiconductor layer be 0.04 μg or more and 1 mg or less. With this structure, the TOF-SIMS analysis and the MALDI-TOF-MS analysis can be performed with high sensitivity.

As described above, analysis can be performed by the analysis method of one embodiment of the present invention, even when the sample amount is extremely small. For example, a smartphone-size panel can be analyzed. In addition, a test piece-size sample can be analyzed.

Structure Example 2 of Organic Semiconductor Element

An example of analyzing an organic semiconductor element will be described using a light-emitting element 150 illustrated in FIG. 2.

The light-emitting element 150 includes a pair of substrates (a substrate 200 and a substrate 210), a pair of electrodes (an electrode 101 and an electrode 102), and an EL layer 100 provided between the pair of electrodes. The EL layer 100 includes at least a light-emitting layer 130.

The EL layer 100 shown in FIG. 2(A) includes functional layers such as a hole-injection layer 111, a hole-transport layer 112, an electron-transport layer 118, and an electron-injection layer 119, in addition to the light-emitting layer 130.

Note that, although description is given assuming that the electrode 101 and the electrode 102 of the pair of electrodes serve as an anode and a cathode in this embodiment, the structure of the light-emitting element 150 is not limited thereto. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

Note that the structure of the EL layer 100 is not limited to the structure shown in FIG. 2(A), and the EL layer 100 includes at least the light-emitting layer 130 and does not necessarily include the hole-injection layer 111, the hole-transport layer 112, the electron-transport layer 118, and the electron-injection layer 119. The EL layer 100 may have a structure including functional layers which have a function such as capability of lowering a hole- or electron-injection barrier, improving a hole- or electron-transport property, inhibiting a hole- or electron-transport property, suppressing exciton diffusion, or suppressing a quenching phenomenon by an electrode, for example. Note that the functional layers may each be a single layer or a structure in which a plurality of layers are stacked.

As shown in FIG. 2 (C), the light-emitting layer 130 may include an organic compound 132 (host material) and a light-emitting material (guest material) 131.

Analysis Example 1 of Organic Semiconductor Element

Figure 3:
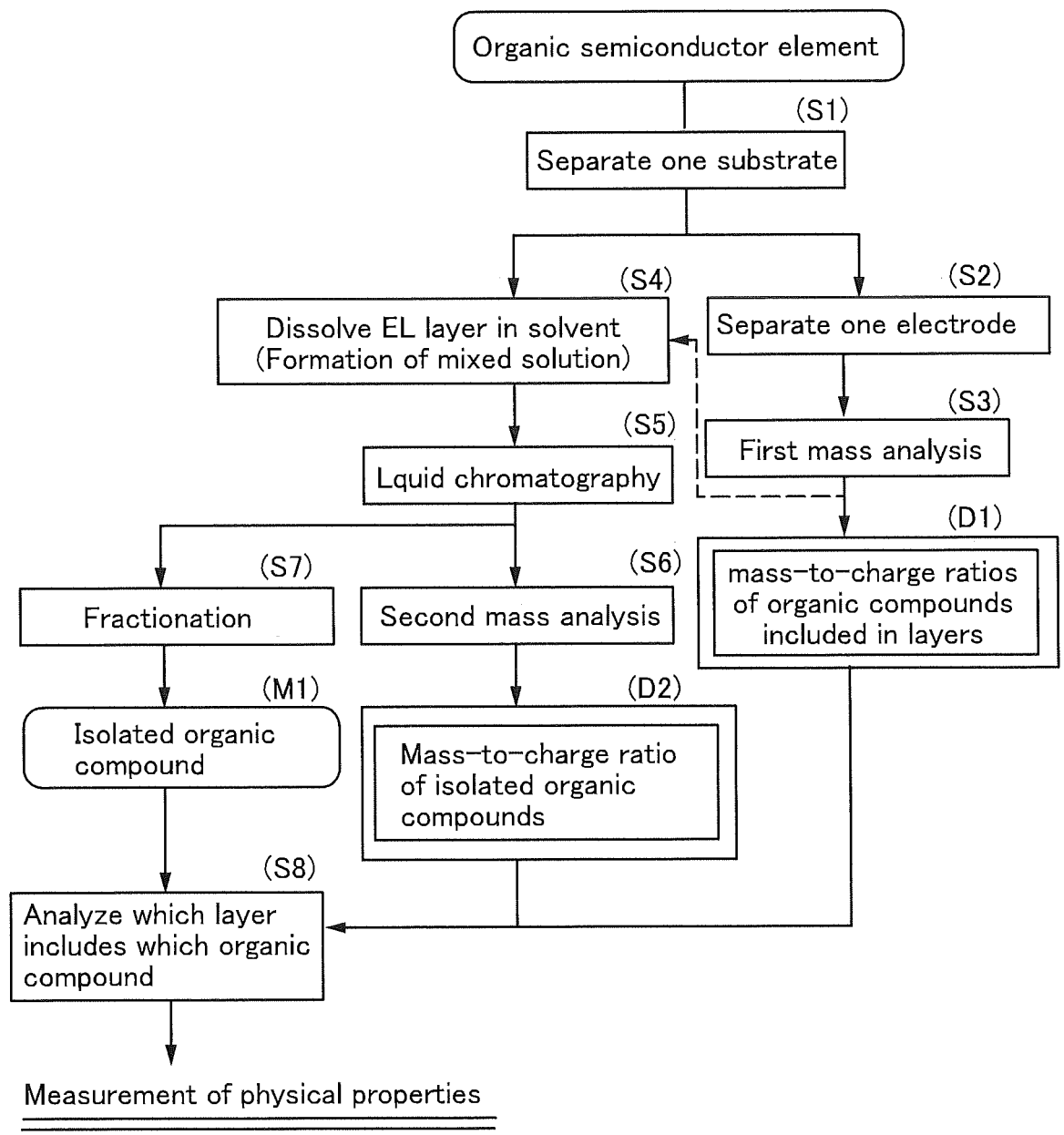
FIG. 3 is a flow chart explaining an analysis method of one embodiment of the present invention.

An analysis method of one embodiment of the present invention which analyzes whether each layer has a desired thickness and a desired layer structure in the case where the above light-emitting element 150 is formed will be described below. FIG. 3 is a flow chart explaining a main process of a purification method of one embodiment of the present invention.

A substrate 210, which is one of the substrates of the light-emitting element 150 to be analyzed, is separated (see (S1) in FIG. 3). By separation of the substrate 210, the electrode 102 and the EL layer 100 are exposed. There is no particular limitation on a method of separating the substrate 210; a trigger is made in a sealant with a laser or a blade and the substrate can be separated by physical force.

Next, one of the electrodes is separated to perform the first mass analysis (see (S2) in FIG. 3). There is no particular limitation on a method of separating the substrate 210, and for example, an adhesive tape can be used for the separation. A tape that is less likely to cause dust is preferable as the adhesive tape, and a polyimide tape can be suitably used.

Here, in the case where GCIB-TOF-SIMS analysis is performed as the first mass analysis, GCIB is suitably used for the EL layer 100; whereas GCIB is not suitable for sputtering the electrode 102 that is an inorganic material and a sputtering ion gun different from GCIB is needed for sputtering the electrode 102. The electrode 102 is separated and then the TOF-SIMS analysis is performed; thus, the measurement can be performed easily. Note that an argon gas is suitably used for GCIB.

As shown in FIG. 2(B), the substrate 210 and the electrode 102 are separated and the exposed EL layer 100 is cut obliquely; thus, layers included in the EL layer can be exposed at the outermost surface. Therefore, the layer structure of the EL layer can be analyzed by performing the TOF-SIMS SIMS analysis or the MALDI-TOF-MS analysis after the oblique cutting.

Next, the first mass analysis is performed (see (S3) in FIG. 3). Here, the case where GCIB-TOF-SIMS analysis is performed as the first mass analysis is described. The GCIB-TOF-SIMS analysis can measure a mass-to-charge ratio of organic compounds in the depth direction of the EL layer. For example, in the case where the light-emitting element 150 shown in FIG. 2 is subjected to the GCIB-TOF-SIMS analysis from the electron-injection layer 119 side, first, an organic compound included in the electron-injection layer 119 is detected and then mass-to-charge ratios of organic compounds included in the electron-transport layer 118, the light-emitting layer 130, the hole-transport layer 112, and the hole-injection layer 111 are detected in the stacking order (see (D1) in FIG. 3). In other words, by analyzing the order of the obtained mass-to-charge ratios, the stacked structure of the EL layer 100 can be analyzed. Accordingly, the stacked structure of the EL layer 100, organic compounds included in the layers, and the mixed state of the organic compounds can be analyzed by the GCIB-TOF-SIMS analysis. Note that the GCIB-TOF-SIMS analysis is preferable because measurement can be performed without oblique cutting as long as one electrode is separated.

After the oblique cutting, when the TOF-SIMS analysis or the MALDI-TOF-MS analysis is performed while scanning is performed, for example, in the direction shown by an arrow in FIG. 2(B), an organic compound included in the hole-injection layer 111 is detected first, and then mass-to-charge ratios of organic compounds included in the hole-transport layer 112, the light-emitting layer 130, the electron-transport layer 118, and the electron-injection layer 119 are detected in the stacking order. In other words, by analyzing the order of the obtained mass-to-charge ratios, the stacked structure of the EL layer 100 can be analyzed. Accordingly, the stacked structure of the EL layer 100, organic compounds included in the layers, and the mixed state of the organic compounds can be analyzed by the GCIB-TOF-SIMS analysis.

Note that in the case where a plurality of organic compounds are mixed in one layer as in the light-emitting layer 130, the number of organic compounds mixed can be found by the first mass analysis. In other words, information on a mixed state in each layer can be obtained. In the mass analysis, an isotope peak is also observed at the same time as m/z of organic compounds which are measurement targets; accordingly, when the organic compound included in each layer includes an element from which a characteristic isotope peak is detected, such as iridium (Ir), chlorine (Cl), or bromine (Br), information on an element included in the organic compound can be obtained.

Note that the GCIB-TOF-SIMS analysis enables a small amount measurement, and the measurement can be performed nondestructively on a portion other than a portion irradiated with sputtering ions. The TOF-SIMS analysis and the MALDI-TOF-MS analysis after the oblique cutting also enables a small amount measurement, and the measurement can be performed nondestructively on a portion other than a portion scanned. Thus, as indicated by the dashed line in FIG. 3, the sample subjected to the first mass analysis can be used in the step (S4) in FIG. 3. Measurement performed in this procedure is preferable because the organic compounds included in the EL layer 100 can be efficiently analyzed even when the sample amount is small.

The sample from which the substrate 210 of the light-emitting element is separated (the step (S1) in FIG. 3 is completed) is used, and a solution in which the EL layer 100 is dissolved in a desired solvent is formed (see (S4) in FIG. 3). In that case, only the organic compound is separated from the solution by the following liquid chromatography (see (S5) in FIG. 3); thus, a substance other than the EL layer, such as the electrode used in the light-emitting element 150, may be mixed in the mixed solution. That is, not only the EL layer 100 included in the light-emitting element needs to be dissolved. In order to perform the step (S5) in FIG. 3, formation of the solution ((S4) in FIG. 3) can be performed easily. As described above, the sample used in the step (S3) in FIG. 3 can also be used in the step (S4) in FIG. 3.

The solvent used for the formation of the solution ((S4) in FIG. 3) is preferably an organic solvent, and acetone, toluene, ethyl acetate, acetonitrile, ethanol, methanol, dimethyl sulfoxide (abbreviation: DMSO), N,N-dimethylformamide (abbreviation: DMF), N-methyl-2-pyrrolidinone (abbreviation: NMP), or the like can be used. Furthermore, a chlorine-containing organic solvent, such as dichloromethane, chloroform, or carbon tetrachloride, is further preferable. The chlorine-containing organic solvent is preferable because it can dissolve the organic compound efficiently, which means that a large amount of the EL layer 100 can be dissolved with a small amount of the solvent. Note that the solvent that can be used is not limited to the above.

With use of a flame-resistance heavy hydrogen solvent, such as $CD_2Cl_2$ or $CDCl_3$, NMR measurement to be described after the formation of the solution ((S4) in FIG. 3) can be performed, which is preferable. By the NMR measurement, information for separating an organic compound at the following step (S5) in FIG. 3 can be obtained. Furthermore, by the NMR measurement, in a layer where a plurality of organic compounds to be described later are mixed, the mixing ratio (molar ratio) of the organic compounds can be analyzed.

Next, the organic compound included in the solution prepared in the step (S4) in FIG. 3 is separated by liquid chromatography (see (S5) in FIG. 3). In the case where the EL layer 100 includes a plurality of organic compounds, each organic compound is isolated at this step. In the case where isolation cannot be performed by one liquid chromatography step, this step may be performed plural times.

For the liquid chromatography, an HPLC (High Performance liquid chromatography) device is preferably used. With use of the HPLC device, the separation can be easily performed even when the sample amount is small. The HPLC device can be connected to an MS device and a preparative device, in which case the steps (S5) in FIG. 3 and (S6) in FIG. 3 and the steps (S5) in FIG. 3 and (S7) in FIG. 3 can be performed successively. The above structure is preferable because separation and purification of the organic compounds can be performed efficiently. With the structure in which the HPLC device and the MS device are connected, a chromatogram that can be obtained by HPLC and the mass-to-charge ratio that can be obtained by MS measurement are analyzed, so that which peak in the chromatogram is attributed to which organic compound having a mass-to-charge ratio can be known, whereby precise separation can be performed.

Next, second mass analysis, that is, mass analysis performed on the isolated organic compound, is performed (see (S6) in FIG. 3). Through the step (S6) in FIG. 3, a mass-to-charge ratio (see (D2) in FIG. 3) derived from each isolated organic compound can be obtained. By this step ((S6) in FIG. 3), a mass-to-charge ratio having four or more decimal places is obtained; thus, a compositional formula of the isolated organic compound can be analyzed. Note that the value of the mass-to-charge ratio detected to four or more decimal places is called precise mass in some cases.

As the second mass analysis, LC-MS analysis is preferably performed. In the LC-MS analysis, the steps (S5) in FIG. 3 and (S6) in FIG. 3 can be performed successively as described above; thus, separation and purification can be performed efficiently. The LC-MS device is preferable because a device for obtaining separated organic compound can also be connected.

In addition, the MS/MS measurement is preferably performed at the step (S6) in FIG. 3. By the MS/MS measurement, the mass-to-charge ratio derived from an organic compound fragment can be obtained, whereby a structure, a substituent, and a composition formula of the organic compound included in the EL layer can be presumed.

The organic compound isolated at the step (S5) in FIG. 3 is obtained (see (S7) in FIG. 3). Since the isolated organic compound (see (M1) in FIG. 3) can be obtained in a solution state at this step, measurement of various physical properties can be performed, such as NMR measurement, optical measurement of emission characteristics, absorption characteristics, and emission lifetime characteristics, measurement of triplet excitation (T1) level, and thermophysical property measurement.

Through the above steps, the organic compounds included in the layers in the EL layer can be isolated and obtained; accordingly, by comparing the mass-to-charge ratio and the layer structure data obtained by the first mass analysis (see (D1) in FIG. 3) and the mass-to-charge ratio of the isolated organic compound obtained by the second mass measurement (see (D2) in FIG. 3), which layer in the EL layer 100 includes the isolated organic compound (M1) can be determined (see (S8) in FIG. 3).

As described above, when a plurality of organic compounds is detected from the same layer, the mixing ratio of the organic compounds is important in some cases. For example, the light-emitting layer includes a host material and a guest material, and the mixing ratio of the host material and the guest material is important for the emission characteristics. Here, each of the organic compounds included in the same layer and obtained through the above steps is subjected to $^1$H-NMR measurement, and the NMR spectrum obtained before the isolation and the $^1$H-NMR spectrum of the isolated organic compound are compared; thus, the molar ratio of the plurality of organic compounds included in the same layer can be calculated.

By detailed analysis of the isolated organic compound (M1), the structure and the physical properties of the organic compound, functions of the layers, and the like can be analyzed. For example, by analysis of an organic compound included in the hole-transport layer, the substance state before and after the film formation can be known. Therefore, the existence or non-existence of a decomposition product and an impurity can be analyzed, and the characteristics of the light-emitting element can be analyzed. For example, by analysis of optical characteristics of an organic compound included in the light-emitting layer, light emission mechanism can be analyzed. Furthermore, by knowing the mixing state of each layer, the physical properties in the mixing state can be measured. For example, when the molar ratio of the materials of the mixed layer becomes apparent as described above, physical property values of the mixed film at the same mixing ratio can be accurately known. Since there is information that first becomes apparent by analyzing a fabricated element, one embodiment of the present invention can provide new information that cannot be read from an element design diagram.

Although the above-described analysis of the light-emitting element is an analysis example of a light-emitting element the structure of which is already known, the analysis method of one embodiment of the present invention is not limited to this. That is, application to an organic semiconductor element and a light-emitting element which have unknown structures is possible, and the layer structures and organic compounds of such elements can be analyzed.

The analysis method of one embodiment of the present invention can be suitably used for organic photoelectric conversion elements such as an organic solar cell or an organic photodiode.

In the above analysis example, the case where a plurality of organic compounds is used for the light-emitting element 150 is described; however, the analysis method of one embodiment of the present invention is not limited to this. That is, the analysis method of one embodiment of the present invention can be applied to an organic semiconductor element formed of a single organic compound.

Note that steps (S1) to (S8) in FIG. 3 are not necessarily performed in this order and the order of the steps can be changed as appropriate.

Analysis Example 2 of Organic Semiconductor Element

Figure 4:
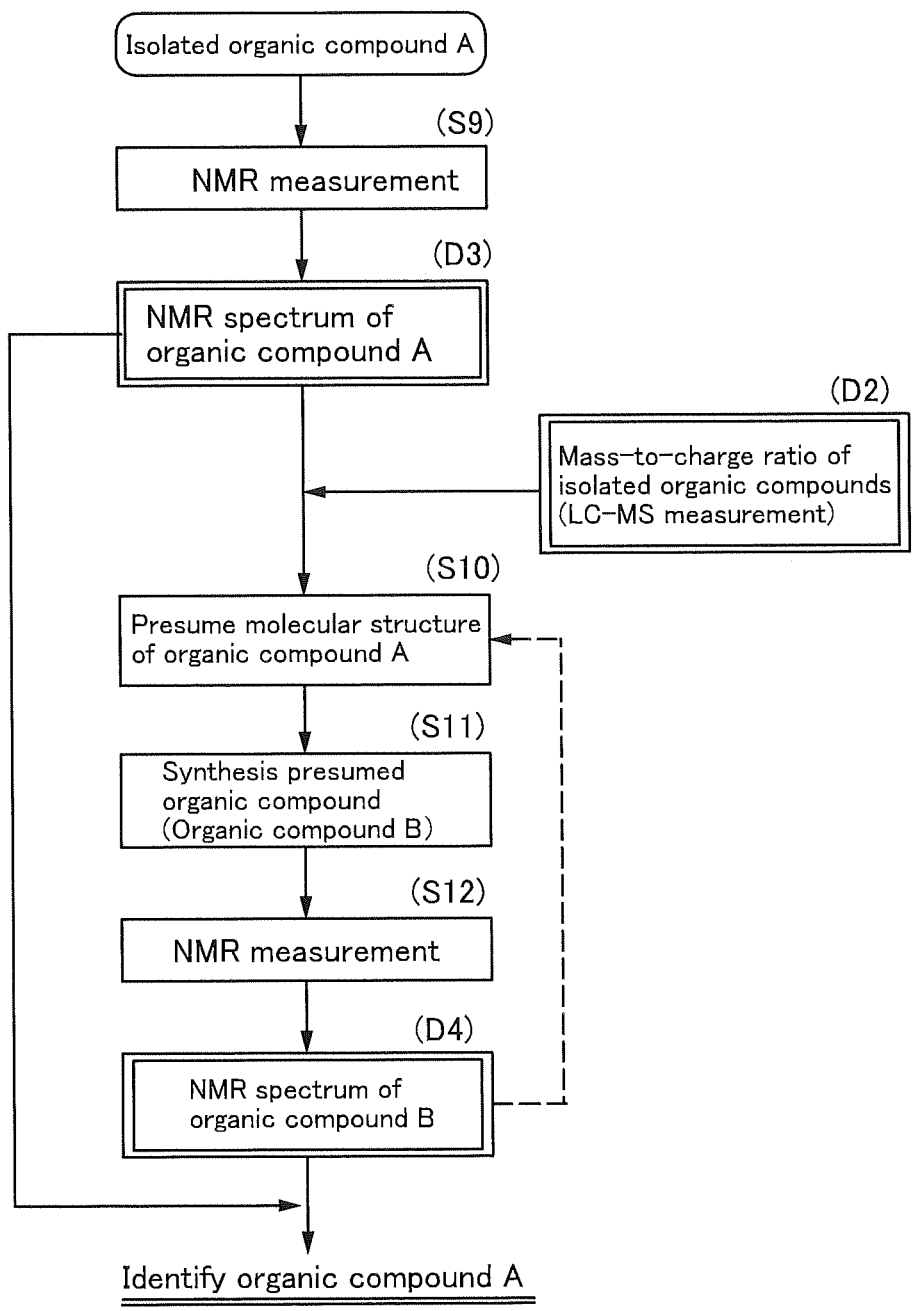
FIG. 4 is a flow chart explaining an analysis method of one embodiment of the present invention.

In this analysis example, a method of analyzing the molecular structure of an organic compound (an organic compound A) included in the EL layer, which is shown in (M1) in FIG. 3, will be described below. FIG. 4 is a flow chart of the method of analyzing the organic compound of one embodiment of the present invention.

First, the organic compound A, which is isolated at the step (M1) in FIG. 3, is subjected to NMR measurement (see (S9) in FIG. 4) to obtain an NMR spectrum of the organic compound A (see (D3) in FIG. 4). It is preferable that this NMR measurement be performed on at least $^1$H. Furthermore, $^{13}$C or two-dimensional NMR measurement is preferably performed, in which case the molecular structure can be analyzed in more detail. The melting point or optical rotation measurement is performed at the step (S9) in FIG. 4, whereby the molecular structure can be analyzed in more detail.

Next, NMR data of the organic compound A measured above, (D3) in FIG. 4, and the mass-to-charge ratios and the precise mass data (D2) of the organic compound A obtained at the step (S6) in FIG. 3 are analyzed; thus, the molecular structure of the organic compound A is presumed (see (S10) in FIG. 4). In that case, in the second mass analysis ((S6) in FIG. 3), precise mass is preferably measured, in which case the compositional formula of the organic compound A can be determined. Furthermore, MS/MS measurement is preferably performed at the step (S6) in FIG. 3 to analyze a fragment ion obtained from the organic compound A, in which case a more detailed molecular structure can be presumed. The analysis structure is presumed from data of (D3) on the basis of the compositional formula. In that case, various publicly available documents and databases can be used as an aid in analysis.

Next, an organic compound B with a presumed molecular structure is actually synthesized (see (S11) in FIG. 4). There is no particular limitation on the synthesis method and the synthesis route, and various synthesis methods, such as a Suzuki-Miyaura coupling reaction, a Buchwald-Hartwig reaction, or an Ullmann reaction, can be employed.

Note that since the step (S11) is a step for obtaining the organic compound B, when the organic compound B is commercially available, a commercialized product can be purchased instead of performing the step (S11); when the organic compound B is an organic compound used for the formation of the light-emitting element 150 and the molecular structure is known, the organic compound used for the formation of the light-emitting element 150 can be used at a step (S12) to be described below.

Next, NMR of the synthesized organic compound B is measured (see (S12) in FIG. 4) to obtain the NMR spectrum of the organic compound B (see (D4) in FIG. 4). It is preferable that this NMR measurement be performed on at least $^1$H. Furthermore, $^{13}$C or two-dimensional NMR measurement is preferably performed, in which case the molecular structure can be analyzed in more detail. The optical rotation measurement or the MS measurement is performed at the step (S9) in FIG. 4, whereby the molecular structure can be analyzed in more detail.

Note that in the case where the NMR spectrum of the organic compound B can be obtained from documents or databases, the spectrum obtained from the documents or databases can be used as (D4).

Next, D3 and D4 are compared to determine the molecular structure of the organic compound A. When peak intensity ratios and peak positions of D3 and D4 match to each other, it can be said that the molecular structure of the organic compound A has the same structure as the presumed organic compound B. In that case, data other than NMR is also analyzed simultaneously, in which case the analysis accuracy can be improved.

Here, in the case where the peak intensity ratios and the peak positions of D3 and D4 do not match, the steps shown in (S10) to (S12) in FIG. 4 are performed again repeatedly (a dashed line in FIG. 4), so that the molecular structure of the organic compound A can be identified.

Furthermore, by comparing the identified molecular structure of the organic compound A with the structure of the organic compound used for the formation of the light-emitting element 150, whether a target substance can be deposited on a target layer can be confirmed. In the case where a structure of a substance different from the organic compound used for the formation of the light-emitting element 150 is detected from the EL layer, by identifying the molecular structure, the characteristics of the light-emitting element can be analyzed in detail.

Note that by performing the above-described analysis method on unknown light-emitting elements, the structures of organic compounds included in the unknown light-emitting elements can be identified.

Analysis Example 3 of Organic Semiconductor Element

Next, an analysis example different from the analysis example shown in FIG. 4 will be described below with reference to FIG. 5.

In a mixed film including a plurality of organic compounds and at an interface between adjacent organic compound films, an interaction occurs between organic compounds in some cases. The interaction is sometimes utilized for forming the light-emitting element; whereas the interaction adversely affects the element characteristics in some cases. Therefore, analysis of the interaction is important. In this analysis example, an example of analyzing what kind of interaction occurs between organic compounds in a light-emitting element is described below. FIG. 5 is a flow chart showing a method of analyzing whether an excited complex (also referred to as exciplex) occurs between organic compounds which are used for the light-emitting element of one embodiment of the present invention.

First, in this analysis, a layer including an organic compound C and an organic compound D interact with each other by the step (S7) in FIG. 3 is identified. In the case where one layer includes two or more kinds of organic compounds, it can be presumed that the organic compound C and the organic compound D included in the layer generate some interaction.

Next, the isolated organic compound C and the isolated organic compound D are analyzed in detail. First, light emission spectra of the organic compound C and the organic compound D are measured (see (S13) and (S14) in FIG. 5) to obtain the light emission spectrum data shown in (D5) and (D6) in FIG. 5. Although the light emission spectra of the organic compounds can be measured in either a solution state or a thin film state, the organic compounds are preferably measured in the same state.

Figure 5:
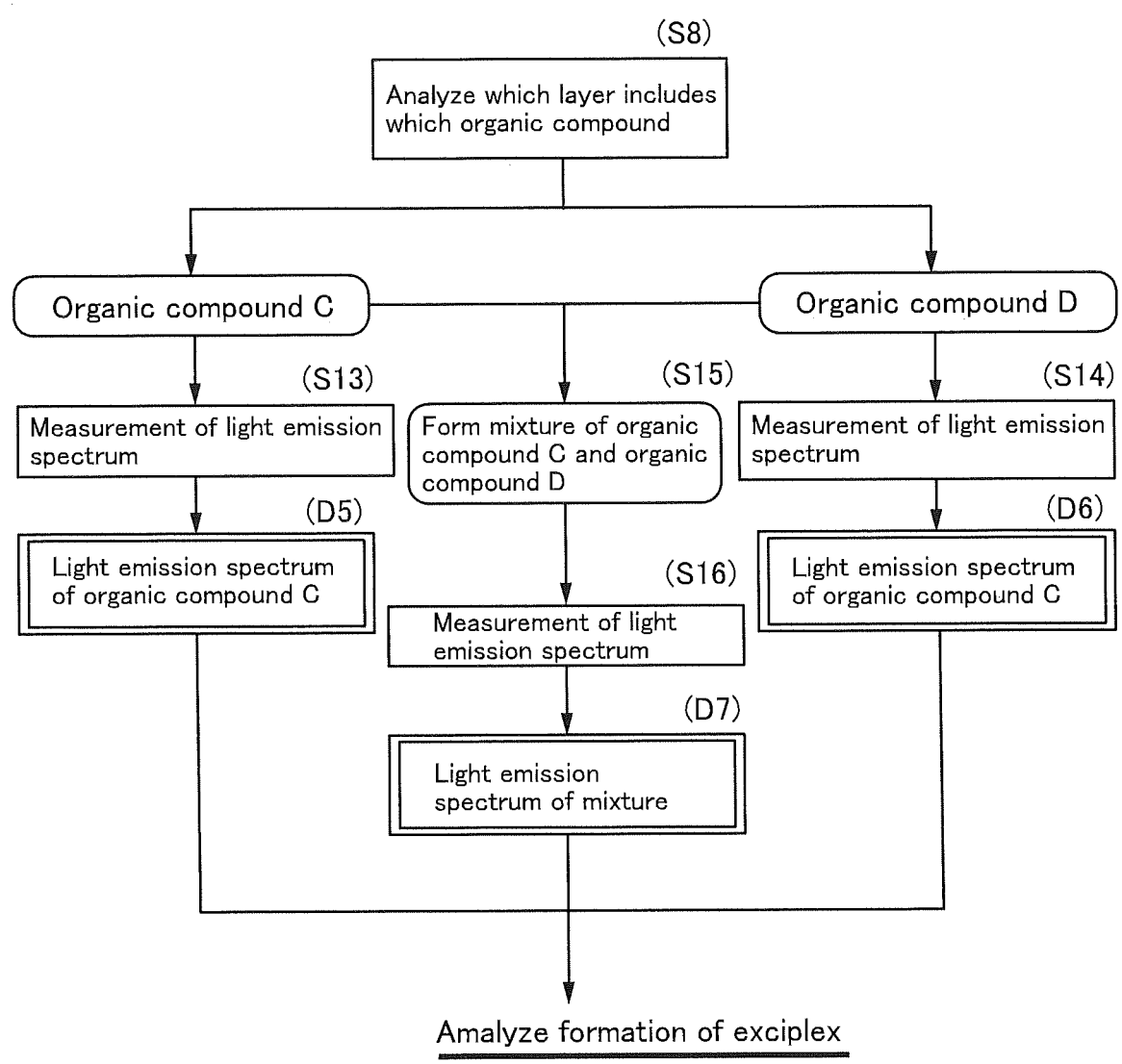
FIG. 5 is a flow chart explaining an analysis method of one embodiment of the present invention.

Next, a mixture of the organic compound C and the organic compound D is formed (see (S15) in FIG. 5). Although the state of the mixture can be either a solution state or a thin film state, it is preferable to form a mixed thin film in a state the same as the states of the organic compounds when their light emission spectra are measured. As a method of forming the thin film, vacuum evaporation or a wet process (e.g., a spin coating method, a casting method, a die coating method, a blade coating method, a roll coating method, an inkjet method, a printing method, a spray coating method, a curtain coating method, or a Langmuir-Blodgett method) can be employed.

Next, in a manner similar to that of the measurement of the organic compounds, the light emission spectrum of the formed mixture is measured (see (S16) in FIG. 5) to obtain the light emission spectrum data of the mixture shown in (D7) in FIG. 5.

Then, the measured data (D5) to (D7) in FIG. 5 are compared to analyze whether an exciplex is formed between the organic compound C and the organic compound D. In the case where a peak included in the light emission spectrum shown in (D7) is observed on a longer wavelength side than a peak included in the light emission spectrum shown in (D5) and a peak included in the light emission spectrum shown in (D6), it can be said that the organic compound C and the organic compound D form an exciplex, as described later. In contrast, in the case where the light emission spectrum shown in (D7) is superimposed on the light emission spectrum shown in (D5) and the light emission spectrum shown in (D6), it can be said that the organic compound C and the organic compound D do not form an exciplex.

Although in this analysis example, an example of analyzing whether an exciplex is generated between organic compounds, different interactions can be analyzed by performing various analyses. In addition, this analysis can also be applied to a light-emitting element having an unknown element structure. Note that steps (S13) to (S16) in FIG. 5 are not necessarily performed in this order and the order of the steps can be changed as appropriate.

Analysis Example 4 of Organic Semiconductor Element

Next, an analysis example different from the analysis example shown in FIG. 5 will be described below with reference to FIG. 6.

In a light-emitting element, a light-emitting layer is generally formed with a plurality of organic compounds, and the organic compounds included in the light-emitting layer exchange energy, electrons, and holes, thereby resulting in light emission. In this analysis example, an example of analyzing light emission mechanism of a light-emitting layer in a light-emitting element will be described below. FIG. 6 is a flow chart showing a method of analyzing the light emission mechanism of the light-emitting element, which is one embodiment of the present invention. Note that in the case where mass-to-charge ratios of a plurality of organic compounds are obtained from the same layer in the first mass analysis ((S3) in FIG. 3), the layer is presumed to be a light-emitting layer in some cases.

In this analysis, by performing the step (S7) in FIG. 3, an organic compound E and an organic compound F, which are presumed to be included in a light-emitting layer, are analyzed in detail. Note that in this analysis example, description is made on the assumption that the organic compound E is a guest material and the organic compound F is a host material in a light-emitting layer. In the case where an organic compound including a heavy atom such as Ir is used for the light-emitting layer when the light-emitting element is formed, or an isotope peak of the heavy atom is analyzed in the TOF-SIMS analysis, the guest material can be identified. In the case where a light-emitting layer of an unknown light-emitting element is analyzed, an organic compound having a relatively low ion intensity detected by the TOF-SIMS analysis ((S3) in FIG. 3) may be assumed as a guest material and the other may be assumed as a host material.

Figure 6:
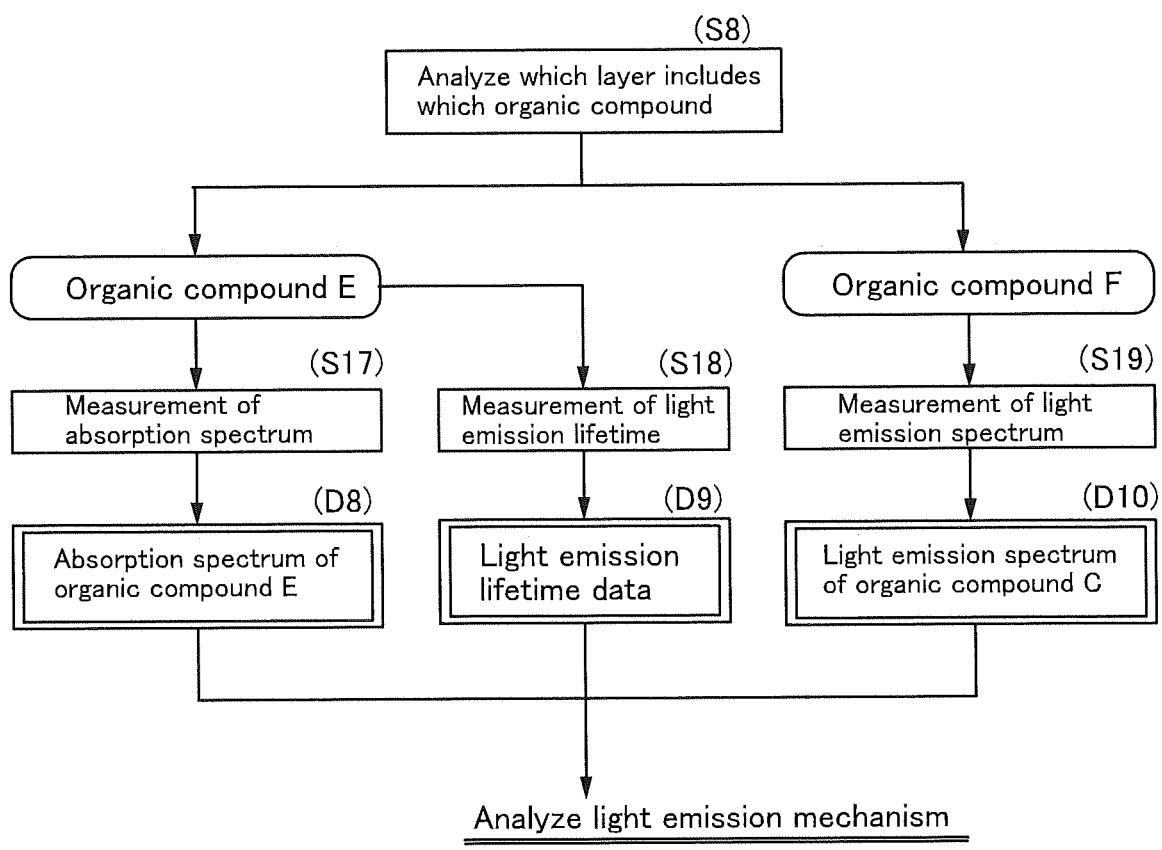
FIG. 6 is a flow chart explaining an analysis method of one embodiment of the present invention.

An absorption spectrum of the organic compound E is measured (see (S17) in FIG. 6) to obtain absorption spectrum data of the organic compound E shown in (D8) in FIG. 6.

A light emission lifetime of the organic compound E is measured (see (S18) in FIG. 6) and the light emission lifetime data of the organic compound E shown in (D9) in FIG. 6 is analyzed; thus, emission characteristics of the organic compound E can be analyzed. Basically, it can be interpreted that light with a nanosecond-scale emission lifetime is fluorescence and light with a microsecond-scale emission lifetime and a decay curve represented by a primary expression is phosphorescence. In the case where light whose emission lifetime decay curve is represented by a secondary or more relational expression, it can be analyzed that the light has a delayed emission component (typically a thermally activated delayed fluorescence component).

The light emission spectrum of the organic compound F is measured (see (S19) in FIG. 6) as in (S13), (S14) in FIG. 5, whereby the light emission spectrum data shown in (D10) in FIG. 6 can be obtained.

Next, data of (D8) to (D10) are analyzed together, the light emission mechanism in the light-emitting element can be analyzed. As described above, the emission characteristics of the organic compound E can be analyzed from (D9). By analyzing an overlap between (D8) and (D10), information relating to energy transfer from the organic compound F, which is a host material, to the organic compound E, which is a guest material, can be obtained.

In this analysis example, this analysis can also be applied to a light-emitting element having an unknown element structure.

Analysis Example 5 of Organic Semiconductor Element

Next, an analysis example different from the analysis example of light emission mechanism shown in FIG. 6 will be described below with reference to FIG. 7.

An example of analyzing the light emission mechanism of a light-emitting layer in the case where three or more kinds of organic compounds are detected from the same layer will be described below. FIG. 7 is a flow chart relating to a method of analyzing the light emission mechanism of a light-emitting element, which is one embodiment of the present invention. Note that in the following description, an organic compound G and an organic compound H are host materials and an organic compound I is a guest material. Note that in the case where a light-emitting layer of an unknown light-emitting element is analyzed, an organic compound whose relative ion intensity detected by the first mass analysis ((S3) in FIG. 3) is the lowest may be assumed as a guest material, and the other may be assumed as a host material.

Figure 7:
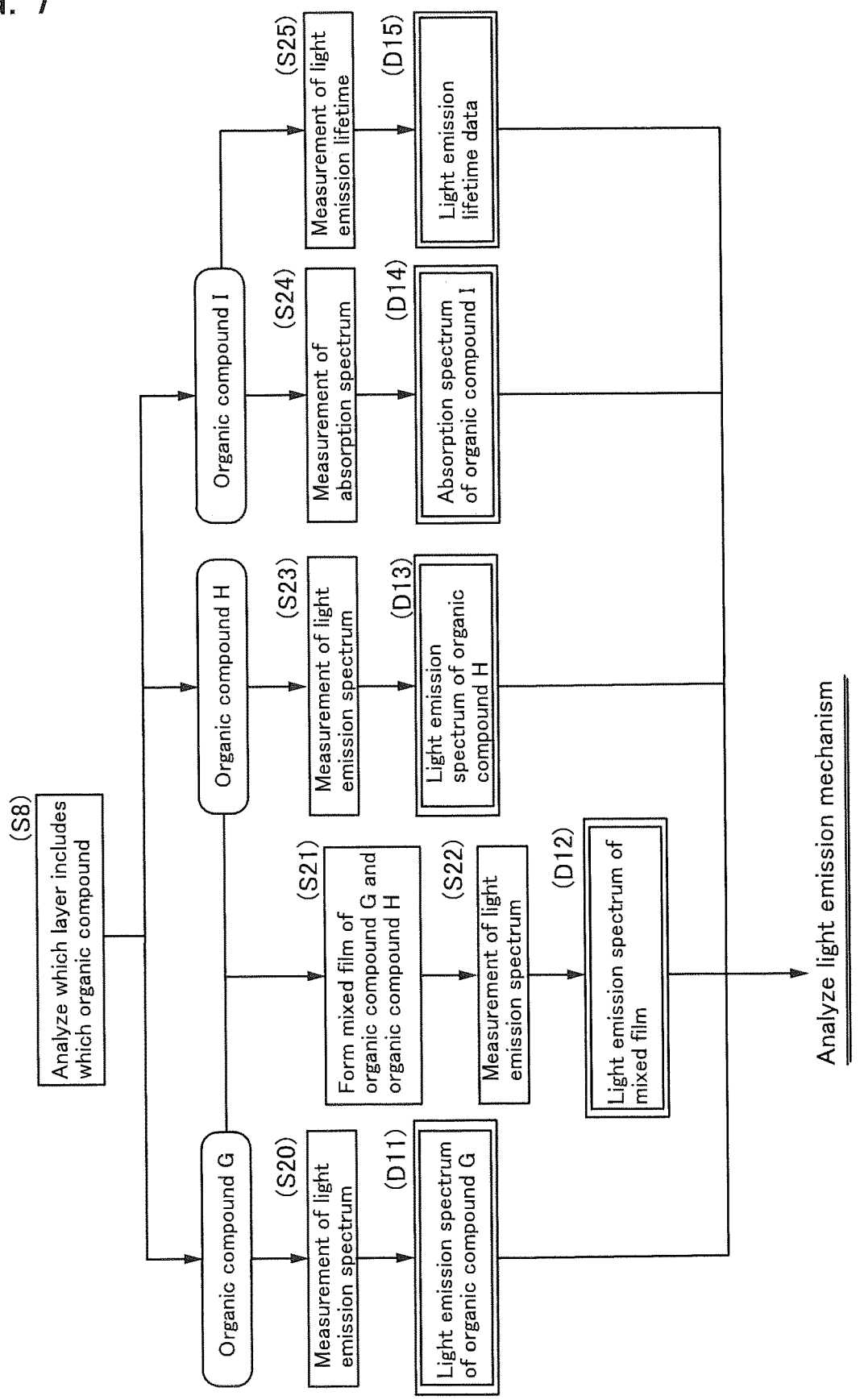
FIG. 7 is a flow chart explaining an analysis method of one embodiment of the present invention.

Steps (S20) to (S23) in FIG. 7 are the same as the steps (S13) to (S16) in FIG. 5. Data (D11) to (D13) in FIG. 7 is analyzed; thus, whether the organic compound G and the organic compound H form an exciplex in the light-emitting layer can be analyzed, in a manner similar to that of the analysis of data (D5) to (D7) in FIG. 5.

Steps (S24) and (S25) in FIG. 7 are the same as the steps (S17) and (S18) in FIG. 6. By analyzing data (D15) in FIG. 7, the emission characteristics of the organic compound I can be analyzed.

By analyzing data (D11) to (D15) in FIG. 7, the light emission mechanism of the light-emitting element can be analyzed. For example, in the case where the analysis show that the organic compound G and the organic compound H form an exciplex and the organic compound I emits phosphorescence, an overlap between an absorption spectrum shown in (D14) and a light emission spectrum shown in (D12) is analyzed, whereby ExTET (Exciplex Triplet Energy Transfer) to be described later occurs in the light-emitting layer can be analyzed. In the case where the light emission spectrum shown in (D12) has an overlap with the longest-wavelength-side absorption of the absorption spectrum shown in (D14), it can be said that ExTET occurs in the light-emitting layer.

<Material>

Next, details of components of a light-emitting element will be described below.

<<Light-Emitting Layer>>

In the light-emitting layer 130, the organic compound 132 is present with the largest weight ratio, and the light-emitting material 131 is dispersed in the organic compound 132. In the case where the light-emitting material 131 is a fluorescent compound, the S1 level of the organic compound 132 in the light-emitting layer 130 is preferably higher than the S1 level of the light-emitting material (the light-emitting material 131) in the light-emitting layer 130. In the case where the light-emitting material 131 is a phosphorescent compound, the T1 level of the organic compound 132 in the light-emitting layer 130 is preferably higher than the T1 level of the light-emitting material (the light-emitting material 131) in the light-emitting layer 130.

The organic compound 132 is preferably a compound having a nitrogen-containing six-membered heteroaromatic skeleton. Specific examples thereof include compounds having any of a pyridine skeleton, a diazine skeleton (a pyrazine skeleton, a pyrimidine skeleton, and a pyridazine skeleton), and a triazine skeleton. As examples of these basic compounds having a nitrogen-containing heteroaromatic skeleton, compounds such as a pyridine derivative, a bipyridine derivative, a pyrimidine derivative, a triazine derivative, a quinoxaline derivative, a dibenzoquinoxaline derivative, a phenanthroline derivative, and a purine derivative can be given. A material in which the transport property of electrons is higher than that of holes (an electron-transport material) can be used as the organic compound 132, and a material having an electron mobility of $1\times10^{-6}$ cm$^2$/Vs or higher is preferable.

Specific examples include heterocyclic compounds having a pyridine skeleton such as bathophenanthroline (abbreviation: BPhen) and bathocuproine (abbreviation: BCP); heterocyclic compounds having a diazine skeleton such as 2-[3-(dibenzothiophen-4-yl)phenyl]dibenzo[f,h]quinoxaline (abbreviation: 2mDBTPDB q-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), (2-[3-(3,9'-bi-9H-carbazol-9-yl)phenyl]dibenzo[f,h]quinoxaline) (abbreviation: 2mCzCzPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); and heterocyclic compounds having a pyridine skeleton such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above-described heterocyclic compounds, the heterocyclic compounds having a triazine skeleton, a diazine (pyrimidine, pyrazine, pyridazine) skeleton, or a pyridine skeleton are preferable because they are stable and highly reliable. In addition, the heterocyclic compounds having the skeletons have a high electron-transport property to contribute to a reduction in driving voltage. Furthermore, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1\times10^{-6}$ cm$^2$/Vs or higher. Note that other substances may also be used as long as their electron-transport properties are higher than their hole-transport properties.

As the organic compound 132, a compound having a nitrogen-containing five-membered heterocyclic skeleton or a tertiary amine skeleton is also suitably used. Specific examples thereof include compounds having any of a pyrrole skeleton and an aromatic amine skeleton. As examples, an indole derivative, a carbazole derivative, a triarylamine derivative, and the like can be given. Examples of a nitrogen-containing five-membered heterocyclic skeleton include an imidazole skeleton, a triazole skeleton, and a tetrazole skeleton. As the organic compound 132, a material having a property of transporting more holes than electrons (a hole-transport material) can be used, and a material having a hole mobility of $1\times10^{-6}$ cm$^2$/Vs or higher is preferable. Furthermore, the hole-transport material may be a high molecular compound.

Examples of the aromatic amine compounds that can be used as the material having a high hole-transport property are N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yeamino]-9-phenylcarbazole (abbreviation: PCzPCN1), and the like.

Other examples of the carbazole derivative are 4,4'-di(N-carbazolyebiphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Furthermore, it is possible to use N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N, 9-diphenyl-N-(9,10-diphenyl-2-anthryl)-9H-carbazol-3-amine (abbreviation: 2PCAPA), 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), N,N,N',N',N'',N'',N''',N'''-octaphenyldibenzo[g,p]chrysene-2,7,10,15-tetraamine (abbreviation: DBC1), or the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl) methacrylamide] (abbreviation: PTPDMA), and poly[N,N'-bis(4-butylphenyl)-N,N'-bis(phenyl)benzidine] (abbreviation: poly-TPD).

Examples of the material having a high hole-transport property include aromatic amine compounds such as 4,4'-bis[N-(1-naphthyl)-N-phenylamino]biphenyl (abbreviation: NPB or α-NPD), N,N-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N-diphenylamino)triphenylamine (abbreviation: TDATA), 4,4',4''-tris[N-(3- methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N-diphenyl-9,9-dimethylfluorene-2,7-diamine (abbreviation: YGA2F). Other examples are amine compounds, carbazole compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), and 2,8-di(9H-carbazol-9-yl)-dibenzothiophene (abbreviation: Cz2DBT). Among the above compounds, compounds having a pyrrole skeleton or an aromatic amine skeleton are preferred because of their high stability and reliability. In addition, the compounds having such skeletons have a high hole-transport property to contribute to a reduction in driving voltage.

As the organic compound 132, a compound having a nitrogen-containing five-membered heterocyclic skeleton such as an imidazole skeleton, a triazole skeleton, or a tetrazole skeleton can be used. Specifically, 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and the like can be used, for example.

Although the light-emitting material 131 in the light-emitting layer 130 is not particularly limited, as a fluorescent compound, an anthracene derivative, a tetracene derivative, a chrysene derivative, a phenanthrene derivative, a pyrene derivative, a perylene derivative, a stilbene derivative, an acridone derivative, a coumalin derivative, a phenoxazine derivative, a phenothiazine derivative, or the like is preferred. For example, the following substances can be used.

Specifically, the following examples can be given: 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N-bis(4-tert-butylphenyl)-pyrene-1,6-diamine (abbreviation: 1,6tBu-FLPAPrn), N,N'-diphenyl-N,N'-bis[4-(9-phenyl-9H-fluoren-9-yl)phenyl]-3,8-dicyclohexylpyrene-1,6-diamine (abbreviation: ch-1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N''-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N''-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N''-triphenyl-1,4-phenylenediamine (abbreviation: 2DPAPA), N-[9,10-bis(1,1'-biphenyl-2-yl)-2-anthryl]-N,N',N''-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N''-tetrakis(4-methylphenyl)tetracene-5,11-diamine (abbreviation: p-mPhTD), 7,14-diphenyl-N,N,N',N''-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJT1), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6- bis[2-(8-methoxy-1,1,7,7-tetramethyl-2,3,6,7-tetrahydro-1H,5H-benzo[ij]quinolizin-9-yl) ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

As the light-emitting material 131 (phosphorescent compound), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium (III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium (III) (abbreviation: Ir(Mptzl-mp)$_3$) and tris(1-methyl-5-phenyl-3-propyl-1H-1,2,4-triazolato)iridium (III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complexes including a nitrogen-containing five-membered heterocyclic skeleton, such as a 4H-triazole skeleton, a 1H-triazole skeleton, or an imidazole skeleton have high triplet excitation energy, reliability, and emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium (III) (abbreviation: Ir(mppm)$_2$(acac)), (acetylacetonato)bis(6-tert-butyl-4-phenylpyrimidinato)iridium (III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), and (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium (III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium (III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N, (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and light emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyepyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes having a pyrazine skeleton, such as (acetylacetonato)bis(2,3,5-triphenylpyrazinato)iridium (III) (abbreviation: Ir(tppr)$_2$(acac)), bis(2,3,5-triphenylpyrazinato)(dipivaloylmethanato)iridium (III) (abbreviation: Ir(tppr)$_2$(dpm)), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-κN]ph enyl-κC}(2,2,6,6-tetramethyl-3,5-heptanedionato-κ$^2$O,O')iridium(III) (abbreviation: [Ir(dmdppr-dmCP)$_2$(dpm)]), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propane dionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and light emission efficiency and are thus particularly preferable. Further, the organometallic iridium complexes having a pyrazine skeleton can provide red light emission with favorable chromaticity, and thus can be suitably used for the light-emitting element of one embodiment of the present invention.

The light-emitting material included in the light-emitting layer 130 is preferably a material that can convert the triplet excitation energy into light emission. As an example of the material that can convert the triplet excitation energy into light emission, a thermally activated delayed fluorescence (TADF) material can be given in addition to the above-described phosphorescent compound. Therefore, it is acceptable that the "phosphorescent compound" in the description is replaced with the "thermally activated delayed fluorescence material". Note that the thermally activated delayed fluorescence material is a material having a small difference between the triplet excitation energy level and the singlet excitation energy level and a function of converting triplet excitation energy into singlet excitation energy by reverse intersystem crossing. Thus, the TADF material can up-convert a triplet excited state into a singlet excited state (i.e., reverse intersystem crossing is possible) using a little thermal energy and efficiently exhibit light emission (fluorescence) from the singlet excited state. The TADF is efficiently obtained under the condition where the difference in energy between the triplet excitation energy level and the singlet excitation energy level is preferably larger than 0 eV and smaller than or equal to 0.2 eV, further preferably larger than 0 eV and smaller than or equal to 0.1 eV. The TADF material can be used as not only the light-emitting material but also the host material in the light-emitting layer.

In the case where the thermally activated delayed fluorescence material is composed of one kind of material, any of the following materials can be used, for example.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

As the thermally activated delayed fluorescence material composed of one kind of material, a heterocyclic compound including a π-electron rich heteroaromatic ring and a π-electron deficient heteroaromatic ring can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), or the like can be used. The heterocyclic compound is preferable because of having the π-electron rich heteroaromatic ring and the π-electron deficient heteroaromatic ring, for which the electron-transport property and the hole-transport property are high. Among skeletons having the π-electron deficient heteroaromatic ring, a diazine skeleton (a pyrimidine skeleton, a pyrazine skeleton, or a pyridazine skeleton) and a triazine skeleton have high stability and reliability and are particularly preferable. Among skeletons having the π-electron rich heteroaromatic ring, an acridine skeleton, a phenoxazine skeleton, a thiophene skeleton, a furan skeleton, and a pyrrole skeleton have high stability and reliability; therefore, one or more of these skeletons are preferably included. As the pyrrole skeleton, an indole skeleton, a carbazole skeleton, or a 3-(9-phenyl-9H-carbazol-3-yl)-9H-carbazole skeleton is particularly preferred. Note that a substance in which the π-electron rich heteroaromatic ring is directly bonded to the it-electron deficient heteroaromatic ring is particularly preferable because the donor property of the π-electron rich heteroaromatic ring and the acceptor property of the π-electron deficient heteroaromatic ring are both increased and the difference between the energy level in the singlet excited state and the energy level in the triplet excited state becomes small.

The light-emitting layer 130 may include a material other than the organic compound 132 and the light-emitting material 131.

Examples of the material that can be used for the light-emitting layer 130 are, but not limited to, condensed polycyclic aromatic compounds such as anthracene derivatives, phenanthrene derivatives, pyrene derivatives, chrysene derivatives, and dibenzo[g,p]chrysene derivatives. Specific example of the condensed polycyclic aromatic compounds include 9,10-diphenylanthracene (abbreviation: DPAnth), 6,12-dimethoxy-5,11-diphenylchrysene, 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a singlet excitation energy level or a triplet excitation energy level higher than the excitation energy level of the light-emitting material 131 are selected from these substances and known substances.

For example, a compound having a heteroaromatic skeleton, such as an oxadiazole derivative, can be used for the light-emitting layer 130. As specific examples thereof, heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), and 4,4'-bis(5-methylbenzoxazol-2-yl)stilbene (abbreviation: BzOs) can be given.

In addition, a metal complex (e.g., a zinc- or aluminum-based metal complex) with a heterocycle, for example, can be used for the light-emitting layer 130. As examples, metal complexes having a quinoline ligand, a benzoquinoline ligand, an oxazole ligand, and a thiazole ligand can be given. Specific examples thereof include metal complexes having a quinoline or benzoquinoline skeleton, such as tris(8-quinolinolato)aluminum(III) (abbreviation: Alq), tris(4-methyl-8-quinolinolato)aluminum(III) (abbreviation: $Almq_3$), bis(10-hydroxybenzo [h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation:

ZnPBO) or bis[2-(2-benzothiazolyl)phenolato]zinc(II) (abbreviation: ZnBTZ) can be used.

The light-emitting layer 130 can have a structure in which two or more layers are stacked. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material. A light-emitting material included in the first light-emitting layer may be the same as or different from a light-emitting material included in the second light-emitting layer. In addition, the materials may have functions of emitting light of the same color or light of different colors. Light-emitting materials having functions of emitting light of different colors are used for the two light-emitting layers, so that light of a plurality of emission colors can be obtained at the same time. It is particularly preferable to select light-emitting materials of the light-emitting layers so that white light can be obtained by combining light emission from the two light-emitting layers.

Note that the light-emitting layer 130 can be formed by an evaporation method (including a vacuum evaporation method), an inkjet method, a coating method, gravure printing, or the like. Besides the above-mentioned materials, an inorganic compound such as a quantum dot or a high molecular compound (e.g., an oligomer, a dendrimer, and a polymer) may be used.

<<Hole-Injection Layer>>

The hole-injection layer 111 has a function of reducing a barrier for hole injection at an interface between the hole-injection layer 111 and one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, and the like can be given. As the phthalocyanine derivative, phthalocyanine, metal phthalocyanine, and the like can be given. As the aromatic amine, a benzidine derivative, a phenylenediamine derivative, and the like can be given. It is also possible to use a high molecular compound such as polythiophene or polyaniline; a typical example thereof is poly (ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron-accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, any of the aromatic amine, carbazole derivative, aromatic hydrocarbon, stilbene derivative, and the like described as examples of the hole-transport material that can be used in the light-emitting layer 130 can be used. Furthermore, the hole-transport material may be a high molecular compound.

As other examples of the hole-transport material, aromatic hydrocarbons such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylpheny)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene can be given. Other examples are pentacene, coronene, and the like. The aromatic hydrocarbon having a hole mobility of $1\times10^{-6}$ cm$^2$/Vs or higher and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are thiophene compounds, furan compounds, fluorene compounds, triphenylene compounds, phenanthrene compounds, and the like such as 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Among the above compounds, compounds including a pyrrole skeleton, a furan skeleton, a thiophene skeleton, or an aromatic amine skeleton are preferred because of their high stability and reliability. In addition, the compounds having such skeletons have a high hole-transport property to contribute to a reduction in driving voltage.

<<Hole-Transport Layer>>

The hole-transport layer 112 is a layer containing a hole-transport material and can be formed using any of the hole-transport materials given as examples of the material of the hole-injection layer 111. In order that the hole-transport layer 112 can have a function of transporting holes injected into the hole-injection layer 111 to the light-emitting layer 130, the highest occupied molecular orbital (HOMO) level of the hole-transport layer 112 is preferably equal or close to the HOMO level of the hole-injection layer 111.

As the hole-transport material, a substance having a hole mobility of $1\times10^{-6}$ cm$^2$/Vs or higher is preferably used. Note that any substance other than the above substances may be used as long as the hole-transport property is higher than the electron-transport property. The layer including a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ cm$^2$/Vs or higher is preferable. As a compound that easily accepts electrons (a material having an electron-transport property), a π-electron deficient heteroaromatic compound such as a nitrogen-containing heteroaromatic compound or a metal complex can be used. Specific examples include a pyridine derivative, a bipyridine derivative, a pyrimidine derivative, a triazine derivative, a quinoxaline derivative, a dibenzoquinoxaline derivative, a phenanthroline derivative, a triazole derivative, benzimidazole derivative, and an oxadiazole derivative, which are described above as the electron-transport material that can be used for the light-emitting layer 130. A substance having an electron mobility of $1\times10^{-6}$ cm$^2$/Vs or higher is preferable. Note that other than these substances, any substance that has a property of transporting more electrons than holes may be used for the electron-transport layer. The electron-transport layer 118 is not limited to a single layer, and may include stacked two or more layers containing the aforementioned substances.

In addition, metal complexes with a heterocycle, such as metal complexes having a quinoline ligand, a benzoquinoline ligand, an oxazole ligand, and a thiazole ligand, can be given. Specific examples thereof include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used.

Between the electron-transport layer 118 and the light-emitting layer 130, a layer that controls transfer of electron carriers may be provided. This is a layer formed by addition of a small amount of a substance having a high electron-trapping property to a material having a high electron-transport property as described above, and the layer is capable of adjusting carrier balance by suppressing transport of electron carriers. Such a structure is very effective in suppressing a problem (e.g., a decrease in element lifetime) which occurs in the case where the electron-transport property of the electron-transport material is significantly higher than the hole-transport property of the hole-transport material.

<<Electron-Injection Layer>>

The electron-injection layer 119 has a function of reducing a barrier for electron injection at an interface between the electron-injection layer 119 and the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, and the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may also be used for the electron-injection layer 119. Examples of the electride include a substance in which electrons are added at high concentration to calcium oxide-aluminum oxide. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, sodium, cesium, magnesium, calcium, erbium, ytterbium, and the like are given. In addition, an alkali metal oxide or an alkaline earth metal oxide is preferable, and lithium oxide, calcium oxide, barium oxide, and the like are given. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a gravure printing method, or the like. Besides the above-mentioned materials, an inorganic compound such as a quantum dot or a high molecular compound (e.g., an oligomer, a dendrimer, and a polymer) may be used in the light-emitting layer, the hole-injection layer, the hole-transport layer, the electron-transport layer, and the electron-injection layer.

<<Quantum Dot>>

A quantum dot is a semiconductor nanocrystal with a size of several nanometers to several tens of nanometers and contains approximately $1\times10^3$ to $1\times10^6$ atoms. Since energy shift of quantum dots depend on their size, quantum dots made of the same substance emit light with different wavelengths depending on their size; thus, emission wavelengths can be easily adjusted by changing the size of quantum dots.

Since a quantum dot has an emission spectrum with a narrow peak, emission with high color purity can be obtained. In addition, a quantum dot is said to have a theoretical internal quantum efficiency of approximately 100%, which far exceeds that of a fluorescent organic compound, i.e., 25%, and is comparable to that of a phosphorescent organic compound. Therefore, a quantum dot can be used as a light-emitting material to obtain a light-emitting element having high emission efficiency. Furthermore, since a quantum dot which is an inorganic material has high inherent stability, a light-emitting element which is favorable also in terms of lifetime can be obtained.

Examples of a material of a quantum dot include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the quantum dot, any of a core-type quantum dot, a core-shell quantum dot, a core-multishell quantum dot, and the like can be used. Note that when a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength range of a spectrum of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be spherical shape, a rod shape, a circular shape, or the like. Quantum rods which are rod-like shape quantum dots have a function of emitting directional light; thus, quantum rods can be used as a light-emitting material to obtain a light-emitting element with higher external quantum efficiency.

In most organic EL elements, to improve emission efficiency, concentration quenching of the light-emitting materials is suppressed by dispersing light-emitting materials in host materials. The host materials need to be materials having singlet excitation energy levels or triplet excitation energy levels higher than or equal to those of the light-emitting materials. In the case of using blue phosphorescent materials as light-emitting materials, it is particularly difficult to develop host materials which have triplet excitation energy levels higher than or equal to those of the blue phosphorescent materials and which are excellent in terms of a lifetime. Even when a light-emitting layer is composed of quantum dots and made without a host material, the quantum dots enable emission efficiency to be ensured; thus, a light-emitting element which is favorable in terms of a lifetime can be obtained. In the case where the light-emitting layer is composed of quantum dots, the quantum dots preferably have core-shell structures (including core-multi-shell structures).

In the case of using quantum dots as the light-emitting material in the light-emitting layer, the thickness of the light-emitting layer is set to 3 nm to 100 nm, preferably 10 nm to 100 nm, and the quantum dot content of the light-emitting layer is 1 volume % to 100 volume %. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, blade coating method, a roll coating method, an ink-jet method, a printing method, a spray coating method, a curtain coating method, or a Langmuir-Blodgett method) may be employed. For a light-emitting layer containing a phosphorescent material, a vacuum evaporation method, as well as the wet process, can be suitably employed.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

<<Pair of Electrodes>>

The electrodes 101 and 102 function as an anode and a cathode of each light-emitting element. The electrodes 101 and 102 can be formed using a metal, an alloy, or a conductive compound, a mixture or a stack thereof, or the like.

One of the electrode 101 and the electrode 102 is preferably formed using a conductive material having a function of reflecting light. Examples of the conductive material include aluminum (Al), an alloy containing Al, and the like. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting element with aluminum. Alternatively, Ag, an alloy of silver (Ag) and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), or gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like. Besides, a transition metal such as tungsten, chromium (Cr), molybdenum (Mo), copper, or titanium can be used.

Light emitted from the light-emitting layer is extracted through the electrode 101 and/or the electrode 102. Thus, at least one of the electrode 101 and the electrode 102 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm can be used.

The electrodes 101 and 102 may each be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

In this specification and the like, as the material transmitting light, a material that transmits visible light and has conductivity is used. Examples of the material include, in addition to the above-described oxide conductor typified by an ITO, an oxide semiconductor and an organic conductor containing an organic substance. Examples of the organic conductor containing an organic substance include a composite material in which an organic compound and an electron donor (donor) are mixed and a composite material in which an organic compound and an electron acceptor (acceptor) are mixed. Alternatively, an inorganic carbon-based material such as graphene may be used. The resistivity of the material is preferably lower than or equal to $1\times10^5$ Ω·cm, further preferably lower than or equal to $1\times10^4$ Ω·cm.

Alternatively, the electrode 101 and/or the electrode 102 may be formed by stacking two or more of these materials.

In order to improve the light extraction efficiency, a material whose refractive index is higher than that of an electrode having a function of transmitting light may be formed in contact with the electrode. The material may be electrically conductive or non-conductive as long as it has a function of transmitting visible light. In addition to the oxide conductors described above, an oxide semiconductor and an organic substance are given as the examples of the material. Examples of the organic substance include the materials for the light-emitting layer, the hole-injection layer, the hole-transport layer, the electron-transport layer, and the electron-injection layer. Alternatively, an inorganic carbon-based material or a metal film thin enough to transmit light can be used. Further alternatively, stacked layers with a thickness of several nanometers to several tens of nanometers may be used.

In the case where the electrode 101 or the electrode 102 functions as the cathode, the electrode preferably contains a material having a low work function (lower than or equal to 3.8 eV). For example, it is possible to use an element belonging to Group 1 or 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, an alloy containing aluminum and silver, or the like.

When the electrode 101 or the electrode 102 is used as an anode, a material with a high work function (4.0 eV or higher) is preferably used.

The electrode 101 and the electrode 102 may be a stacked layer of a conductive material having a function of reflecting light and a conductive material having a function of transmitting light. In that case, the electrode 101 and the electrode 102 can have a function of adjusting the optical path length so that light of a desired wavelength emitted from each light-emitting layer resonates and is intensified, which is preferable.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Substrate>>

The light-emitting element 150 may be formed over a substrate of glass, plastic, or the like. As the way of stacking layers over the substrate, layers may be sequentially stacked from the electrode 101 side or sequentially stacked from the electrode 102 side.

For the substrate 200 and the substrate 210, glass, quartz, plastic, or the like can be used, for example. Alternatively, a flexible substrate can be used. The flexible substrate means a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting element or an optical element or as long as it has a function of protecting the light-emitting element or an optical element.

As the light-emitting element 150, a light-emitting element can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper which includes a fibrous material, a base material film, and the like. As an example of a glass substrate, a barium borosilicate glass substrate, an alumino-borosilicate glass substrate, a soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like.

Alternatively, a flexible substrate may be used as the substrate such that the light-emitting element is provided directly on the flexible substrate. Further alternatively, a separation layer may be provided between the substrate and the light-emitting element. The separation layer can be used when part or the whole of a light-emitting element formed over the separation layer is separated from the substrate and transferred onto another substrate. In such a case, the light-emitting element can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting element is formed using a substrate, the light-emitting element may be transferred to another substrate. Examples of the substrate to which the light-emitting element is transferred are, in addition to the above substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like. When such a substrate is used, a light-emitting element with high durability, high heat resistance, reduced weight, or reduced thickness can be formed.

The light-emitting element 150 may be formed over an electrode electrically connected to a field-effect transistor (FET), for example, that is formed over any of the above-described substrates. Accordingly, an active matrix light-emitting device in which the FET controls the driving of the light-emitting element 150 can be manufactured.

Embodiment 2

Figure 2C:
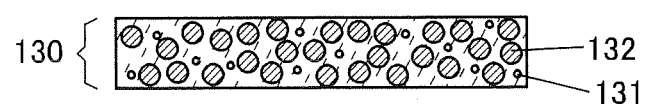

In this embodiment, a light-emitting element having a structure different from the structure of the light-emitting element described in Embodiment 1 and light emission mechanism of the light-emitting element, to which the analysis method of one embodiment of the present invention can be applied, will be described below with reference to FIGS. 8(A) to 8(C). Note that in FIG. 8(A) and FIG. 2(B), a portion having a function similar to that of a portion denoted by a reference numeral shown in FIGS. 2(A) to 2(C) is represented by the same hatch pattern and the reference numeral is omitted in some cases. In addition, common reference numerals are used for portions having similar functions, and a detailed description thereof is omitted in some cases.

Structure Example 1 of Light-Emitting Element

Figure 8A:
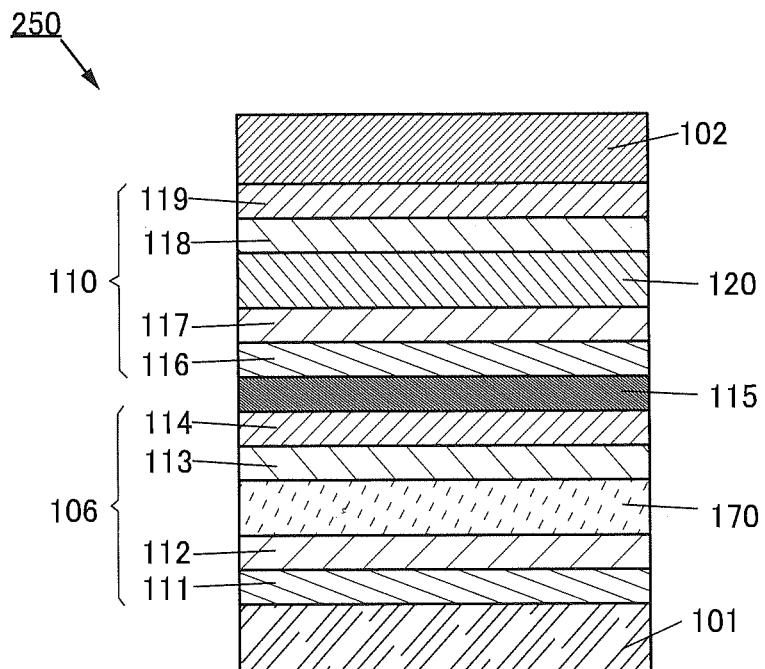
FIGS. 8A-8C are schematic cross-sectional views of a light-emitting element to which an analysis method of one embodiment of the present invention can be applied, and a graph showing a correlation between energy levels.

FIG. 8(A) is a schematic cross-sectional view of a light-emitting element 250.

The light-emitting element 250 shown in FIG. 8(A) includes a plurality of light-emitting units (a light-emitting unit 106 and a light-emitting unit 110) between a pair of electrodes (the electrode 101 and the electrode 102). Any one of the plurality of light-emitting units preferably has a structure similar to that of the EL layer 100 shown in FIG. 2(A). That is, it is preferable that the light-emitting element 150 shown in FIG. 2(A) include one light-emitting unit, while the light-emitting element 250 shown in FIG. 8(A) include a plurality of light-emitting units. Note that the electrode 101 functions as an anode and the electrode 102 functions as a cathode in the light-emitting element 250 in the following description; however, the functions of the electrodes may be reversed as the structure of the light-emitting element 250.

Moreover, in the light-emitting element 250 shown in FIG. 8(A), the light-emitting unit 106 and the light-emitting unit 110 are stacked, and a charge-generation layer 115 is provided between the light-emitting unit 106 and the light-emitting unit 110. Note that the light-emitting unit 106 and the light-emitting unit 110 may have the same structure or different structures. For example, it is preferable that the light-emitting unit 110 have a structure similar to that of the EL layer 100.

Moreover, the light-emitting element 250 includes a light-emitting layer 120 and a light-emitting layer 170. Moreover, the light-emitting unit 106 includes the hole-injection layer 111, the hole-transport layer 112, an electron-transport layer 113, and an electron-injection layer 114 in addition to the light-emitting layer 170. Moreover, the light-emitting unit 110 includes the hole-injection layer 116, the hole-transport layer 117, the electron-transport layer 118, and the electron-injection layer 119 in addition to the light-emitting layer 120.

The charge-generation layer 115 may have either a structure in which a substance having an acceptor property which is an electron acceptor is added to a hole-transport material or a structure in which a substance having a donor property which is an electron donor is added to an electron-transport material. Moreover, both of these structures may be stacked.

In the case where the charge-generation layer 115 contains a composite material of an organic compound and a substance having an acceptor property, the composite material that can be used for the hole-injection layer 111 described in Embodiment 1 is used for the composite material. As the organic compound, a variety of compounds such as an aromatic amine compound, a carbazole compound, an aromatic hydrocarbon, and a high molecular compound (such as an oligomer, a dendrimer, or a polymer) can be used. Note that an organic compound having a hole mobility of $1 \times 10^{-6}$ cm$^2$/Vs or higher is preferably used. However, other than these, any substance in which the transport property of holes is higher than that of electrons may be used. Since the composite material of an organic compound and a substance having an acceptor property has excellent carrier-injection and carrier-transport properties, low-voltage driving or low-current driving can be realized. Note that in the case where a surface of a light-emitting unit on the anode side is in contact with the charge-generation layer 115, the charge-generation layer 115 can also serve as a hole-injection layer or a hole-transport layer of the light-emitting unit; thus, a structure in which a hole-injection layer or a hole-transport layer is not provided in the light-emitting unit may be employed. Alternatively, in the case where a surface of a light-emitting unit on the cathode side is in contact with the charge-generation layer 115, the charge-generation layer 115 can also serve as an electron-injection layer or an electron-transport layer of the light-emitting unit; thus, a structure in which an electron-injection layer or an electron-transport layer is not provided in the light-emitting unit may be employed.

Note that the charge-generation layer 115 may form a stacked structure in which a layer containing the composite material of an organic compound and a substance having an acceptor property and a layer formed of another material are combined. For example, the charge-generation layer 115 may be formed of a combination of a layer containing the composite material of an organic compound and a substance having an acceptor property and a layer containing one compound selected from among electron-donating substances and a compound having a high electron-transport property. Moreover, the charge-generation layer 115 may be formed of a combination of a layer containing the composite material of an organic compound and a substance having an acceptor property and a layer containing a transparent conductive film.

Note that the charge-generation layer 115 sandwiched between the light-emitting unit 106 and the light-emitting unit 110 injects electrons into one of the light-emitting units and injects holes into the other of the light-emitting units when a voltage is applied to the electrode 101 and the electrode 102. For example, in FIG. 8(A), the charge-generation layer 115 injects electrons into the light-emitting unit 106 and holes into the light-emitting unit 110 when voltage is applied such that the potential of the electrode 101 is higher than the potential of the electrode 102.

Note that in terms of light extraction efficiency, the charge-generation layer 115 preferably has a property of transmitting light with respect to visible light (specifically, the transmittance of visible light through the charge-generation layer 115 is higher than or equal to 40%). Moreover, the charge-generation layer 115 functions even if it has lower conductivity than the pair of electrodes (the electrode 101 and the electrode 102).

Forming the charge-generation layer 115 using the above-described materials can inhibit an increase in driving voltage in the case where the light-emitting layers are stacked.

Moreover, the light-emitting element having two light-emitting units has been illustrated in FIG. 8(A); however, a light-emitting element in which three or more light-emitting units are stacked can be similarly employed. With a plurality of light-emitting units partitioned by the charge-generation layer between a pair of electrodes as shown by the light-emitting element 250, it is possible to realize a light-emitting element which can emit light having high luminance with the current density kept low and has a long lifetime. Moreover, a light-emitting element with low power consumption can be realized.

In addition, the light-emitting layer of the light-emitting unit 110 preferably includes a phosphorescent compound. Note that by applying the structure described in Embodiment 1 to at least one of the plurality of units, a light-emitting element with high color purity and high emission efficiency, and a light-emitting element having less change in color even after the device is driven can be provided.

By the analysis method of the present invention, a light-emitting element including a plurality of light-emitting units can be analyzed with high accuracy.

Figure 8B:
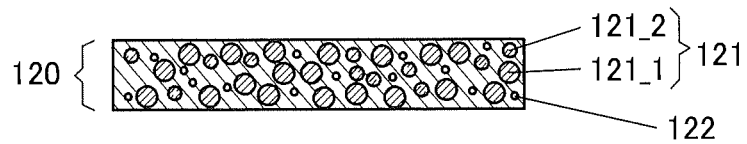

The light-emitting layer 120 included in the light-emitting unit 110 includes a host material 121 and a light-emitting material 122 as shown in FIG. 8(B). The host material 121 includes an organic compound 121_1 and an organic compound 121_2. Note that in the following description, the light-emitting material 122 included in the light-emitting layer 120 is a phosphorescent compound.

<<Light Emission Mechanism of Light-Emitting Layer 120>>

Next, the light emission mechanism and the material composition of the light-emitting layer 120 are described below.

The organic compound 121_1 and the organic compound 121_2 which are included in the light-emitting layer 120 preferably form an exciplex.

Although it is acceptable as long as the combination of the organic compound 121_1 and the organic compound 121_2 can form an exciplex, it is preferable that one of them be a compound having a hole-transport property and the other be a compound having an electron-transport property.

Figure 8C:
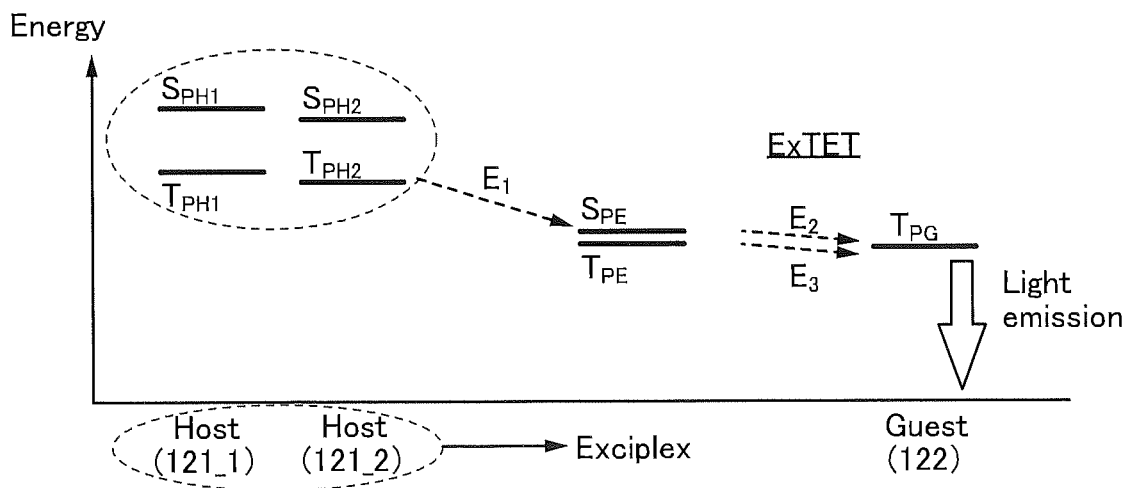

FIG. 8(C) shows a correlation between the energy levels of the organic compound 121_1, the organic compound 121_2, and the light-emitting material 122 in the light-emitting layer 120. The following explains what terms and numerals in FIG. 8(C) represent:

Host (121_1): the organic compound 121_1 (host material);

Host (121_2): the organic compound 121_2 (host material);

Guest (122): the light-emitting material 122 (phosphorescent compound);

$S_{PH1}$: the S1 level of the organic compound 121_1 (host material);

$T_{PH1}$: the T1 level of the organic compound 121_1 (host material);

$S_{PH2}$: the S1 level of the organic compound 121_2 (host material);

$T_{PH2}$: the T1 level of the organic compound 121_2 (host material);

$T_{PG}$: the T1 level of the light-emitting material 122 (phosphorescent compound);

$S_{PE}$: the S1 level of the exciplex; and $T_{PE}$: the T1 level of the exciplex.

One of the organic compound 121_1 and the organic compound 121_2 receives a hole and the other receives an electron to readily form an exciplex (see Route $E_1$ in FIG. 8(C)). Alternatively, when one of the organic compounds is brought into an excited state, the one immediately interacts with the other to form an exciplex. Because the excitation energy levels ($S_{PE}$ and $T_{PE}$) of the exciplex are lower than the S1 levels ($S_{PH1}$ and $S_{PH2}$) of the host materials (the organic compound 121_1 and the organic compound 121_2) that form the exciplex, the excited state of the host material 121 can be formed with lower excitation energy. This can reduce the driving voltage of the light emitting element.

Here, when the S1 levels of the organic compound 121_1, the organic compound 121_2, and an exciplex are focused on, the S1 level ($S_{PE}$) of the exciplex is lower than the S1 levels ($S_{PH1}$ and $S_{PH2}$) of the organic compound 121_1 and the organic compound 121_2, as shown in FIG. 8. Thus, when light emission spectra of the organic compound 121_1, the organic compound 121_2, and the exciplex are measured, the light-emitting spectrum of the exciplex is observed on a longer wavelength side than the light emission spectra of the organic compound 121_1 and the organic compound 121_2. In other words, in the case where a light emission spectrum obtained from a mixed film of the organic compound 121_1 and the organic compound 121_2 is on a longer wavelength side than the light emission spectra of the organic compound 121_1 and the organic compound 121_2, it can be said that the mixed film of the organic compound 121_1 and the organic compound 121_2 form an exciplex.

Both energies ($S_{PE}$) and ($T_{PE}$) of the exciplex are then transferred to the T1 level of the light-emitting material 122 (phosphorescent compound); thus, light emission is obtained (see Routes $E_2$ and $E_3$ in FIG. 8(C)).

Note that the T1 level ($T_{PE}$) of the exciplex is preferably higher than the T1 level ($T_{PG}$) of the light-emitting material 122 and lower than or equal to the T1 levels ($T_{PH1}$ and $T_{PH2}$) of the organic compounds (the organic compound 121_1 and the organic compound 121_2) which form the exciplex. In this way, the singlet excitation energy and the triplet excitation energy of the formed exciplex can be efficiently transferred from the S1 level ($S_{PE}$) and the T1 level ($T_{PE}$) of the exciplex to the T1 level ($T_{PG}$) of the light-emitting material 122.

In order to efficiently form an exciplex by the organic compound 121_1 and the organic compound 121_2, it is preferable that the HOMO level of one of the organic compound 121_1 and the organic compound 121_2 be higher than the HOMO level of the other and the LUMO level of the one of the organic compound 121_1 and the organic compound 121_2 be higher than the LUMO level of the other.

In the case where the combination of the organic compound 121_1 and the organic compound 121_2 is a combination of a compound having a hole-transport property and a compound having an electron-transport property, the carrier balance can be easily controlled by adjusting the mixture ratio. Specifically, the ratio of the compound having a hole-transport property to the compound having an electron-transport property is preferably within a range of 1:9 to 9:1 (weight ratio). Since the carrier balance can be easily controlled with the structure, a carrier recombination region can also be controlled easily.

Note that the above-described processes through Routes $E_1$ to $E_3$ may be referred to as ExTET (Exciplex-Triplet Energy Transfer) in this specification and the like. In other words, in the light-emitting layer 120, excitation energy is transferred from the exciplex to the light-emitting material 122. Note that in this case, the efficiency of reverse intersystem crossing from $T_{PE}$ to $S_{PE}$ does not need to be high and the emission quantum yield from $S_{PE}$ does not need to be high either; thus, materials can be selected from a wide range of options.

A light-emitting element with high emission efficiency and high reliability can be obtained by utilizing ExTET.

Note that although the example in which the light-emitting layer 120 is a single layer is described in this embodiment for explanation, the light-emitting layer 120 may have a stacked structure of a plurality of light-emitting layers. In this case, ExTET is preferably employed for all the phosphorescent light-emitting layers. As a result, a light-emitting element with high emission efficiency and high reliability can be obtained.

<Energy Transfer Mechanism>

Next, factors controlling the processes of intermolecular energy transfer between the host material 121 and the light-emitting material 122 will be described. As mechanisms of the intermolecular energy transfer, two mechanisms, i.e., the Förster mechanism (dipole-dipole interaction) and the Dexter mechanism (electron exchange interaction), have been proposed. Although the intermolecular energy transfer process between the host material 121 and the light-emitting material 122 is described here, the same can apply to the case where the host material 121 is an exciplex.

<<Förster Mechanism>>

In the Förster mechanism, energy transfer does not require direct contact between molecules and energy is transferred through a resonant phenomenon of dipolar oscillation between the host material 121 and the light-emitting material 122. By the resonant phenomenon of dipolar oscillation, the host material 121 provides energy to the light-emitting material 122, and thus, the host material 121 in an excited state is brought into a ground state and the light-emitting material 122 in a ground state is brought into an excited state. Note that the rate constant $k_{h^* \to g}$ of the Förster mechanism is expressed by Formula (1).

[Formula 1]

In Formula (1), v denotes a frequency, $f_h'(v)$ denotes a normalized emission spectrum of the host material 121 (a fluorescent spectrum in the case where energy transfer from a singlet excited state is discussed, or a phosphorescent spectrum in the case where energy transfer from a triplet excited state is discussed), $\varepsilon_g(v)$ denotes a molar absorption coefficient of the light-emitting material 122, N denotes Avogadro's number, n denotes a refractive index of a medium, R denotes an intermolecular distance between the host material 121 and the light-emitting material 122, r denotes a measured lifetime of an excited state (fluorescence lifetime or phosphorescence lifetime), c denotes the speed of light, φ denotes a luminescence quantum yield (a fluorescence quantum yield in the case where energy transfer from a singlet excited state is discussed, or a phosphorescence quantum yield in the case where energy transfer from a triplet excited state is discussed), and $K^2$ denotes a coefficient (0 to 4) of orientation of a transition dipole moment between the host material 121 and the light-emitting material 122. Note that $K^2=2/3$ in random orientation.

<<Dexter Mechanism>>

In the Dexter mechanism, the host material 121 and the light-emitting material 122 are close to a contact effective range where their orbitals overlap, and the host material 121 in an excited state and the light-emitting material 122 in a ground state exchange their electrons, which leads to energy transfer. Note that the rate constant $k_{h^* \to g}$ of the Dexter mechanism is expressed by Formula (2).

[Formula 2]

In Formula (2), h denotes a Planck constant, K denotes a constant having an energy dimension, v denotes a frequency, $f'_h(v)$ denotes a normalized emission spectrum of the host material 121 (the fluorescent spectrum in the case where energy transfer from a singlet excited state is discussed, or the phosphorescent spectrum in the case where energy transfer from a triplet excited state is discussed), $\varepsilon'_g(v)$ denotes a normalized absorption spectrum of the light-emitting material 122, L denotes an effective molecular radius, and R denotes an intermolecular distance between the host material 121 and the light-emitting material 122.

Here, the efficiency OET of energy transfer from the host material 121 to the light-emitting material 122 is expressed by Formula (3). $k_r$ denotes a rate constant of a light-emission process (fluorescence in the case where energy transfer from a singlet excited state is discussed, or phosphorescence in the case where energy transfer from a triplet excited state is discussed) of the host material 121, $k_n$ denotes a rate constant of a non-light-emission process (thermal deactivation or intersystem crossing) of the light-emitting material 122, and τ denotes a measured lifetime of an excited state of the host material 121.

[Formula 3]

According to Formula (3), it is found that the energy transfer efficiency $\phi_{ET}$ can be increased by increasing the rate constant $k_{h^* \to g}$ of energy transfer so that another competing rate constant $k_r+k_n(=1/\tau)$ becomes relatively small.

<<Concept for Promoting Energy Transfer>>

In energy transfer by the Förster mechanism, energy transfer efficiency $\phi_{ET}$ is high when the quantum yield φ (the fluorescence quantum yield in the case where energy transfer from a singlet excited state is discussed, or the phosphorescence quantum yield in the case where energy transfer from a triplet excited state is discussed) is high. Furthermore, it is preferable that the emission spectrum (the fluorescence spectrum in the case where energy transfer from the singlet excited state is discussed) of the host material 121 largely overlap with the absorption spectrum (absorption corresponding to the transition from the singlet ground state to the triplet excited state) of the light-emitting material 122. Moreover, it is preferable that the molar absorption coefficient of the light-emitting material 122 be also high. This means that the light emission spectrum of the host material 121 overlaps with the longest-wavelength-side absorption band of the light-emitting material 122.

In energy transfer by the Dexter mechanism, in order to increase the rate constant the emission spectrum (the fluorescent spectrum in the case where energy transfer from a singlet excited state is discussed, or the phosphorescent spectrum in the case where energy transfer from a triplet excited state is discussed) of the host material 121 preferably largely overlaps with an absorption spectrum (absorption corresponding to transition from a singlet ground state to a triplet excited state) of the light-emitting material 122. Therefore, the energy transfer efficiency can be optimized by making the emission spectrum of the host material 121 overlap with the longest-wavelength-side absorption band of the light-emitting material 122.

Note that in a manner similar to that of the energy transfer from the host material 121 to the light-emitting material 122, the energy transfer by both the Förster mechanism and the Dexter mechanism also occurs in the energy transfer process from an exciplex to light-emitting material 122.

As described above, overlapping between the light emission spectrum of the host material 121 and the longest-wavelength-side absorption band of the light-emitting material 122 is important for energy transfer from the host material 121 to the light-emitting material 122.

Here, as described above, ExTET is excitation energy transfer from an exciplex to the light-emitting material 122. That is, in order to cause ExTET, a light emission spectrum of the exciplex needs to overlap with the longest-wavelength-side absorption band (an absorption band of triplet MLCT (Metal to Ligand Charge Transfer) transition in the case where the light-emitting material 122 is a phosphorescent material) of the light-emitting material 122. In other words, in the light-emitting layer, it can be said that ExTET occurs when the light emission spectrum of the exciplex and the longest-wavelength-side absorption band of the light-emitting material 122 overlap. That is, whether ExTET occurs can be analyzed through analyzing the light emission spectrum of the exciplex and the absorption spectrum of the light-emitting material 122.

The structure described above in this embodiment can be used as appropriate in combination with any of the other embodiments.

Analysis Example 6 of Organic Semiconductor Element

Next, an analysis example different from the analysis example described in Embodiment 1 will be described below with reference to FIG. 35 and FIG. 36. In this analysis example, an analysis method of a light-emitting element including a cap film 420 shown in FIG. 35 will be described below. FIG. 36 is a flow chart showing the method of analyzing the organic compound of one embodiment of the present invention.

Figure 35:
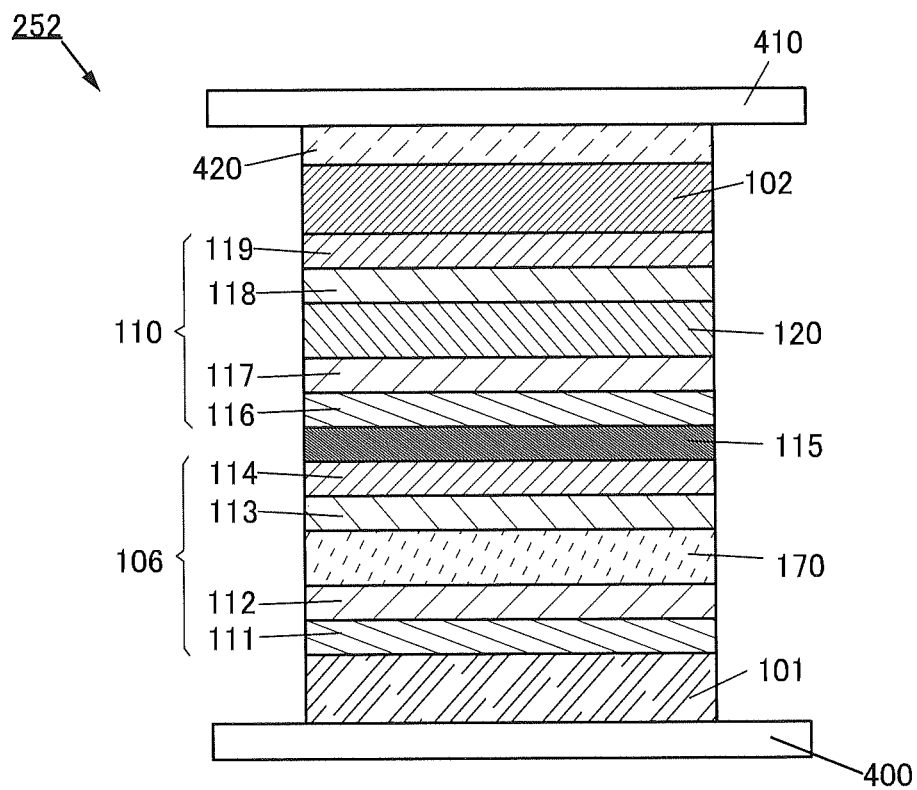
FIG. 35 is a schematic cross-sectional view of a light-emitting element to which an analysis method of one embodiment of the present invention can be applied.
Figure 36:
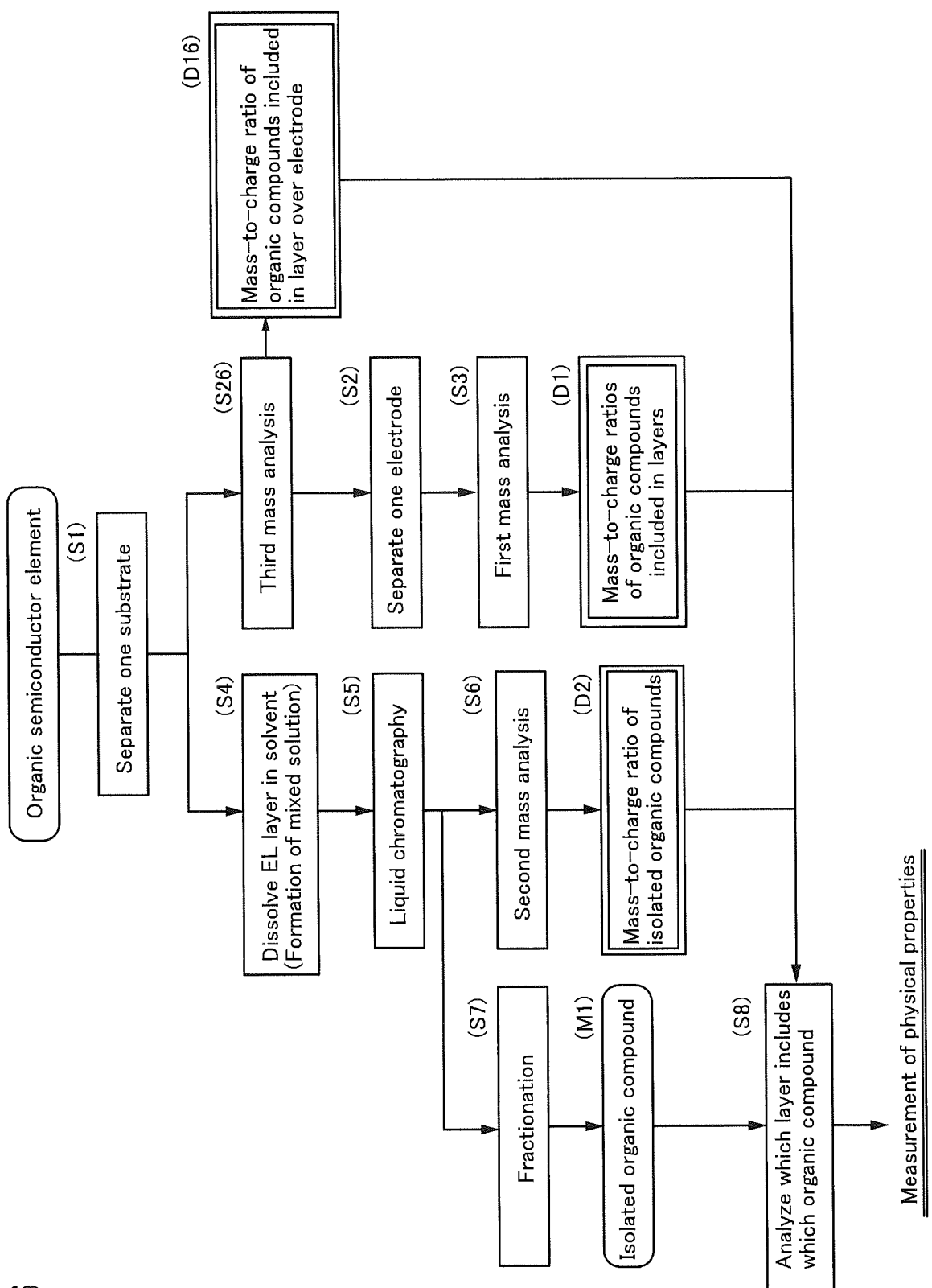
FIG. 36 is a flow chart explaining an analysis method of one embodiment of the present invention.

Note that in FIG. 35, a portion having a function similar to that of a portion denoted by a reference numeral shown in FIG. 2(A) or FIG. 8(A) is represented by the same hatch pattern and the reference numeral is omitted in some cases. In addition, common reference numerals are used for portions having similar functions, and a detailed description thereof is omitted in some cases.

Structure Example 2 of Light-Emitting Element

The light-emitting element 252 shown in FIG. 35 includes a pair of electrodes (the electrode 101 and the electrode 102)

between a pair of substrates (a substrate 400 and a substrate 410), and a plurality of light-emitting units (a light-emitting unit 106 and a light-emitting unit 110) between the pair of electrodes. Note that the electrode 101 functions as an anode and the electrode 102 functions as a cathode in the light-emitting element 252 in the following description; however, the functions of the electrodes may be reversed as the structure of the light-emitting element 252.

In the light-emitting element 252 shown in FIG. 35, the light-emitting unit 106 and the light-emitting unit 110 are stacked, and the charge-generation layer 115 is provided between the light-emitting unit 106 and the light-emitting unit 110. Note that the structures of the light-emitting unit 106 and the light-emitting unit 110 may be the same or different from each other. For example, it is preferable that the light-emitting unit 110 have a structure similar to that of the EL layer 100. The light-emitting element 252 further includes the cap film 420 between the electrode 102 and the substrate 410.

Since the cap film 420 has a function of reducing a refractive index difference at the time when light is extracted from the electrode 102, the light extraction efficiency of the light-emitting element 252 can be improved.

The light-emitting element 252 includes the light-emitting layer 120 and the light-emitting layer 170. The light-emitting unit 106 includes the hole-injection layer 111, the hole-transport layer 112, the electron-transport layer 113, and the electron-injection layer 114 in addition to the light-emitting layer 170. The light-emitting unit 110 includes a hole-injection layer 116, a hole-transport layer 117, the electron-transport layer 118, and the electron-injection layer 119 in addition to the light-emitting layer 120.

In this analysis example, as described above, first, by performing the step S1 shown in FIG. 3 and FIG. 36, the substrate 410 of the light-emitting element 252, which is an object to be analyzed, is separated.

Next, by performing the step (S26) in FIG. 36, the organic compound included in the cap film 420 provided between the electrode 102 and the substrate 410 can be analyzed. Note that in the case where a film other than the cap film 420 is formed over the electrode 102, information on the film can also be obtained. That is, by performing the step (S26) in FIG. 36, the organic compound included in the layer formed over the electrode 102 can be analyzed.

By performing the step (S26) in FIG. 36, data of the mass-to-charge ratio of organic compounds included in the layer formed over the electrode 102 ((D16) in FIG. 36) can be obtained. Data D1, D2 and D16 in FIG. 36 is analyzed, whereby the organic compounds included in the layers of the light-emitting element 252 can be analyzed. Note that in a sample used in S4 in FIG. 3 and FIG. 36, the electrode 102, that is, the electrode exposed by the step S1, does not need to be separated. The step S4 and the following steps are performed without separating the electrode, so that the number of steps can be reduced. In addition, by forming a mixed solution in the step S4 without separating the electrode, in the case where a layer (for example, the cap film 420) exists between the electrode and the substrate, the film can be analyzed at the same time. Since an organic solvent is used for the mixed solution, a material formed of a metal or a metal oxide, such as an electrode, is not dissolved, but can be removed from the mixed solution by filtration or decantation. Note that a sample from which the electrode is separated can be used as the sample used in the S4.

Note that S1 to S8, D1, D2, and M1 in FIG. 36 are similar to the steps, data, and the like shown in FIG. 3. That is, by performing the step S26 before the step S2, the organic compound included in the layer formed over the electrode 102 can be analyzed. Although not illustrated in FIG. 36, a sample used in S3 can also be used as the sample in S4, as in FIG. 3.

In the case where the substrate 410 and the electrode 102 are bonded strongly to each other, the substrate 410 and the electrode 102 might be separated at the same time in the step S1. In that case, the electrode 102 is separated from the substrate 410, whereby the organic compound included in the layer formed over the electrode 102 can be analyzed.

The structure described above in this embodiment can be used as appropriate in combination with any of the other embodiments.

Embodiment 3

In this embodiment, examples of light-emitting elements to which the analysis method of one embodiment of the present invention can be applied will be described below with reference to FIG. 9 and FIG. 10.

Structure Example 1 of Light-Emitting Device

Figure 9A:
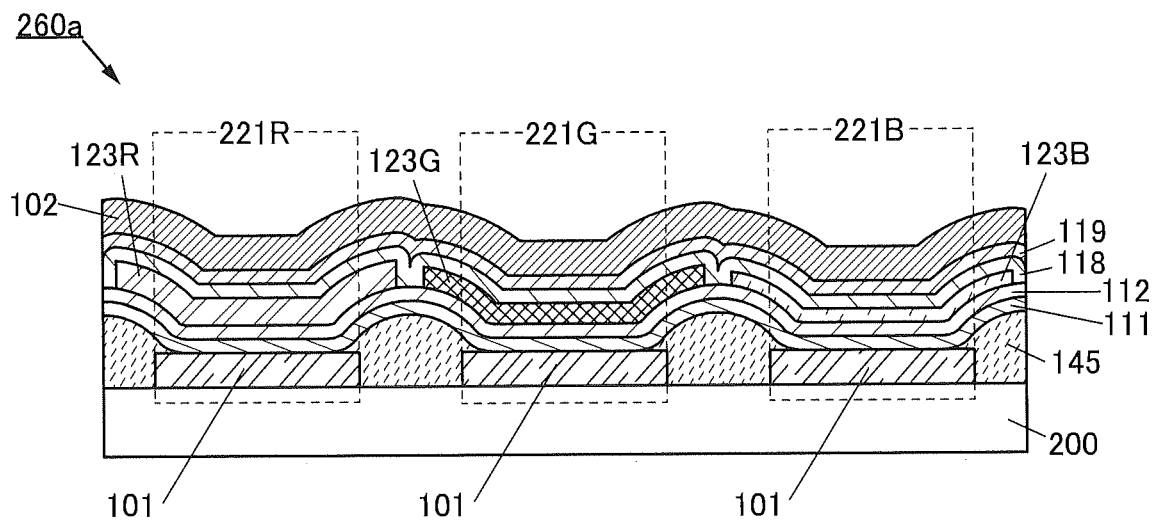
FIGS. 9A and 9B are schematic cross-sectional views of light-emitting elements to which an analysis method of one embodiment of the present invention can be applied.
Figure 9B:
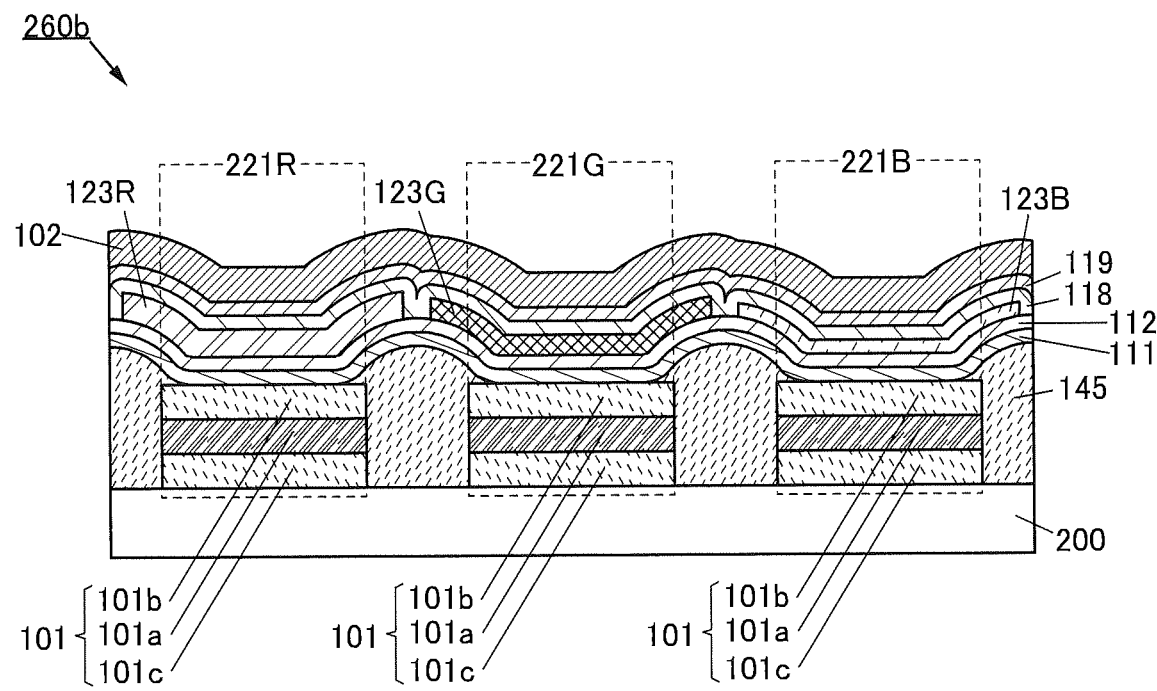

FIGS. 9(A) and 9(B) are cross-sectional views illustrating a light-emitting element to which the analysis method of one embodiment of the present invention can be applied. Note that in FIGS. 9(A) and 9(B), a portion having a function similar to that of a portion denoted by a reference numeral shown in FIG. 2(A) is represented by the same hatch pattern and the reference numeral is omitted in some cases. In addition, common reference numerals are used for portions having similar functions, and a detailed description thereof is omitted in some cases.

A light-emitting element 260*a* and a light-emitting element 260*b* illustrated in FIGS. 9(A) and 9(B) may be light-emitting elements of a bottom-emission (bottom-emission) type in which light is extracted to a substrate 200 side or may be a light-emitting element of a top-emission (top-emission) type in which light is extracted in the direction opposite to the substrate 200. Note that one embodiment of the present invention is not limited thereto, and a light-emitting element of a dual-emission (dual-emission) type in which light exhibited by the light-emitting element is extracted in both top and bottom directions of the substrate 200 may be used.

In the case where the light-emitting element 260*a* and the light-emitting element 260*b* are of a bottom emission type, the electrode 101 preferably has a function of transmitting light. In addition, the electrode 102 preferably has a function of reflecting light. Alternatively, in the case where the light-emitting element 260*a* and the light-emitting element 260*b* are of a top emission type, the electrode 101 preferably has a function of reflecting light. In addition, the electrode 102 preferably has a function of transmitting light.

The light-emitting element 260*a* and the light-emitting element 260*b* each include the electrode 101 and the electrode 102 over the substrate 200. Between the electrode 101 and the electrode 102, a light-emitting layer 123B, a light-emitting layer 123G, and a light-emitting layer 123R are included. The hole-injection layer 111, the hole-transport layer 112, the electron-transport layer 113, and the electron-injection layer 114 are included.

The light-emitting element 260*b* includes, as part of the electrode 101, a conductive layer 101*a*, a conductive layer 101*b* over the conductive layer 101*a*, and a conductive layer 101*c* under the conductive layer 101*a*. That is, the light-emitting element 260b includes the electrode 101 having a structure in which the conductive layer 101a is sandwiched between the conductive layer 101b and the conductive layer 101c.

In the light-emitting element 260b, the conductive layer 101b and the conductive layer 101c may be formed of different materials or the same material. The conductive layer 101b and the conductive layer 101c are preferably formed of the same conductive material, in which case patterning by etching in the process for forming the electrode 101 can be performed easily.

In the light-emitting element 260b, the electrode 101 may include one of the conductive layer 101b and the conductive layer 101c.

Note that for the conductive layers 101a, 101b, and 101c included in the electrode 101, structures and materials similar to those of the electrode 101 or the electrode 102 described in Embodiment 1 can be used.

In FIGS. 9(A) and 9(B), partitions 145 are provided between a region 221B, a region 221G, and a region 221R, which are sandwiched between the electrode 101 and the electrode 102. The partitions 145 have an insulating property. The partitions 145 cover end portions of the electrode 101 and have openings overlapping with the electrodes. The partitions 145 are provided, whereby the electrode 101 over the substrate 200 can be divided to have island shapes in respective regions.

Note that the light-emitting layer 123B and the light-emitting layer 123G may overlap with each other in a region where they overlap with the partition 145. The light-emitting layer 123G and the light-emitting layer 123R may overlap with each other in a region where they overlap with the partition 145. The light-emitting layer 123R and the light-emitting layer 123B may overlap with each other in a region where they overlap with the partition 145.

The partition 145 has an insulating property and is formed using an inorganic material or an organic material. As the inorganic material, silicon oxide, silicon oxynitride, silicon nitride oxide, silicon nitride, aluminum oxide, aluminum nitride, and the like are given. As the organic material, for example, photosensitive resin materials such as an acrylic resin and a polyimide resin are given.

Note that a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

The light-emitting layer 123R, the light-emitting layer 123G, and the light-emitting layer 123B may contain light-emitting materials having functions of exhibiting light of different colors. For example, when the light-emitting layer 123R contains a light-emitting material having a function of exhibiting red light, the region 221R exhibits red light; when the light-emitting layer 123G contains a light-emitting material having a function of exhibiting green light, the region 221G exhibits green light; and when the light-emitting layer 123B contains a light-emitting material having a function of exhibiting blue light, the region 221B exhibits blue light. The light-emitting elements 260a and 260b having such a structure is used in a pixel of a light-emitting device, whereby a light-emitting device capable of full-color display can be manufactured. The thicknesses of the light-emitting layers may be the same or different.

One or more of the light-emitting layer 123B, the light-emitting layer 123G, and the light-emitting layer 123R may have a structure in which two or more layers are stacked.

Note that by providing an optical element (e.g., a color filter, a polarizing plate, and an anti-reflection film) in a region overlapping with the electrode through which light is extracted, the color purity of each of the light-emitting element 260a and the light-emitting element 260b can be improved. Therefore, the color purity of a light-emitting device including the light-emitting element 260a or the light-emitting element 260b can be improved. Alternatively, the reflection of external light by the light-emitting element 260a and the light-emitting element 260b can be reduced. Therefore, the contrast ratio of the light-emitting device including the light-emitting element 260a or the light-emitting element 260b can be improved.

In particular, color filters may be provided on the light extraction side. From the light-emitting element of one embodiment of the present invention, light with high color purity can be efficiently extracted as described above; thus, when color filters are provided on the light extraction side, light with higher color purity can be extracted. Specifically, red and green color filters are used, whereby light with an extremely high color purity in a region where a chromaticity x of red light emission in the CIE 1931 chromaticity coordinates is greater than 0.680 and less than or equal to 0.720 and a chromaticity y thereof is greater than or equal to 0.260 and less than or equal to 0.320, and a chromaticity x of green light emission in the CIE 1931 chromaticity coordinates is greater than or equal to 0.130 and less than or equal to 0.250 and a chromaticity y thereof is greater than 0.710 and less than or equal to 0.810, which corresponds to the ultra-high color gamut of the BT.2020 standard, can be efficiently extracted.

By the analysis method of one embodiment of the present invention, an element structure of a light-emitting element in an extremely small region can be analyzed. The layer structure and the organic compound for each of the region 221B, the region 221G, and the region 221R described in this embodiment can be analyzed.

Structure Example 2 of Light-Emitting Device

Next, structure examples different from the light-emitting device illustrated in FIGS. 10(A) and 10(B) will be described below with reference to FIGS. 10(A) and 10(B).

Figure 10A:
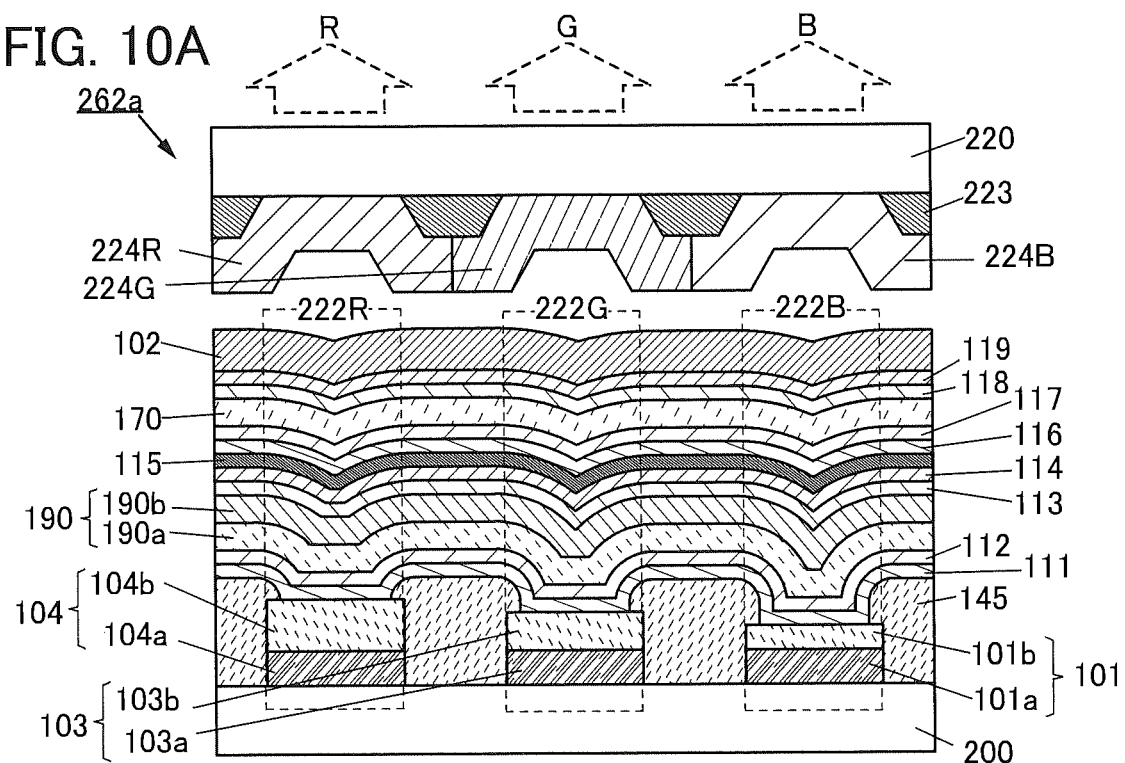
FIGS. 10A and 10B are schematic cross-sectional views of light-emitting elements to which an analysis method of one embodiment of the present invention can be applied.
Figure 10B:
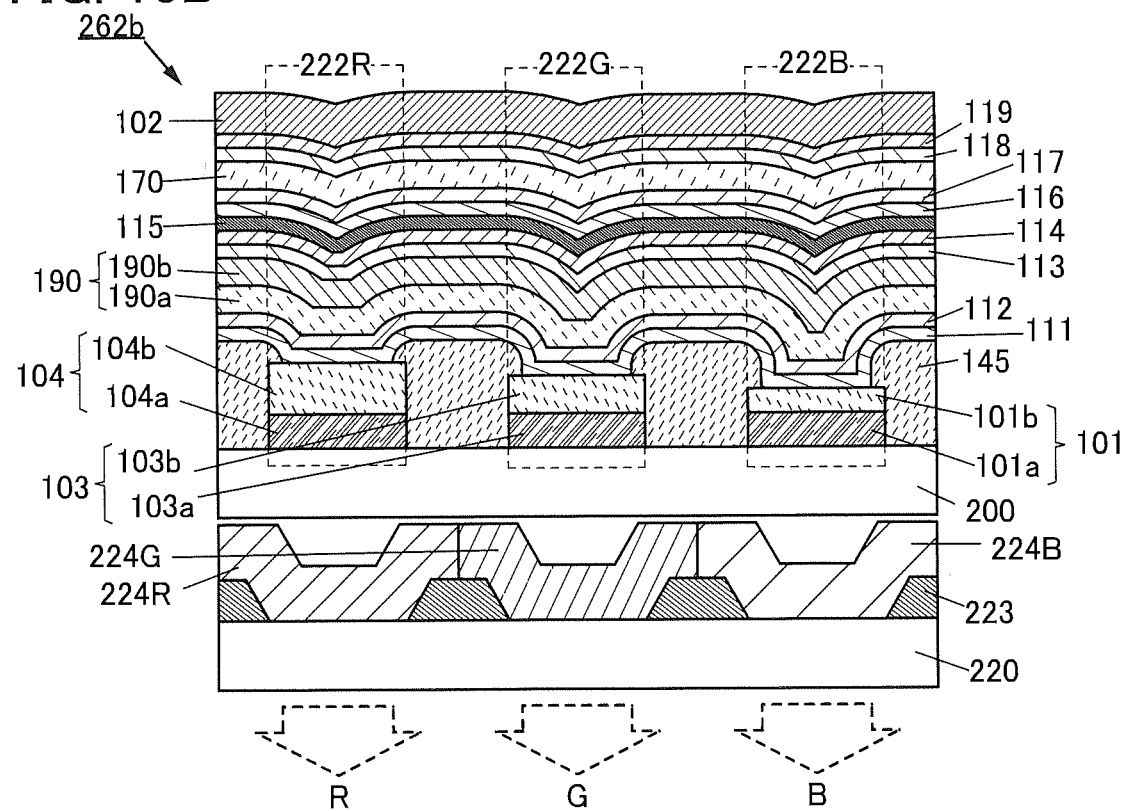

FIGS. 10(A) and 10(B) are cross-sectional views each illustrating a light-emitting device of one embodiment of the present invention. Note that in FIGS. 10(A) and 10(B), a portion having a function similar to that of a portion denoted by a reference numeral in FIGS. 9(A) and 9(B) is represented by the same hatch pattern and a reference numeral is omitted in some cases. In addition, common reference numerals are used for portions having similar functions, and a detailed description of them is omitted in some cases.

FIGS. 10(A) and 10(B) each illustrate a structure example of a light-emitting element including the light-emitting layer between a pair of electrodes. A light-emitting element 262a illustrated in FIG. 10(A) is a light-emitting element of a top-emission (top-emission) type in which light is extracted in a direction opposite to the substrate 200, and a light-emitting element 262b illustrated in FIG. 10(B) is a light-emitting element of a bottom-emission (bottom-emission) type in which light is extracted to the substrate 200 side.

However, one embodiment of the present invention is not limited thereto and may be of a dual-emission (dual-emission) type in which light exhibited by a light-emitting element is extracted in both top and bottom directions of the substrate 200 over which the light-emitting element is formed.

The light-emitting element 262a and the light-emitting element 262b each include the electrode 101, the electrode 102, an electrode 103, and an electrode 104 over the substrate 200. At least the light-emitting layer 170, the light-emitting layer 190, and the charge-generation layer 115 are provided between the electrode 101 and the electrode 102, between the electrode 102 and the electrode 103, and between the electrode 102 and the electrode 104. The hole-injection layer 111, the hole-transport layer 112, the electron-transport layer 113, the electron-injection layer 114, the hole-injection layer 116, the hole-transport layer 117, the electron-transport layer 118, and the electron-injection layer 119 are further provided.

The electrode 101 includes a conductive layer 101a and a conductive layer 101b over and in contact with the conductive layer 101a. The electrode 103 includes a conductive layer 103a and a conductive layer 103b over and in contact with the conductive layer 103a. The electrode 104 includes a conductive layer 104a and a conductive layer 104b over and in contact with the conductive layer 104a.

The light-emitting element 262a illustrated in FIG. 10(A) and the light-emitting element 262b illustrated in FIG. 10(B) each include the partitions 145 between a region 222B sandwiched between the electrode 101 and the electrode 102, a region 222G sandwiched between the electrode 102 and the electrode 103, and a region 222R sandwiched between the electrode 102 and the electrode 104. The partitions 145 have an insulating property. The partitions 145 cover end portions of the electrode 101, the electrode 103, and the electrode 104 and have openings overlapping with the electrodes. The partitions 145 are provided, whereby the electrodes provided over the substrate 200 can be divided to have island shapes in the regions.

The charge-generation layer 115 can be formed with a material obtained by adding an electron acceptor (acceptor) to a hole-transport material or a material obtained by adding an electron donor (donor) to an electron-transport material. Note that when the conductivity of the charge-generation layer 115 is as high as that of the pair of electrodes, carriers generated in the charge-generation layer 115 might transfer to an adjacent pixel and light emission might occur in the pixel. In order to prevent such false light emission from an adjacent pixel, the charge-generation layer 115 is preferably formed with a material whose conductivity is lower than that of the pair of electrodes.

The light-emitting element 262a and the light-emitting element 262b each include a substrate 220 provided with an optical element 224B, an optical element 224G, and an optical element 224R in the direction in which light exhibited by the region 222B, the region 222G, and the region 222R is extracted. The light exhibited by each region is emitted outside the light-emitting element through each optical element. In other words, the light exhibited by the region 222B is emitted through the optical element 224B, the light exhibited by the region 222G is emitted through the optical element 224G, and the light exhibited by the region 222R is emitted through the optical element 224R.

The optical element 224B, the optical element 224G, and the optical element 224R each have a function of selectively transmitting light of a particular color out of incident light. For example, the light exhibited by the region 222B through the optical element 224B is blue light, the light exhibited by the region 222G through the optical element 224G is green light, and the light exhibited by the region 222R through the optical element 224R is red light.

For example, a coloring layer (also referred to as a color filter), a band pass filter, a multilayer filter, or the like can be used for the optical element 224R, the optical element 224G, and the optical element 224B. Alternatively, color conversion elements can be used as the optical elements. A color conversion element is an optical element that converts incident light into light having a longer wavelength than the wavelength of the incident light. As the color conversion elements, quantum-dot elements are favorable. The use of the quantum dots can increase color reproducibility of the light-emitting device.

Note that one or more other optical elements may also be stacked over the optical element 224R, the optical element 224G, and the optical element 224B. As another optical element, a circularly polarizing plate, an anti-reflective film, or the like can be provided, for example. A circularly polarizing plate provided on the side where light emitted from the light-emitting element of the light-emitting device is extracted can prevent a phenomenon in which light incident from the outside of the light-emitting device is reflected inside the light-emitting device and then emitted to the outside. When an anti-reflective film is provided, external light reflected by a surface of the light-emitting device can be weakened. This leads to clear observation of light emitted from the light-emitting device.

Note that in FIGS. 10(A) and 10(B), light emitted from the respective regions through the respective optical elements are schematically illustrated by arrows of dashed lines as blue (B) light, green (G) light, and red (R) light.

A light-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of suppressing the reflection of external light. The light-blocking layer 223 has a function of preventing mixture of light emitted from adjacent light-emitting elements. For the light-blocking layer 223, a metal, a resin containing black pigment, carbon black, a metal oxide, a composite oxide containing a solid solution of a plurality of metal oxides, or the like can be used.

Note that the optical element 224B and the optical element 224G may overlap with each other in a region where they overlap with the light-blocking layer 223. The optical element 224G and the optical element 224R may overlap with each other in a region where they overlap with the light-blocking layer 223. The optical element 224R and the optical element 224B may overlap with each other in a region where they overlap with the light-blocking layer 223.

Note that for the structures of the substrate 200 and the substrate 220 provided with the optical elements, Embodiment 1 can be referred to.

Furthermore, the light-emitting element 262a and the light-emitting element 262b have a microcavity structure.

With the microcavity structure, in which the optical length between the pair of electrodes in each of the regions is adjusted, scattering of light and absorption of light in the vicinity of the electrodes can be suppressed, resulting in high light extraction efficiency.

Since the light-emitting element 262a illustrated in FIG. 10(A) is a light-emitting element of a top-emission type, it is preferable that the conductive layer 101a, the conductive layer 103a, and the conductive layer 104a have a function of reflecting light. In addition, it is preferable that the electrode 102 have a function of transmitting light and a function of reflecting light.

Since the light-emitting element 262b illustrated in FIG. 10(B) is a light-emitting element of a bottom-emission type, it is preferable that the conductive layer 101a, the conductive layer 103a, and the conductive layer 104a have a function of transmitting light and a function of reflecting light. In addition, it is preferable that the electrode 102 have a function of reflecting light.

The structure of the light-emitting element described in Embodiment 1 is preferably used for at least one of the light-emitting layer 170 and the light-emitting layer 190 included in the light-emitting element 262a and the light-emitting element 262b. Accordingly, the light-emitting device having high color purity, high emission efficiency, and less change in color even after the device is driven can be fabricated.

It is preferable to select the light-emitting materials used for the light-emitting layers so that white light can be obtained from light emissions exhibited by the light-emitting layer 170 and the light-emitting layer 190.

One or both of the light-emitting layer 170 and the light-emitting layer 190 may have a structure in which three or more layers are stacked, and a layer not including a light-emitting material may be included.

For the other structures of the light-emitting element 262a and the light-emitting element 262b, the structures of the light-emitting element 260a, the light-emitting element 260b, or the light-emitting elements described in Embodiment 1 can be referred to.

By the analysis method of one embodiment of the present invention, an element structure of a light-emitting element in an extremely small region can be analyzed. The layer structure and the organic compound for each of the region 222B, the region 222G, and the region 222R described in this embodiment can be analyzed.

The structure described above in this embodiment can be used as appropriate in combination with any of the other embodiments.

Embodiment 4

In this embodiment, examples of light-emitting elements to which the analysis method of one embodiment of the present invention can be applied will be described below with reference to FIG. 11 to FIG. 13.

Figure 11A:
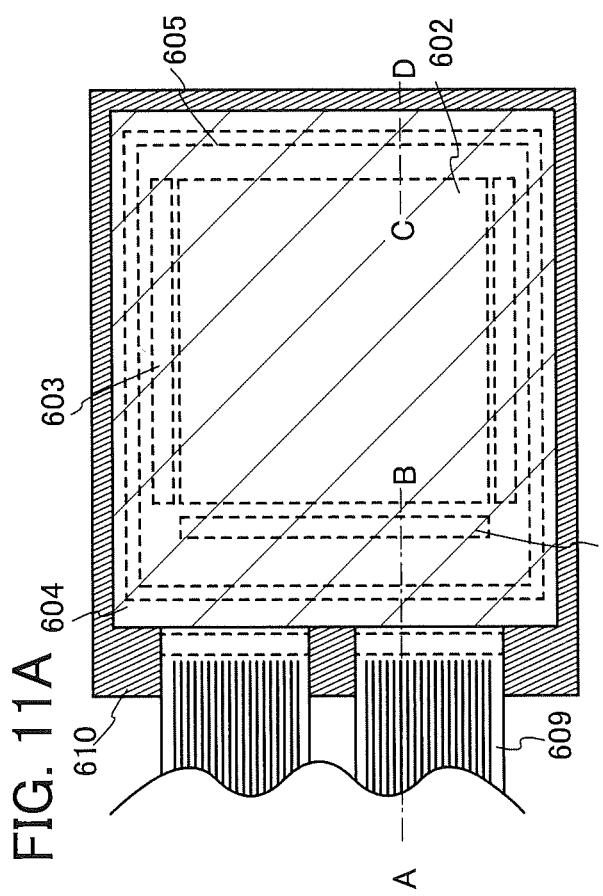
FIGS. 11A and 11B are conceptual diagrams of an active matrix light-emitting device to which an analysis method of one embodiment of the present invention can be applied.
Figure 11B:
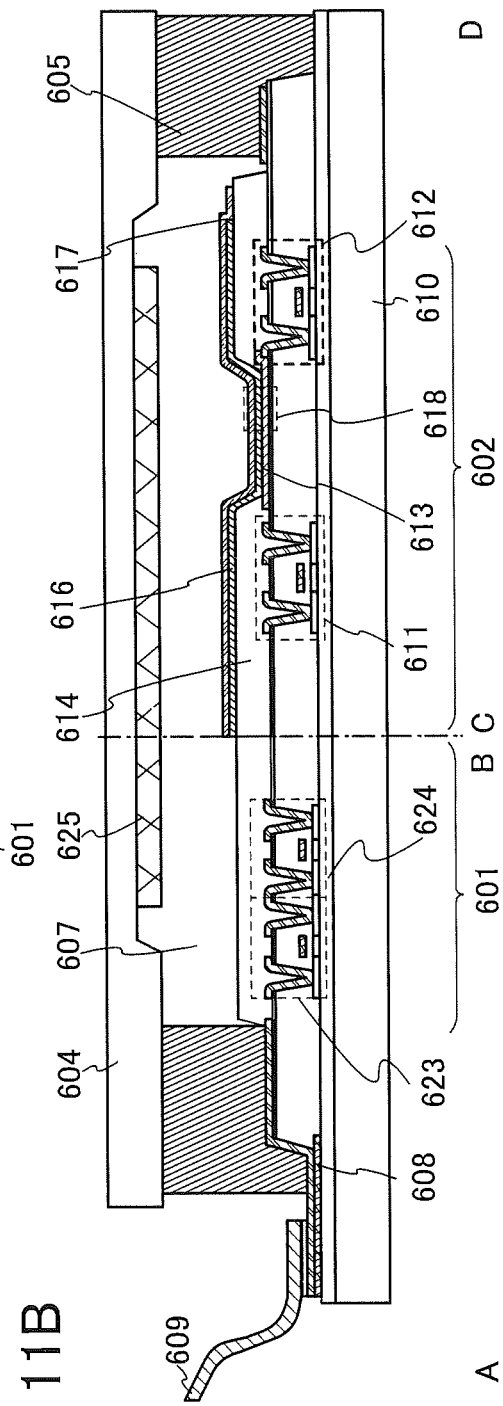

FIG. 11(A) is a top view illustrating the light-emitting device and FIG. 11(B) is a cross-sectional view taken along A-B and C-D in FIG. 11(A). This light-emitting device includes a driver circuit portion (a source side driver circuit) 601, a pixel portion 602, and a driver circuit portion (a gate side driver circuit) 603 which are indicated by dotted lines as components controlling light emission of the light-emitting element. Furthermore, 604 denotes a sealing substrate, 625 denotes a desiccant, 605 denotes a sealing material, and a portion surrounded by the sealing material 605 is a space 607.

Note that a lead wiring 608 is a wiring for transmitting signals to be input to the source side driver circuit 601 and the gate side driver circuit 603 and receives a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting device in this specification includes not only the light-emitting device itself but also the state where the FPC or the PWB is attached to the light-emitting device.

Next, a cross-sectional structure of the above light-emitting device is described with reference to FIG. 11(B). The driver circuit portion and the pixel portion are formed over an element substrate 610. Here, the source side driver circuit 601, which is the driver circuit portion, and one pixel of the pixel portion 602 are illustrated.

In the source side driver circuit 601, a CMOS circuit in which an n-channel TFT 623 and a p-channel TFT 624 are combined is formed. The driver circuit may be formed of various CMOS circuits, PMOS circuits, or NMOS circuits. Although a driver-integrated type where the driver circuit is formed over the substrate is described in this embodiment, this is not necessary and the driver circuit can be formed not over the substrate but in an external portion.

The pixel portion 602 is formed of pixels including a switching TFT 611, a current controlling TFT 612, and a first electrode 613 electrically connected to a drain thereof. Note that an insulator 614 is formed to cover an end portion of the first electrode 613. The insulator 614 can be formed with the use of a positive photosensitive resin film.

In order to improve the coverage of a film formed over the insulator 614, the insulator 614 is formed to have a surface with curvature at its upper end portion or lower end portion. For example, in the case where a photosensitive acrylic is used as a material of the insulator 614, only the upper end portion of the insulator 614 preferably has a curved surface. The radius of curvature of the curved surface is preferably greater than or equal to 0.2 μm and less than or equal to 0.3 μm. Either a negative photosensitive material or a positive photosensitive material can be used as the insulator 614.

An EL layer 616 and a second electrode 617 are formed over the first electrode 613. Here, as a material used for the first electrode 613 which functions as an anode, a material having a high work function is preferably used. For example, a single-layer film of an ITO film, an indium tin oxide film containing silicon, an indium oxide film containing zinc oxide at 2 wt % or higher and 20 wt % or lower, a titanium nitride film, a chromium film, a tungsten film, a Zn film, a Pt film, or the like, a stacked layer of titanium nitride and a film containing aluminum as its main component, a three-layer structure including a titanium nitride film, a film containing aluminum as its main component, and a titanium nitride film, or the like can be used. Note that the stacked structure achieves low wiring resistance, a favorable ohmic contact, and a function of an anode.

The EL layer 616 is formed by any of a variety of methods such as an evaporation method using an evaporation mask, an inkjet method, and a spin coating method. A material included in the EL layer 616 may be a low molecular compound or a high molecular compound (including an oligomer or a dendrimer).

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. Note that in the case where light generated in the EL layer 616 passes through the second electrode 617, a stacked layer including a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

When the sealing substrate 604 and the element substrate 610 are attached to each other with the sealing material 605, a structure in which the light-emitting element 618 is provided in the space 607 surrounded by the element substrate 610, the sealing substrate 604, and the sealing material 605 is obtained. Note that the space 607 is filled with a filler and there is a case where the space 607 is filled with a resin or a desiccant, or both of them as well as the case where the space 607 is filled with an inert gas (nitrogen, argon, or the like).

Note that an epoxy-based resin or glass frit is preferably used for the sealing material 605. Such a material is desirably a material that does not transmit moisture or oxygen as much as possible. As materials used for the sealing substrate 604, in addition to a glass substrate and a quartz substrate, a plastic substrate formed of FRP (Fiber Reinforced Plastics), PVF (poly(vinyl fluoride)), polyester, acrylic, or the like can be used.

By applying the analysis method of one embodiment of the present invention to the light-emitting device shown in FIG. 11, the EL layer 616 included in the light-emitting device can be analyzed.

Structure Example 3 of Light-Emitting Device

As an example of a light-emitting device, FIG. 12 illustrates a light-emitting device including a light-emitting element exhibiting white light emission and a coloring layer (a color filter).

In FIG. 12(A), a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of the light-emitting elements, a partition 1026, an EL layer 1028, a second electrode 1029 of the light-emitting elements, a sealing substrate 1031, a sealing material 1032, and the like are illustrated.

In FIGS. 12(A) and 12(B), coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 12(A), there are a light-emitting layer from which light exits without passing through the coloring layers and a light-emitting layer from which light exits passing through the coloring layers. Since light that does not pass through the coloring layers is white and light that passes through the coloring layers is red, blue, or green, an image can be displayed by pixels of the four colors.

FIG. 12(B) illustrates an example in which the coloring layers (the red coloring layer 1034R, the green coloring layer 1034G, and the blue coloring layer 1034B) are formed between the gate insulating film 1003 and the first interlayer insulating film 1020. As shown in FIG. 12(B), the coloring layers may be provided between the substrate 1001 and the sealing substrate 1031.

The above-described light-emitting device is a light-emitting device having a structure in which light emission is extracted on the substrate 1001 side where the TFTs are formed (a bottom emission type), but may be a light-emitting device having a structure in which light emission is extracted on the sealing substrate 1031 side (a top emission type).

Structure Example 4 of Light-Emitting Device

Figure 13:
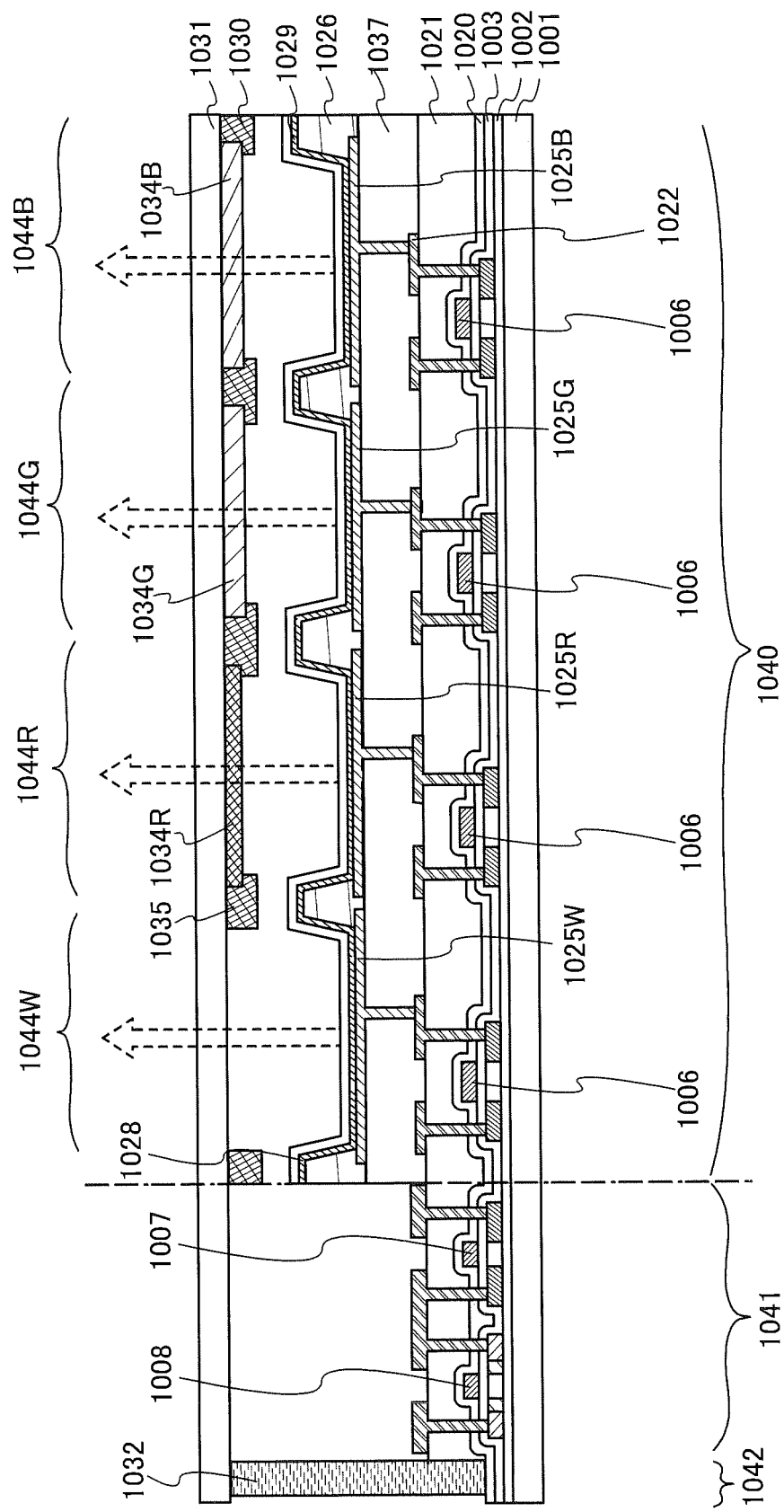
FIG. 13 is a conceptual diagram of an active matrix light-emitting device to which an analysis method of one embodiment of the present invention can be applied.

FIG. 13 illustrates a cross-sectional view of a light-emitting device of a top emission type. In that case, a substrate that does not transmit light can be used as the substrate 1001. The process up to the fabrication of a connection electrode which connects the TFT and the anode of the light-emitting element is performed in a manner similar to that of the light-emitting device of a bottom-emission type. Then, a third interlayer insulating film 1037 is formed to cover an electrode 1022. This insulating film may have a planarization function. The third interlayer insulating film 1037 can be formed using a material similar to that of the second interlayer insulating film 1021, or can be formed using other various materials.

Lower electrodes 1025W, 1025R, 1025G, and 1025B of the light-emitting element are anodes here, but may be cathodes. Furthermore, in the case of the light-emitting device having a top emission structure as shown in FIG. 13, the lower electrodes 1025W, 1025R, 1025G, and 1025B are preferably reflective electrodes. Note that the second electrode 1029 preferably has a function of reflecting light and a function of transmitting light. It is preferable that a microcavity structure be used between the second electrode 1029 and the lower electrodes 1025W, 1025R, 1025G, and 1025B, in which case light having a specific wavelength is amplified. The EL layer 1028 has a structure similar to the structure described in Embodiment 2, with which white light emission can be obtained.

In FIGS. 12(A) and 12(B) and FIG. 13, the structure of the EL layer for providing white light emission can be achieved by, for example, using a plurality of light-emitting layers or using a plurality of light-emitting units. Note that the structure for providing white light emission is not limited to them.

In a top emission structure as illustrated in FIG. 13, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (black matrix) 1035 which is positioned between pixels. The coloring layers (the red coloring layer 1034R, the green coloring layer 1034G, and the blue coloring layer 1034B) and the black layer (black matrix) may be covered with the overcoat layer. Note that a substrate having a light-transmitting property is used as the sealing substrate 1031.

Although an example in which full color display is performed using four colors of red, green, blue, and white is shown here, there is no particular limitation and full color display using three colors of red, green, and blue may be performed. Alternatively, full color display using four colors of red, green, blue, and yellow may be performed.

By applying the analysis method of one embodiment of the present invention to the light-emitting devices shown in FIG. 12 and FIG. 13, the EL layer 1028 included in the light-emitting devices can be analyzed.

Note that this embodiment can be combined as appropriate with any of the other embodiments.

Embodiment 5

In this embodiment, electronic devices to which the analysis method of one embodiment of the present invention can be applied will be described. The electronic devices preferably include an organic semiconductor element.

A television set, a desktop or laptop personal computer, a monitor of a computer or the like, a digital camera, a digital video camera, a digital photo frame, a mobile phone, a portable game machine, a portable information terminal, an audio reproducing device, a large game machine such as a pachinko machine, and the like can be given as examples of the electronic devices to which the analysis method of one embodiment of the present invention can be applied.

Figure 14A:
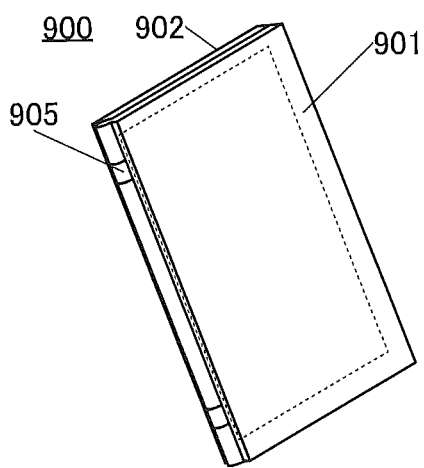
FIGS. 14A-14D are schematic views of electronic devices to which an analysis method of one embodiment of the present invention can be applied.
Figure 14B:
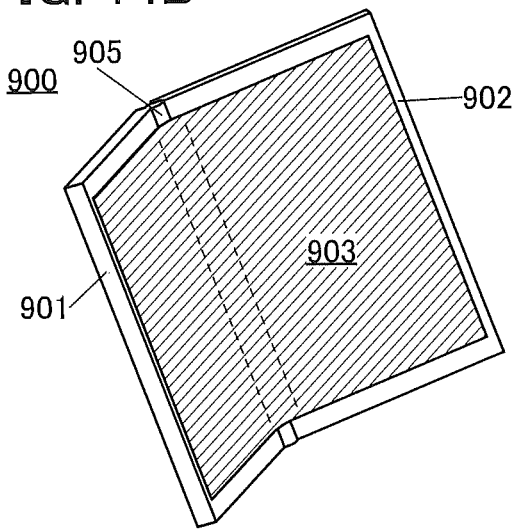

A portable information terminal 900 illustrated in FIGS. 14(A) and 14(B) includes a housing 901, a housing 902, a display portion 903, a hinge portion 905, and the like.

The housing 901 and the housing 902 are joined together with the hinge portion 905. The portable information terminal 900 can be opened as illustrated in FIG. 14(B) from a folded state (FIG. 14(A)). Thus, the portable information terminal 900 has high portability when carried and excellent visibility when used because of its large display region.

In the portable information terminal 900, the flexible display portion 903 is provided across the housing 901 and the housing 902 which are joined together by the hinge portion 905.

The display portion 903 can display at least one of text information, a still image, a moving image, and the like. When text information is displayed on the display portion, the portable information terminal 900 can be used as an e-book reader.

When the portable information terminal 900 is opened, the display portion 903 is held while being in a significantly curved form. For example, the display portion 903 is held while including a curved portion with a radius of curvature of greater than or equal to 1 mm and less than or equal to 50 mm, preferably greater than or equal to 5 mm and less than or equal to 30 mm. Part of the display portion 903 can display an image while being curved since pixels are continuously arranged from the housing 901 to the housing 902.

The display portion 903 functions as a touch panel and can be controlled with a finger, a stylus, or the like.

The display portion 903 is preferably formed using one flexible display. Thus, a seamless continuous image can be displayed between the housing 901 and the housing 902. Note that each of the housing 901 and the housing 902 may be provided with a display.

The hinge portion 905 preferably includes a locking mechanism so that an angle formed between the housing 901 and the housing 902 does not become larger than a predetermined angle when the portable information terminal 900 is opened. For example, an angle at which they become locked (they are not opened any further) is preferably greater than or equal to 90° and less than 180° and can be typically 90°, 120°, 135°, 150°, 175°, or the like. In that case, the convenience, safety, and reliability of the portable information terminal 900 can be improved.

When the hinge portion 905 includes a locking mechanism, excessive force is not applied to the display portion 903; thus, breakage of the display portion 903 can be prevented. Therefore, a highly reliable portable information terminal can be obtained.

A power button, an operation button, an external connection port, a speaker, a microphone, or the like may be provided for the housing 901 and the housing 902.

Either of the housing 901 and the housing 902 is provided with a wireless communication module, and data can be transmitted and received through a computer network such as the Internet, a LAN (Local Area Network), or Wi-Fi (registered trademark).

Figure 14C:
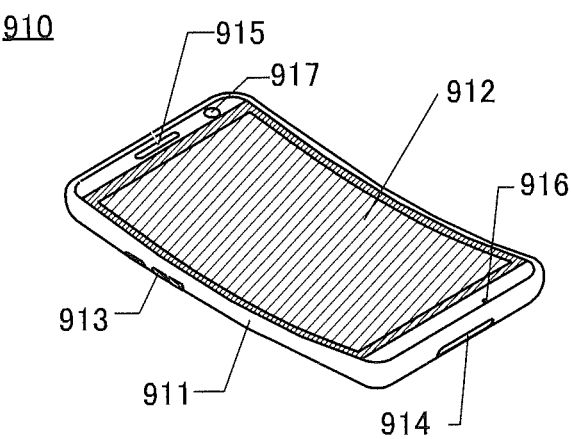

A portable information terminal 910 illustrated in FIG. 14(C) includes a housing 911, a display portion 912, an operation button 913, an external connection port 914, a speaker 915, a microphone 916, a camera 917, and the like. The portable information terminal 910 includes a touch sensor in the display portion 912. All operations such as making a call and inputting a character can be performed by touch on the display portion 912 with a finger, a stylus, or the like.

In addition, the operation of the operation button 913 can switch the power ON and OFF operations and types of images displayed on the display portion 912. For example, switching from a mail creation screen to a main menu screen can be performed.

When a detection device such as a gyroscope sensor or an acceleration sensor is provided inside the portable information terminal 910, the direction of display on the screen of the display portion 912 can be automatically changed by determining the orientation of the portable information terminal 910 (whether it is placed horizontally or vertically). Furthermore, the direction of display on the screen can be changed by touch on the display portion 912, operation of the operation button 913, sound input using the microphone 916, or the like.

The portable information terminal 910 has, for example, one or more functions selected from a telephone set, a notebook, an information browsing system, and the like. Specifically, the portable information terminal 910 can be used as a smartphone. The portable information terminal 910 is capable of executing a variety of applications such as mobile phone calls, e-mailing, text viewing and writing, music replay, video replay, Internet communication, and games, for example.

Figure 14D:
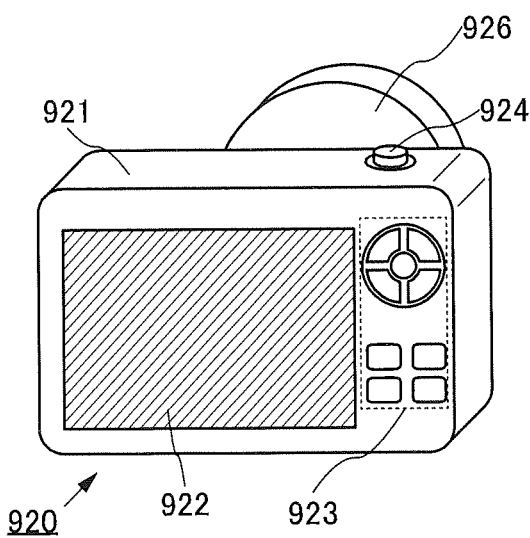

A camera 920 illustrated in FIG. 14(D) includes a housing 921, a display portion 922, operation buttons 923, a shutter button 924, and the like. Furthermore, a detachable lens 926 is attached to the camera 920.

Although the camera 920 here is configured such that the lens 926 is detachable from the housing 921 for replacement, the lens 926 may be integrated with the housing 921.

A still image or a moving image can be taken with the camera 920 at the press of the shutter button 924. In addition, the display portion 922 has a function of a touch panel, and images can also be taken by the touch on the display portion 922.

Note that a stroboscope, a viewfinder, or the like can be additionally attached to the camera 920. Alternatively, these may be incorporated into the housing 921.

FIGS. 15(A) to 15(E) are diagrams illustrating electronic devices. These electronic devices include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The light-emitting device manufactured using one embodiment of the present invention can be favorably used for the display portion 9001. Thus, the electronic devices can be manufactured with high yield.

The electronic devices illustrated in FIGS. 15(A) to 15(E) can have a variety of functions. For example, they can have a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting or receiving a variety of data with a wireless communication function, a function of reading a program or data stored in a storage medium and displaying the program or data on the display portion, and the like. Note that the functions of the electronic devices illustrated in FIGS. 15(A) to 15(E) are not limited to the above, and the electronic devices may have other functions.

Figure 15A:
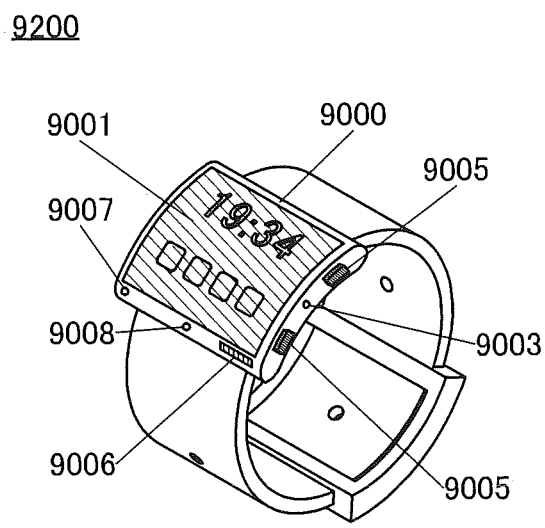
FIGS. 15A-15E are schematic views of electronic devices to which an analysis method of one embodiment of the present invention can be applied.
Figure 15B:
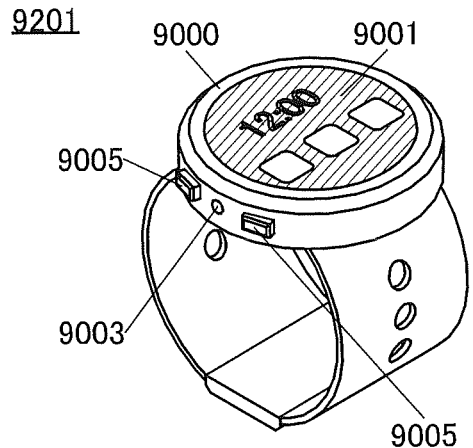

FIG. 15(A) is a perspective view of a watch-type portable information terminal 9200. FIG. 15(B) is a perspective view of a watch-type portable information terminal 9201.

The portable information terminal 9200 illustrated in FIG. 15(A) is capable of executing a variety of applications such as mobile phone calls, e-mailing, test viewing and writing, music replay, Internet communication, and computer games. The display surface of the display portion 9001 is curved, and an image can be displayed on the curved display surface. The portable information terminal 9200 can perform near field communication conformable to a communication standard. For example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Unlike in the portable information terminal illustrated in FIG. 15(A), the display surface of the display portion 9001 is not curved in the portable information terminal 9201 illustrated in FIG. 15(B). Furthermore, the external state of the display portion of the portable information terminal 9201 is a non-rectangular shape (a circular shape in FIG. 15(B)).

Figure 15C:
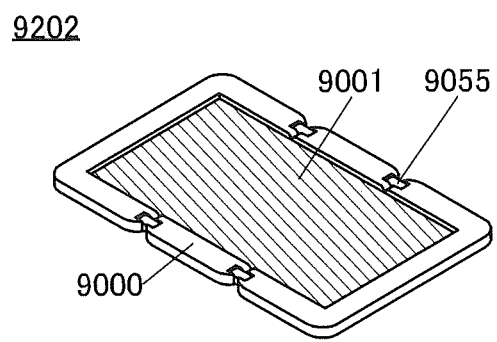
Figure 15D:
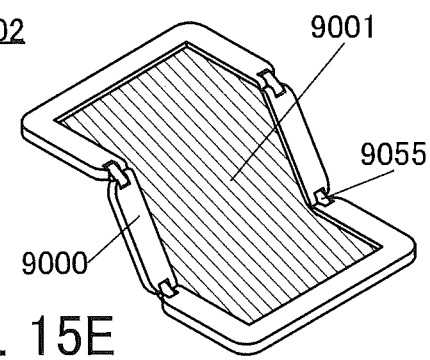
Figure 15E:
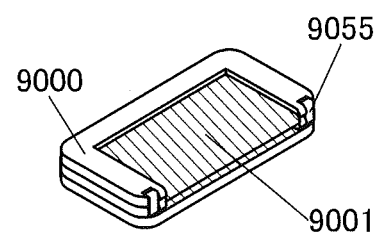

FIGS. 15(C) to 15(E) are perspective views of a foldable portable information terminal 9202. Note that FIG. 15(C) is a perspective view of the portable information terminal 9202 that is opened; FIG. 15(D) is a perspective view of the portable information terminal 9202 that is being changed from one of an opened state and a folded state; and FIG. 15(E) is a perspective view of the portable information terminal 9202 that is folded.

The portable information terminal 9202 is highly portable in the folded state, and is highly browsable in the opened state due to a seamless large display region. The display portion 9001 of the portable information terminal 9202 is supported by three housings 9000 joined together by hinges 9055. By being bent between two housings 9000 with the hinges 9055, the portable information terminal 9202 can be reversibly changed in shape from the opened state to the folded state. For example, the portable information terminal 9202 can be bent with a radius of curvature of greater than or equal to 1 mm and less than or equal to 150 mm.

By applying the analysis method of one embodiment of the present invention to the light-emitting devices shown in FIG. 14 and FIG. 15, the organic semiconductor layers included in the light-emitting devices can be analyzed.

This embodiment can be combined with any of the other embodiments as appropriate.

Embodiment 6

In this embodiment, examples of lighting devices to which the analysis method of one embodiment of the present invention can be applied will be described with reference to FIG. 16 and FIG. 17. The lighting devices preferably include an organic semiconductor element.

An electronic device or a lighting device that has a light-emitting region with a curved surface can be obtained through fabricating the light-emitting element of one embodiment of the present invention over a substrate having flexibility.

Furthermore, a light-emitting device in which the light-emitting element of one embodiment of the present invention is used can also be used for lighting for motor vehicles; for example, such lighting can be provided on a windshield, a ceiling, and the like.

Figure 16A:
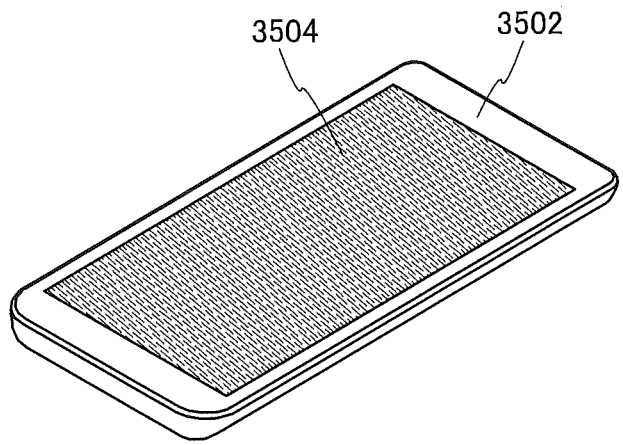
FIGS. 16A-16C are views illustrating lighting devices to which an analysis method of one embodiment of the present invention can be applied.
Figure 16B:
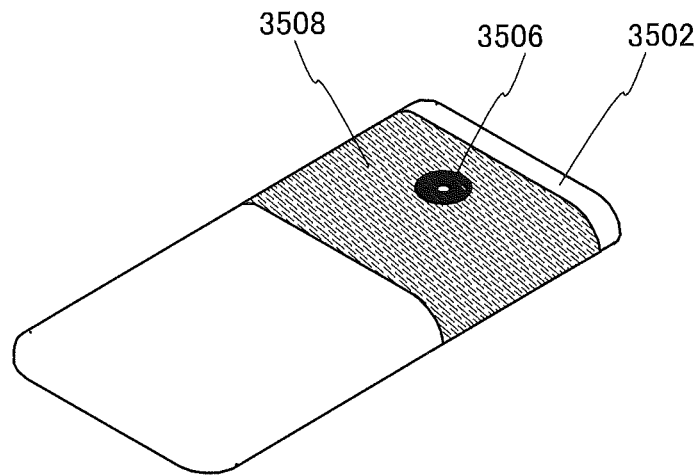

FIG. 16(A) is a perspective view illustrating one surface of a multifunction terminal 3500, and FIG. 16(B) is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 has a function of a planar light source, a photograph as if taken under natural light can be taken.

Note that the multifunction terminal 3500 shown in FIGS. 16(A) and 16(B) can have a variety of functions as in the electronic devices shown in FIGS. 14(A) to 14(C).

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone, and the like. When a detection device including a sensor for detecting inclination, such as a gyroscope sensor or an acceleration sensor, is provided inside the multifunction terminal 3500, display on the screen of the display portion 3504 can be automatically switched by determining the orientation (horizontal or vertical) of the multifunction terminal 3500.

The display portion 3504 can function as an image sensor. For example, an image of a palm print, a fingerprint, or the like is taken by touch on the display portion 3504 with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3054.

Figure 16C:
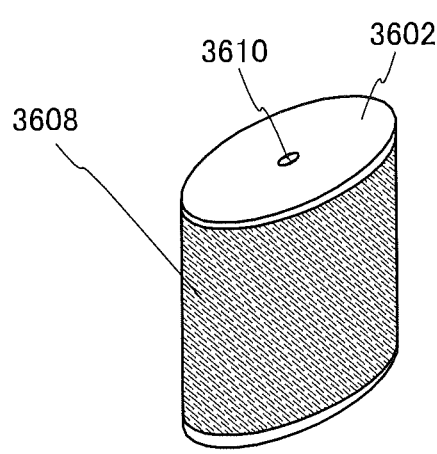

FIG. 16(C) is a perspective view of a security light 3600. The light 3600 includes a lighting 3608 on the outside of the housing 3602, and a speaker 3610 and the like are incorporated in the housing 3602. The light-emitting element of one embodiment of the present invention can be used for the lighting 3608.

The light 3600 emits light when the lighting 3608 is gripped or held, for example. An electronic circuit that can control the manner of light emission from the light 3600 may be provided in the housing 3602. The electronic circuit may be a circuit that enables light emission once or intermittently a plurality of times or may be a circuit that can adjust the amount of emitted light by controlling the current value for light emission. A circuit with which a loud audible alarm is output from the speaker 3610 at the same time as light emission from the lighting 3608 may be incorporated.

The light 3600 can emit light in various directions; therefore, it is possible to intimidate a thug or the like with light, or light and sound. Moreover, the light 3600 may include a camera such as a digital still camera to have a photography function.

Figure 17:
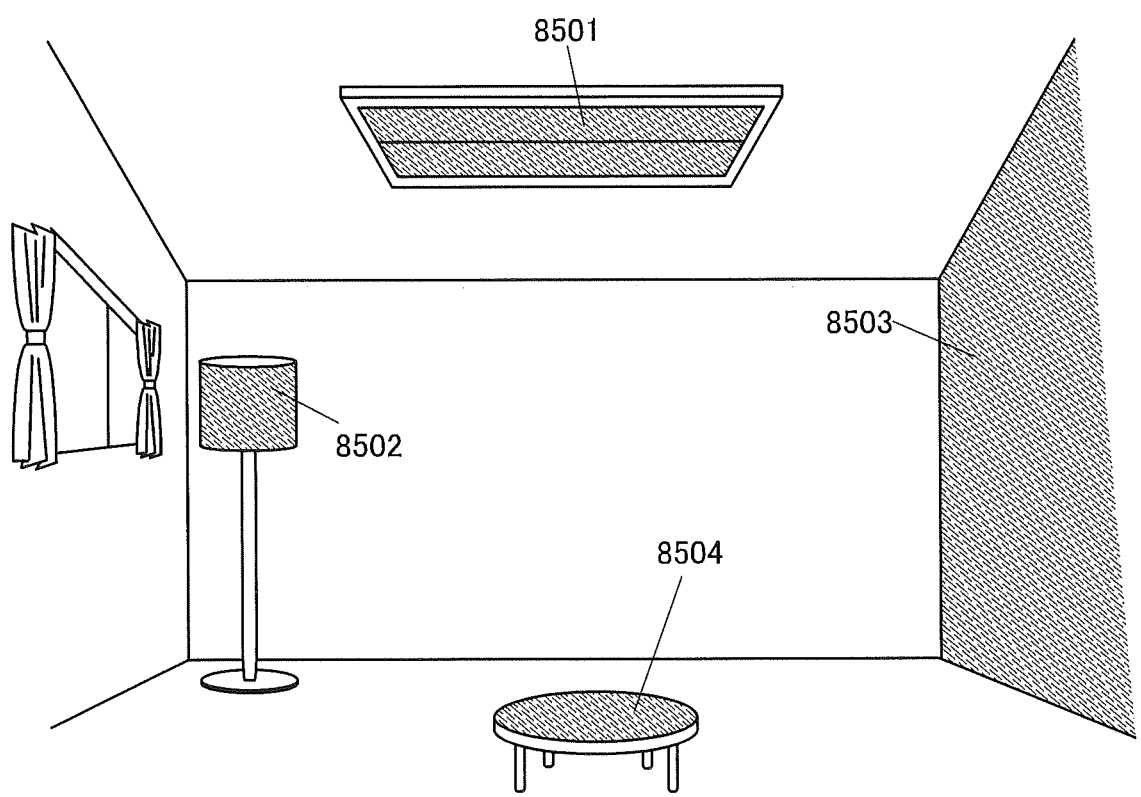
FIG. 17 is a view illustrating lighting devices to which an analysis method of one embodiment of the present invention can be applied.

FIG. 17 is an example in which the light-emitting element is used for an indoor lighting device 8501. Note that since the light-emitting element can have a larger area, a lighting device having a large area can also be formed. In addition, a lighting device 8502 in which a light-emitting region has a curved surface can also be formed with the use of a housing with a curved surface. The light-emitting element described in this embodiment is in the form of a thin film, and the degree of design freedom of the housing is high. Therefore, the lighting device can be elaborately designed in a variety of ways. Furthermore, a wall of the room may be provided with a large-sized lighting device 8503. Touch sensors may be provided in the lighting devices 8501, 8502, and 8503 to turn the power on or off.

Moreover, when the light-emitting element is used on the surface side of a table, a lighting device 8504 which has a function of a table can be obtained. Note that when the light-emitting element is used as part of another piece of furniture, a lighting device which has a function of the piece of furniture can be obtained.

The analysis method of one embodiment of the present invention can be applied to the above-described lighting devices. Note that the one embodiment of the present invention can be used for electronic devices in a variety of fields without being limited to the lighting devices and the electronic devices described in this embodiment.

The structures described in this embodiment can be used in an appropriate combination with any of the structures described in the other embodiments.

Example 1

Figure 18:
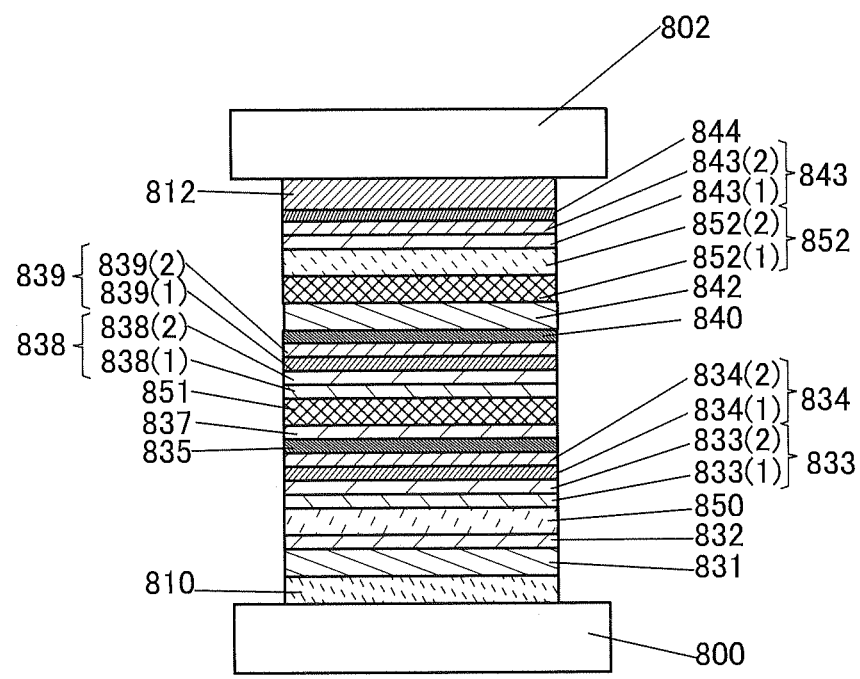
FIG. 18 is a view explaining an element structure of a light-emitting element in Example.

In this example, an analysis example of an analysis method of one embodiment of the present invention will be described. In this example, a change in a state of an organic compound between before and after the fabrication of a light-emitting element 1, which is described below, was analyzed. FIG. 18 shows the element structure of the light-emitting element 1. In addition, the structures of the organic compounds and the details of the element structure are shown below.

TABLE 1

|  | Layer | Reference numeral | Thickness (nm) | Material | Weight ratio |
|---|---|---|---|---|---|
| Light-emitting element 1 | Electrode | 812(2) | 120 | Ag | — |
|  |  | 812(1) | 1 | Ag:Mg | 1:0.1 |
|  | Electron-injection layer | 844 | 1 | LiF | — |
|  | Electron-transport layer | 843(2) | 15 | BPhen | — |
|  |  | 843(1) | 15 | 2mDBTPDBq-II | — |
|  | Light-emitting layer | 852(2) | 15.1 | 2mDBTPDBq-II:PCBA1BP: Ir(dppm)$_2$(acac) | 0.8:0.2:0.06 |
|  |  | 852(1) | 15.1 | 2mDBTPDBq-II:PCBA1BP: Ir(tBuppm)$_2$(acac) | 0.8:0.2:0.06 |
|  | Hole-transport layer | 842 | 20 | BPAFLP | — |
|  | Charge-generation layer | 840 | 54.5 | BPAFLP:MoO$_3$ | 1:0.5 |
|  | Electron-injection layer | 839(2) | 2 | CuPc | — |
|  |  | 839(2) | 1 | LiF | — |
|  | Electron-transport layer | 838(1) | 10 | BPhen | — |
|  |  | 838(1) | 5 | CzPA | — |
|  | Light-emitting layer | 851 | 28.5 | CzPA: 1,6mMemFLPAPm | 1:0.03 |
|  | Hole-transport layer | 837 | 10 | PCzPA | — |
|  | Charge-generation layer | 835 | 4.5 | PCzPA:MoO$_3$ | 1:0.5 |
|  | Electron-injection layer | 834(2) | 2 | CuPc | — |
|  |  | 834(1) | 1 | LiF | — |
|  | Electron-transport layer | 833(2) | 15 | BPhen | — |
|  |  | 833(1) | 15 | 2mDBTPDBq-II | — |
|  | Light-emitting layer | 850 | 22.6 | 2mDBTPDBq-II:PCBA1BP: Ir(tppr)$_2$(dpm) | 0.8:0.2:0.06 |
|  | Hole-transport layer | 832 | 20 | PCBA1BP | — |
|  | Hole-injection layer | 831 | 12.7 | BPAFLP:MoO$_3$ | 1:0.5 |
|  | Electrode | 810 | 110 | ITSO | — |

[Chemical 1]
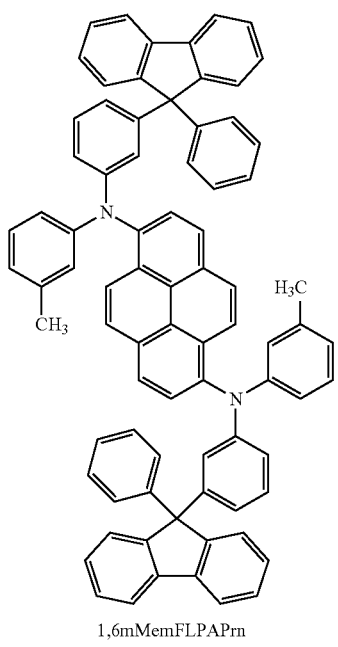
1,6mMemFLPAPrn
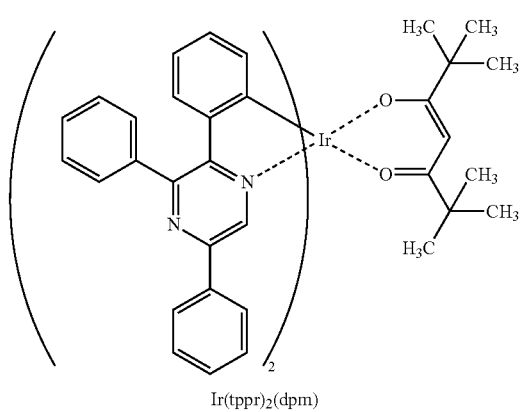
Ir(tppr)₂(dpm)
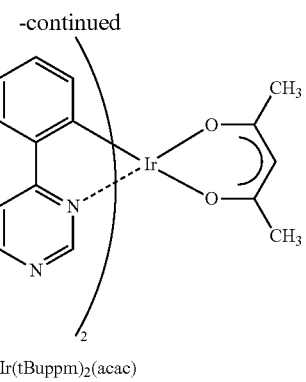
Ir(tBuppm)₂(acac)
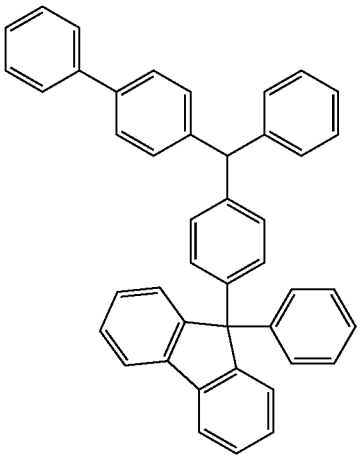
BPAFLP
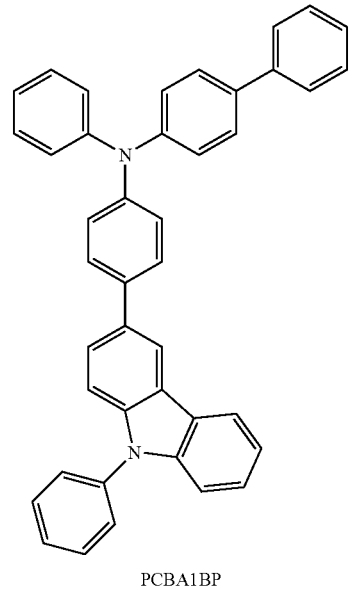
PCBA1BP

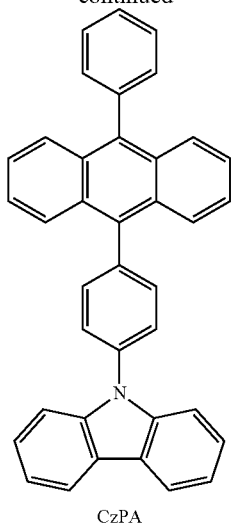

CzPA

[Chemical 2]

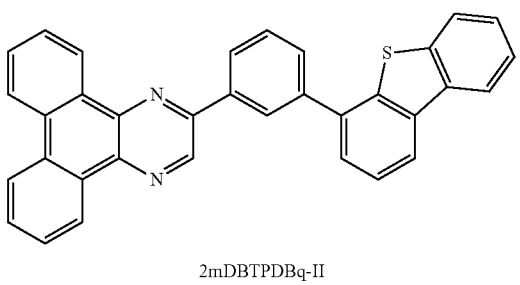

2mDBTPDBq-II

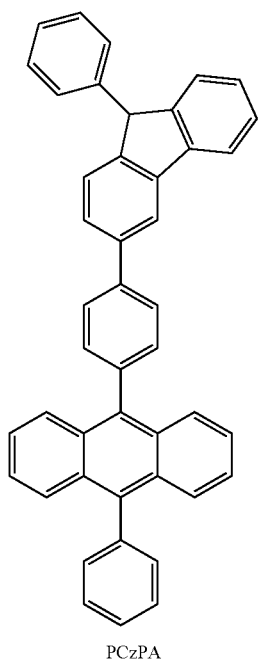

PCzPA

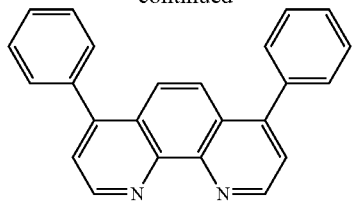

Bphen

CuPc

<Fabrication of Light-Emitting Element>

As an electrode 810, an ITSO film was formed to a thickness of 110 nm over a substrate 800. Note that the electrode area of the electrode 810 was 81 cm² (9 cm×9 cm).

Next, as a hole-injection layer 831, BPAFLP and molybdenum oxide (MoO₃) were deposited over the electrode 810 by co-evaporation at a weight ratio (BPAFLP: MoO₃) of 1:0.5 to a thickness of 12.7 nm.

Next, as a hole-transport layer 832, PCBA1BP was deposited over the hole-injection layer 831 by evaporation to a thickness of 10 nm.

Then, as a light-emitting layer 850, 2mDBTPDBq-II, PCBA1BP, and Ir(tppr)₂(dpm) were deposited over the hole-transport layer 832 by co-evaporation at a weight ratio (2mDBTPDBq-II: PCBA1BP: Ir(tppr)₂(dpm) of 0.8:0.2: 0.06 to a thickness of 22.6 nm. Here, Ir(tppr)₂(dpm) is a guest material and emits red light.

Next, as an electron-transport layer 833, 2mDBTPDBq-II and BPhen were sequentially deposited over the light-emitting layer 850 by evaporation to a thickness of 15 nm and 15 nm, respectively.

Next, as an electron-injection layer 834, lithium fluoride (abbreviation: LiF) and copper phthalocyanine (abbreviation: CuPc) were sequentially deposited over the electron-transport layer 833 by evaporation to thicknesses of 1 nm and 2 nm, respectively.

Then, as a charge-generation layer 835 also serving as a hole-injection layer, PCzPA and molybdenum oxide (MoO₃) were deposited by co-evaporation at a weight ratio (PCzPA: MoO₃) of 1:0.5 to a thickness of 4.5 nm.

Next, as a hole-transport layer 837, PCzPA was deposited over the charge-generation layer 835 by evaporation to a thickness of 10 nm.

Next, as a light-emitting layer 851, CzPA and 1,6mMemFLPAPrn were deposited over the hole-transport layer 837 by evaporation at a weight ratio (CzPA: 1,6mMemFLPAPrn) of 1:0.03 to a thickness of 28.5 nm. Here, 1,6mMemFLPAPrn is a guest material and emits blue right.

Then, as an electron-transport layer 838, CzPA and BPhen were sequentially deposited over the light-emitting layer 851 by evaporation to thicknesses of 5 nm and 10 nm, respectively.

Next, as an electron-injection layer 839, lithium fluoride (abbreviation: LiF) and copper phthalocyanine (abbreviation: CuPc) were sequentially deposited over the electron-transport layer 838 by evaporation to thicknesses of 1 nm and 2 nm, respectively.

Next, as a charge-generation layer 840 also serving as a hole-injection layer, BPAFLP and molybdenum oxide ($MoO_3$) were deposited by co-evaporation at a weight ratio (BPAFLP: $MoO_3$) of 1:0.5 to a thickness of 54.5 nm.

Then, as a hole-transport layer 842, BPAFLP was deposited over the charge-generation layer 840 by evaporation to a thickness of 20 nm.

Next, as a light-emitting layer 852, 2mDBTPDBq-II, PCBA1BP, and Ir(tBuppm)$_2$(acac) were deposited over the hole-transport layer 842 by co-evaporation at a weight ratio (2mDBTPDBq-II: PCBA1BP: Ir(tBuppm)$_2$(acac)) of 0.8: 0.2:0.06 to a thickness of 15.1 nm. Subsequently, 2mDBTPDBq-II, PCBA1BP, and Ir(dppm)$_2$(acac) were deposited by co-evaporation at a weight ratio (2mDBTPDBq-II: PCBA1BP: Ir(dppm)$_2$(acac)) of 0.8:0.2: 0.06 to a thickness of 15.1 nm. Here, Ir(tBuppm)$_2$(acac) and Ir(dppm)$_2$(acac)) are guest materials, and emit green light and orange light, respectively.

Next, as an electron-transport layer 843, 2mDBTPDBq-II and BPhen were sequentially deposited over the light-emitting layer 852 by evaporation to a thickness of 15 nm and 15 nm, respectively.

Then, as an electron-injection layer 844, lithium fluoride (abbreviation: LiF) was deposited over the electron-transport layer 843 by evaporation to a thickness of 1 nm.

Next, as an electrode 812, silver (Ag) and magnesium (Mg) were deposited over the electron-injection layer 844 by co-evaporation at a weight ratio (Ag: Mg) of 1:0.1 to a thickness of 1 nm. Subsequently, Ag was deposited by evaporation to a thickness of 120 nm.

Next, in a glove box containing a nitrogen atmosphere, the light-emitting element 1 was sealed by fixing a substrate for sealing 802 to the substrate 800 on which the organic materials were formed using a sealant for organic EL. Specifically, the sealant was applied to the periphery of the organic materials formed on the glass substrate 800, the substrate 800 and the substrate 802 were bonded to each other, the sealant was irradiated with ultraviolet light having a wavelength of 365 nm at 6 J/cm$^2$, and heat treatment at 80° C. for one hour was performed. Through the process, the light-emitting element 1 was obtained.

<Analysis of Light-Emitting Element>

Next, in order to analyze the state of organic compounds in the light-emitting element 1 fabricated above, the organic compounds included in the light-emitting element 1 were isolated and obtained through the following steps (see (S1), (S4), (S5), and (S7) in FIG. 3).

First, a trigger was made with a cutter in a counter substrate on which the light-emitting element 1 was not formed, whereby one of the substrates was separated ((S1) in FIG. 3).

Next, an EL layer was dissolved with use of chloroform, an unwanted substance was removed by filtration, and then an unwanted solvent was concentrated, so that a mixed solution was formed ((S4) in FIG. 3).

Figure 19:
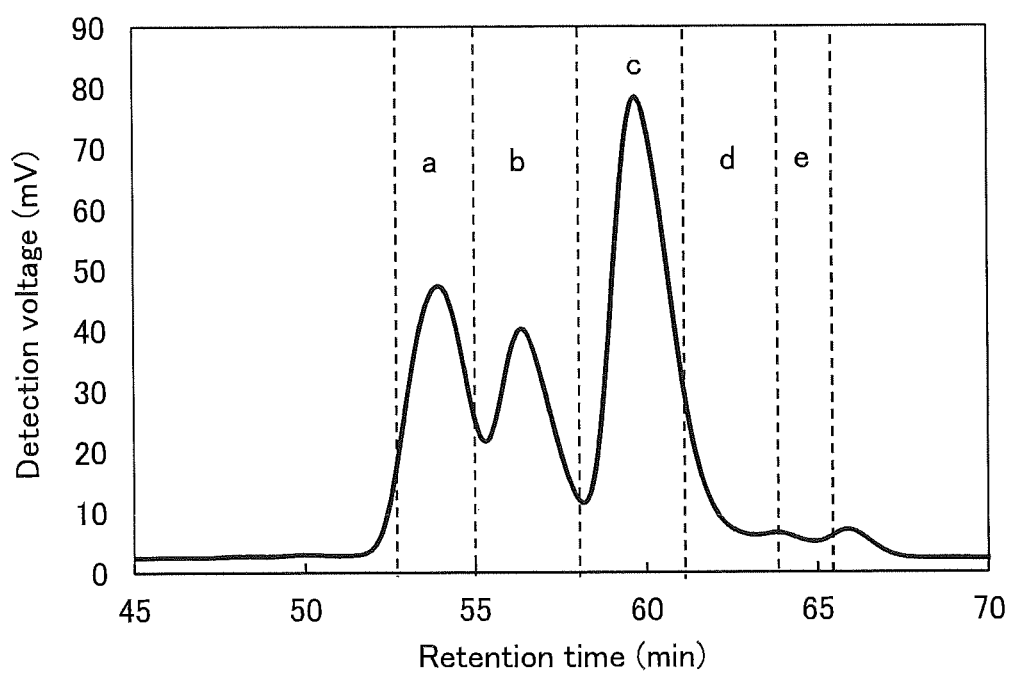
FIG. 19 is a graph explaining a chromatogram of LC in Example.

Then, the mixed solution was separated by liquid chromatography ((S5) in FIG. 3). The separation was performed by HPLC. As the device, recycling preparative HPLC (LC-9130NEXT) manufactured by Japan Analytical Industry Co., Ltd., was used. FIG. 19 shows a chromatogram obtained with a UV detector (observation wavelength: 254 nm) by the HPLC analysis.

Regions a to e shown in FIG. 19 were taken out to different containers ((S7) in FIG. 3).

Figure 20A:
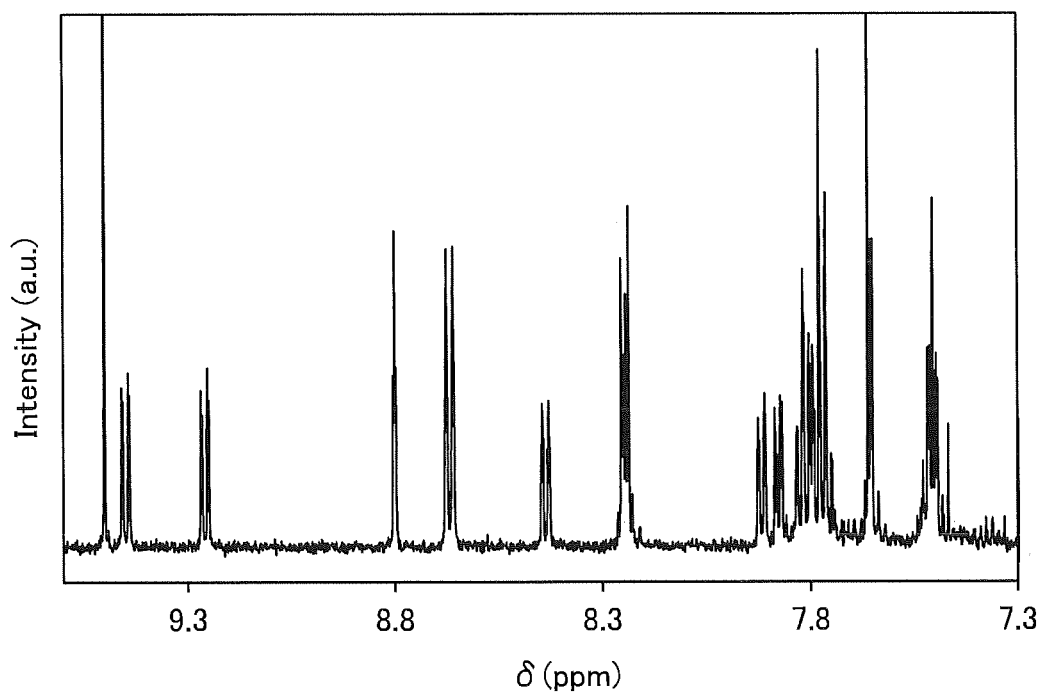
FIGS. 20*a* and 20*b* are graphs explaining NMR spectra of organic compounds in Example.

Subsequently, $^1$H-NMR measurement was performed in order to perform detailed analysis on an organic compound included in the region c with the largest peak in FIG. 19. FIG. 20(a) shows the results. In addition, FIG. 20(b) shows an $^1$H-NMR spectrum of 2mDBTPDBq-II, which was used for fabrication of the light-emitting element 1, before the evaporation.

Figure 20B:
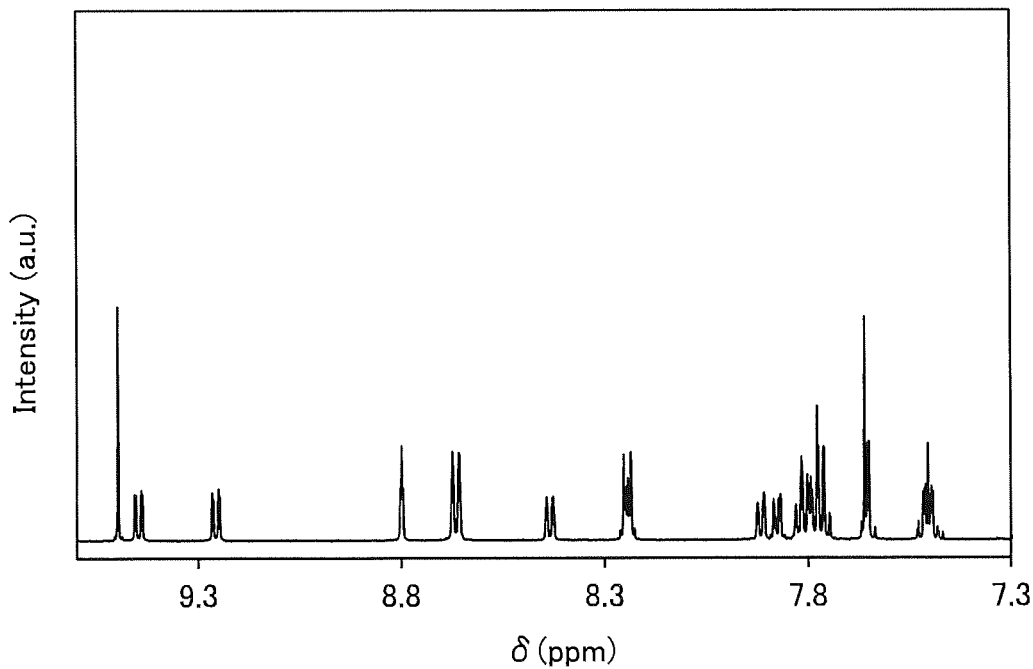

When FIG. 20(a) and FIG. 20(b) are compared, it can be found that they have substantially the same spectra. That is, the organic compound included in the region c in FIG. 19 is identified as 2mDBTPDBq-II. FIG. 20(a) shows the state of 2mDBTPDBq-II after the evaporation and FIG. 20(b) shows the state of 2mDBTPDBq-II before the evaporation. There is little change between FIG. 20(a) and FIG. 20(b); accordingly, it was found that 2mDBTPDBq-II is an organic compound with high pressure resistance and high heat resistance, which does not generate decomposition or degradation when being heated or in a vacuum for the evaporation and thus can be suitably used in vacuum evaporation.

As described above, by the analysis method of one embodiment of the present invention, organic compounds included in a light-emitting element can be analyzed. Furthermore, heat resistance and pressure resistance of the organic compound can be evaluated.

Example 2

In this example, an analysis example of an analysis method of one embodiment of the present invention will be described. In this example, an analysis example of a light-emitting element, which has an unknown OLED element structure and which is used for a smartphone with a 5.5-inch screen size manufactured by Company A, is described below. The light-emitting element used for the smartphone manufactured by Company A is referred to as a light-emitting element 2 below.

<GCIB-TOF-SIMS Analysis of Light-Emitting Element>

Another analysis revealed that the light-emitting element 2 includes a red (R) pixel, a green (G) pixel, and a blue (B) pixel. Thus, the GCIB-TOF-SIMS analysis was performed on each pixel ((S1) to (S3) in FIG. 3).

First, as in Example 1, a substrate over which the light-emitting element 2 was not formed was separated ((S1) in FIG. 3).

Next, an exposed electrode was separated with use of an adhesive tape ((S2) in FIG. 3).

Then, GCIB-TOF-SIMS analysis was performed on each of the R, G, and B pixels using Ar-GCIB (S2). Table 2 to Table 4 show the results. Table 2, Table 3, and Table 4 show the analysis results of the R pixel, the G pixel, and the B pixel, respectively. According to Table 2 to Table 4, in the light-emitting element 2, each of the R and B pixels has a stacked-layer structure of five organic compound-containing layers and the G pixel has a stacked-layer structure of six organic compound-containing layers. In Table 2 to Table 4, for convenience, layers are called A layer, B layer to E layer or F layer in the order the mass-to-charge ratio was detected.

TABLE 2

| Layer | Detected mass-to-charge ratio (m/z) R pixel |
|---|---|
| A layer | 158, 742 |
| B layer | 613, 769 (Ir) |
| C layer | 638 |
| D layer | 678 |
| E layer | 672 |
| Electrode | ITO |

TABLE 3

| Layer | Detected mass-to-charge ratio (m/z) G pixel |
|---|---|
| A layer | 158, 742 |
| B layer | 612, 636, 782 Ir |
| C layer | 675 (678) |
| D layer | 672 (678) |
| E layer | 678 |
| F layer | 672 |
| Electrode | ITO |

TABLE 4

| Layer | Detected mass-to-charge ratio (m/z) B pixel |
|---|---|
| A layer | 158, 742 |
| B layer | 470, 1056 |
| C layer | 729 |
| D layer | 678 |
| E layer | 672 |
| Electrode | ITO |

A separation surface of the separated electrode on the organic layer side was subjected to GCIB-TOF-SIMS analysis; as a result, few organic compounds were detected. Thus, it was found that only the electrode was separated at the step S2 and a layer formed of organic compounds remained on the substrate side. By the ToF-SIMS analysis of the electrode, Li, Mg, Ag, and Yb were detected.

It was also found that ITO was used for an electrode that is not separated.

According to Table 2 to Table 4, it can be presumed that the same organic compound was used for the D layers of the R pixel and the B pixel and the F layer of the E pixel; the same organic compound was used for the D layers of the R pixel and the B pixel and the E layer of the G pixel; and the A layer of the R pixel uses the organic compounds identical with those used in the A layer of each of the G and B pixels.

In the B layer of the R pixel, an isotope peak of a spectrum detected around m/z=769 was analyzed, and it was found that an organic compound detected around m/z=769 includes Ir. The R pixel has a function of emitting red light, and thus the organic compound is presumed to be a red phosphorescent material. Therefore, the B layer is presumably a light-emitting layer in the R pixel. Similarly, an organic compound detected around m/z=613 from the B layer is presumably a host material.

In the B layer of the G pixel, as in the R pixel, an isotope peak of a spectrum detected around m/z=782 was analyzed, and it was found that an organic compound detected around m/z=782 includes Ir. The G pixel has a function of emitting green light, and thus the organic compound is presumed to be a green phosphorescent material. Therefore, the B layer is presumably a light-emitting layer in the G pixel. Similarly, organic compounds detected around m/z=612 and around m/z=636 from the B layer are presumably host materials.

In the case where a plurality of organic compounds are detected from the same layer, the layer may be a light-emitting layer. In the light-emitting element 2, m/z of two kinds of organic compounds were detected from the A layer of each pixel. However, as described above, the B layers of the R and G pixels are presumably light-emitting layers. In addition, the A layer is a layer in contact with the electrode. It is known that when a light-emitting layer adjoins an electrode, adverse effects on light-emitting element characteristics, such as quenching or plasmon absorption, are caused. Therefore, the A layer in each layer is presumably not a light-emitting layer. Accordingly, also in the B pixel, it is presumed that the B layer from which m/z of two kinds of organic compounds are detected is a light-emitting layer.

As described above, the number of kinds of organic compounds included in the layers, elements included in the organic compound, and the positional relation of the layers can be determined by the GCIB-TOF-SIMS analysis.

<Isolation of Organic Compound Used in Light-Emitting Element>

Next, an organic compound used in the light-emitting element 2 was isolated ((S4) to (S7) in FIG. 3).

The EL layer of the sample subjected to TOF-SIMS measurement was dissolved using chloroform. An unwanted substance was removed by filtration, so that a mixed solution was formed ((S4) in FIG. 3). The above-described GCIB-TOF-SIMS measurement identifies which layer includes which organic compound; therefore, in this step, the organic compounds included in all the R, G, and B pixels can be dissolved at the same time, not pixel by pixel. That is, by performing the GCIB-TOF-SIMS measurement, this step can be easily performed.

Figure 21A:
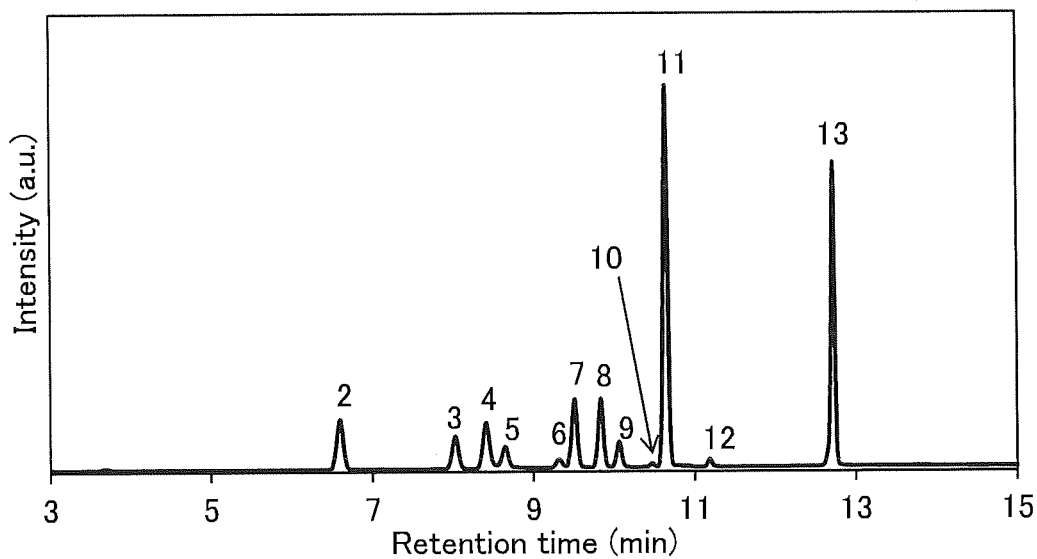
FIGS. 21a and 21b are graphs explaining a chromatogram of LC in Example.
Figure 21B:
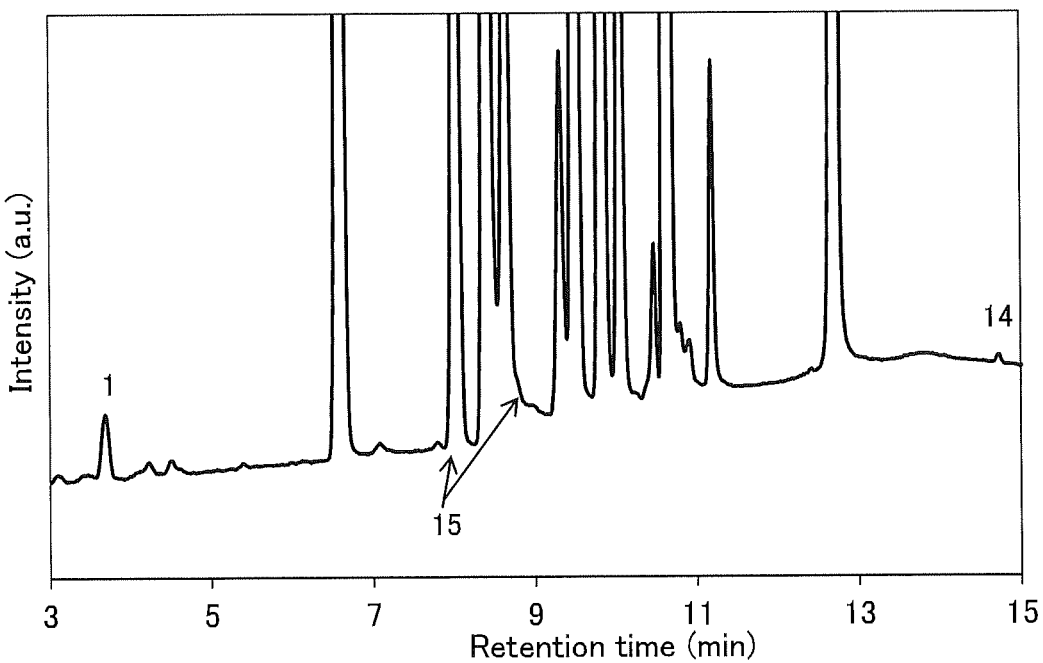

The prepared mixed solution was put into the LC-MS device and the organic compounds in the mixed solution were separated in the LC portion. In the LC-MS device, UltiMate 3000 manufactured by Thermo Fisher Scientific K.K. was used for the LC portion, and Q Exactive manufactured by Thermo Fisher Scientific K.K. was used for the MS portion. FIG. 21 shows a chromatogram obtained with the UV detector (observation wavelength: 254 nm) by the LC analysis. FIG. 21(b) is an enlarged view of FIG. 21(a). In FIG. 21, 15 kinds of peaks were observed.

<Identification of Organic Compound Detected at m/z=613>

A method of identifying the structure of an organic compound detected around m/z=613 from the B layer of the R pixel shown in Table 2 will be described below. The organic compound is described as an organic compound 613 below.

Figure 22:
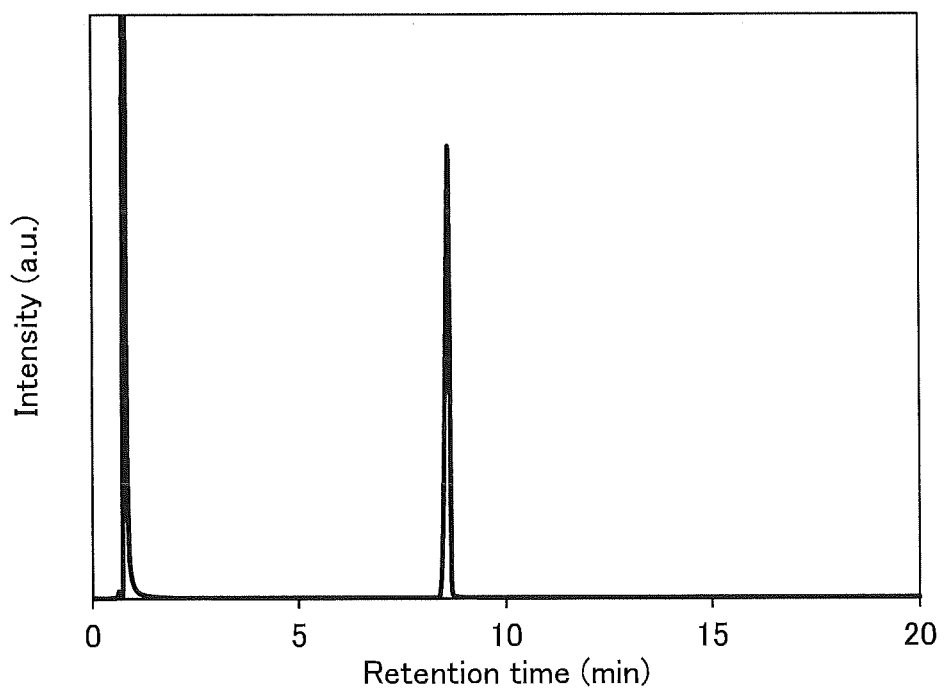
FIG. 22 is a graph explaining a chromatogram of LC in Example.

As the result of LC-MS analysis ((S6) in FIG. 3), m/z=613.2380 was detected from a peak 4 shown in FIG. 21. Thus, rough division was performed on the peak 4 by HPLC, and fractionation (S7) was performed with an LC-MS fraction collector, whereby the organic compound 613 was obtained. FIG. 22 shows a chromatogram of a solution including around m/z=613 after the fractionated organic compound 613 was extracted, which was measured with the UV detector (observation wavelength: 254 nm). FIG. 22 shows that the organic compound 613 was able to be isolated with high purity.

Figure 23A:
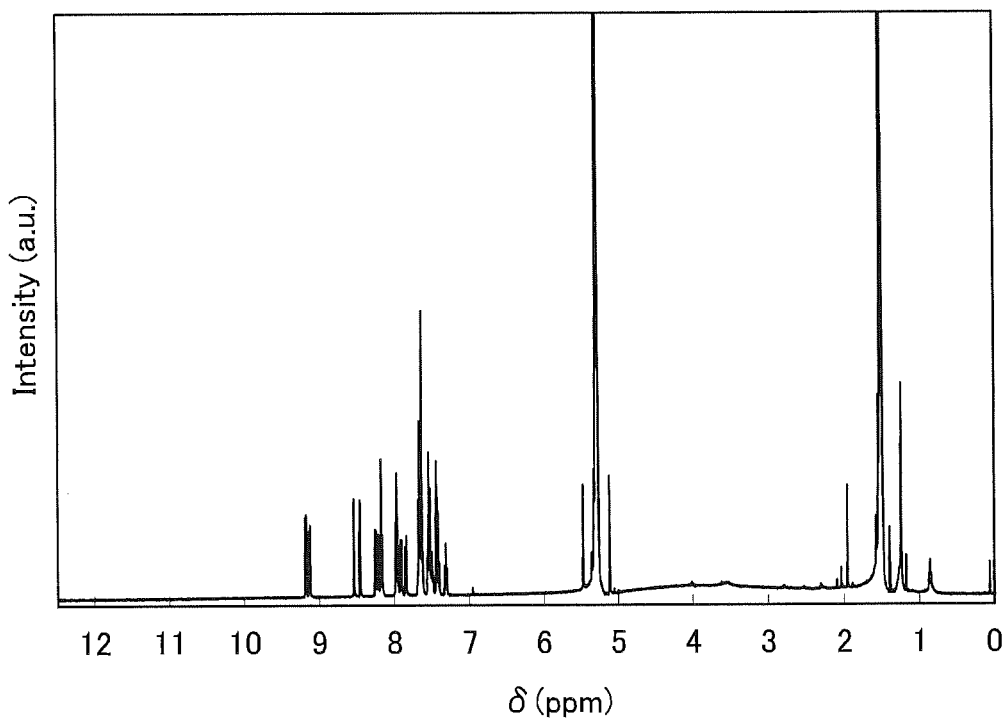
FIGS. 23a and 23b are graphs explaining NMR spectra of organic compounds in Example.
Figure 24A:
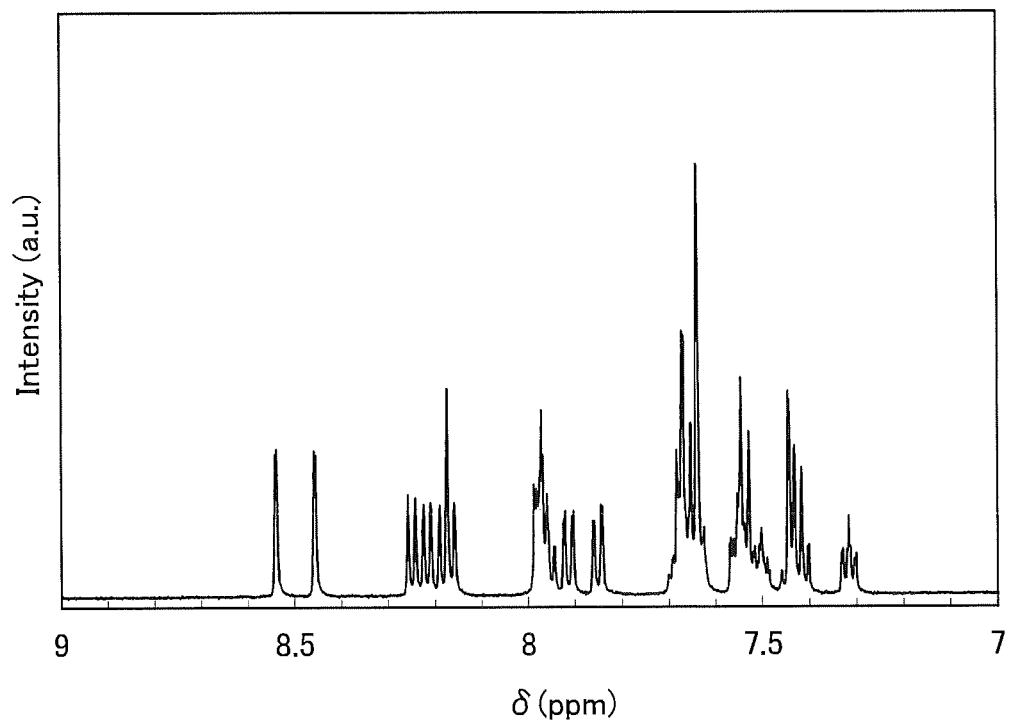
FIGS. 24a and 24b are graphs explaining NMR spectra of organic compounds in Example.
Figure 24B:
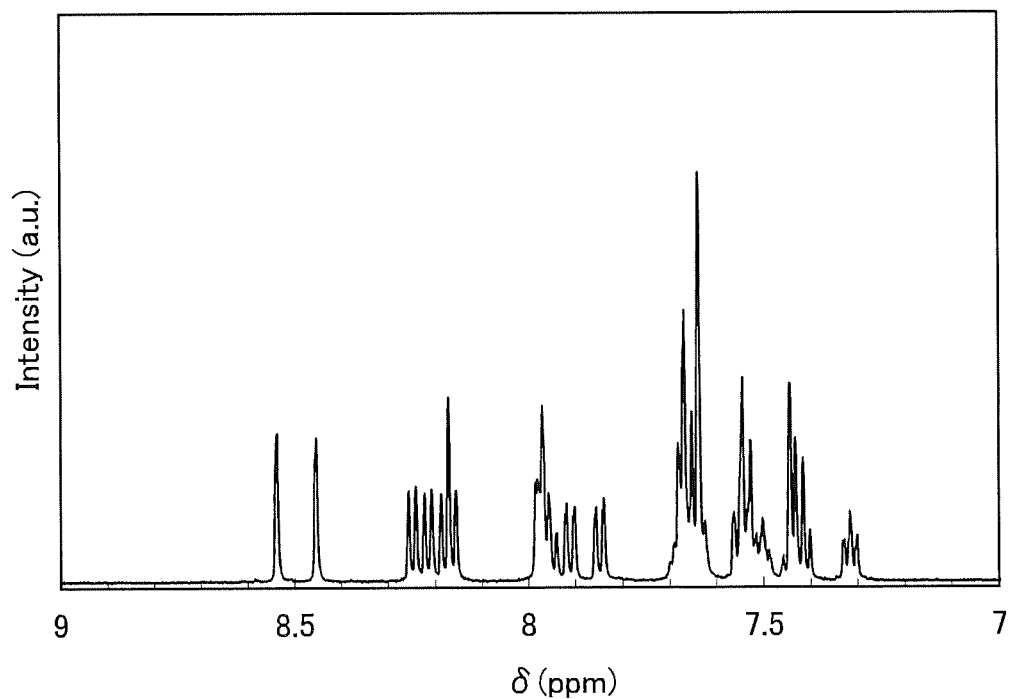
Figure 25A:
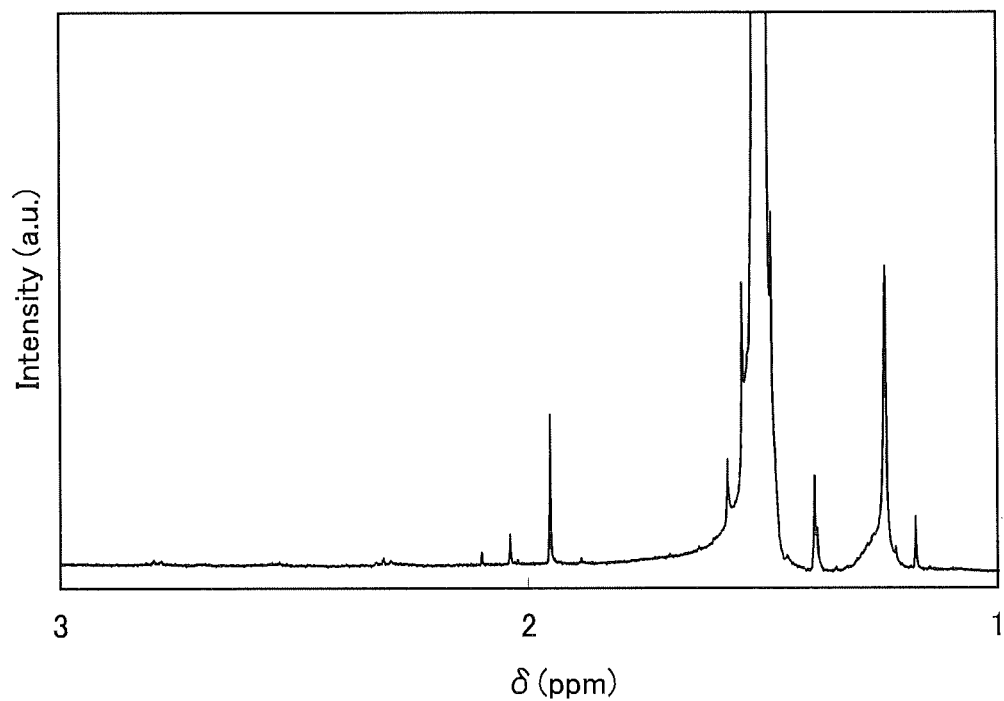
FIGS. 25a and 25b are graphs explaining NMR spectra of organic compounds in Example.

Next, $^1$H-NMR measurement was performed to analyze the structure of the organic compound 613. FIG. 23(a) to FIG. 25(a) show the results. FIG. 24(a) is an enlarged view of 7 ppm to 9 ppm in FIG. 23(a), and FIG. 25(a) is an enlarged view of 1 ppm to 3 ppm in FIG. 23(a).

Figure 23B:
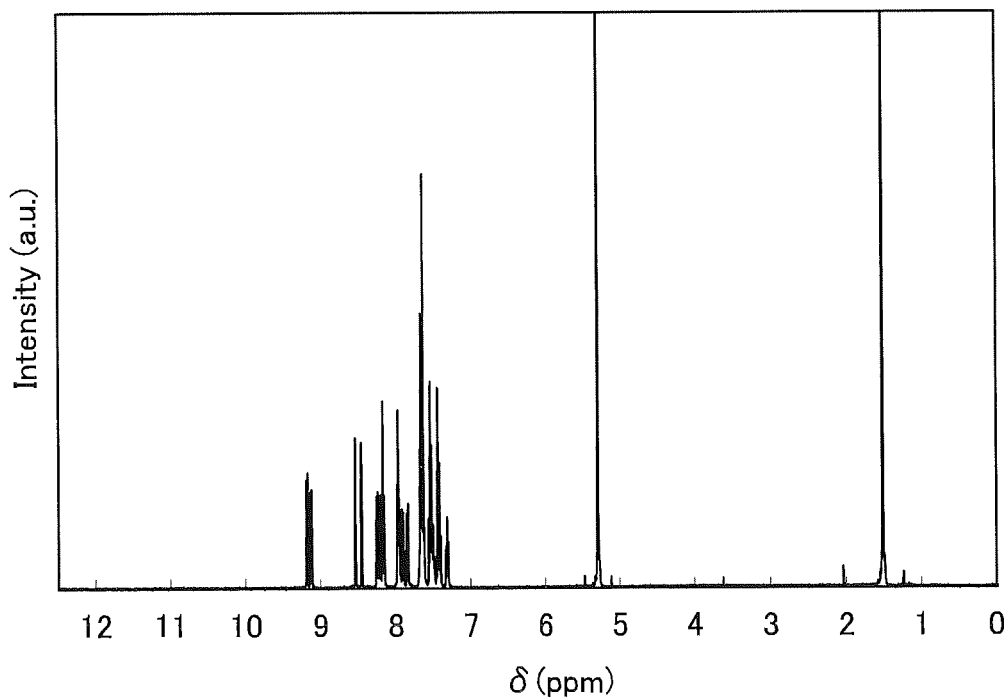
Figure 25B:
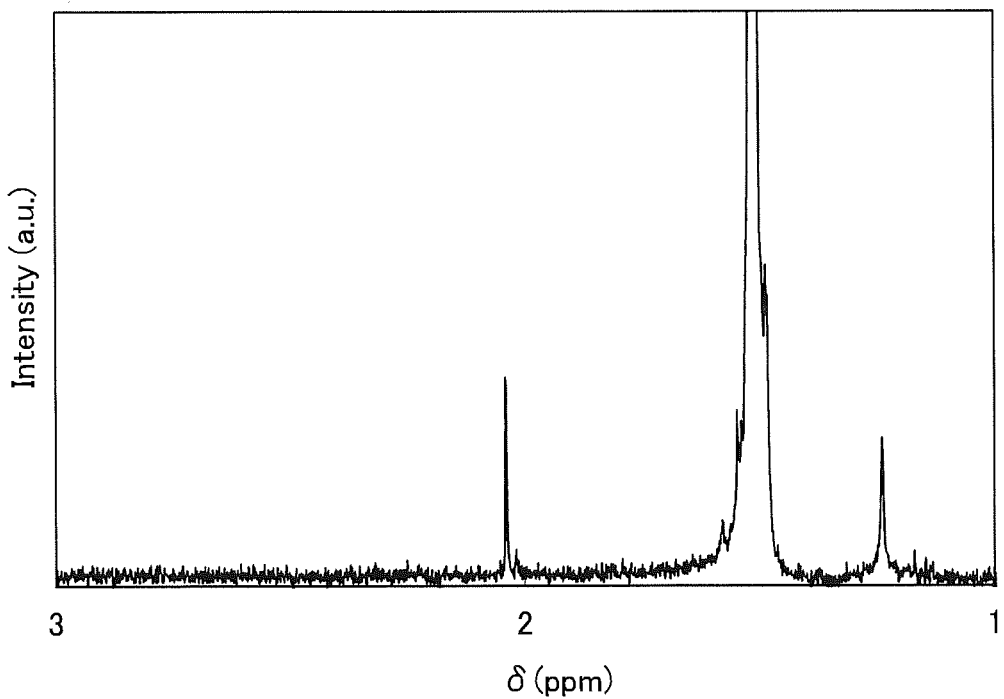

The compositional formula was obtained from m/z=613.2380 obtained by the above LC-MS measurement, and the molecular structure of the organic compound 613 was presumed from the compositional formula and FIG. 23(*a*) to FIG. 25(*a*). The structure of the organic compound presumed by CAS is shown below. The organic compound was presumed to be 9-phenyl-9'-(4-phenyl-2-quinazolinyl)-3,3'-bi-9H-carbazole (abbreviation: PCCzQz) shown below.

[Chemical 3]

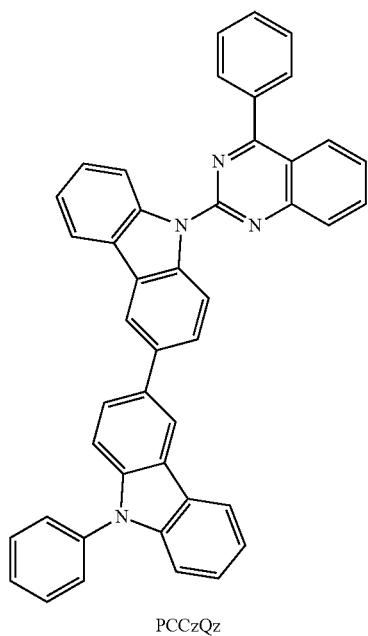

PCCzQz

Next, PCCzQz was synthesized ((S11) in FIG. 4). Patent Document 2 was referred to for the synthesis path and the synthesis method.

The ¹H-NMR spectrum of the synthesized PCCzQz was measured. FIG. 23(*b*) to FIG. 25(*b*) show the results. FIG. 24(*b*) is an enlarged view of 7 ppm to 9 ppm in FIG. 23(*b*), and FIG. 25(*b*) is an enlarged view of 1 ppm to 3 ppm in FIG. 23(*b*).

According to FIG. 23 to FIG. 25, the ¹H-NMR spectrum of the organic compound 613 and the ¹H-NMR spectrum of PCCzQz substantially coincide with each other. Therefore, the organic compound 613 was identified as PCCzQz. That is, it was found that the R pixel of the light-emitting element 2 includes PCCzQz.

<Analysis 1 of Light Emission Mechanism in R Pixel>

A method of analyzing the light emission mechanism of the B layer of the R pixel shown in Table 2 will be described below. As described above, the B layer of the R pixel is presumed to be a light-emitting layer, the organic compound 613 included in the layer is presumed to be a host material, and the organic compound detected around m/z=769 is an organic compound including Ir and thus is presumed to be a guest material. The organic compound detected around m/z=769 is described as an organic compound 769 below.

Figure 26:
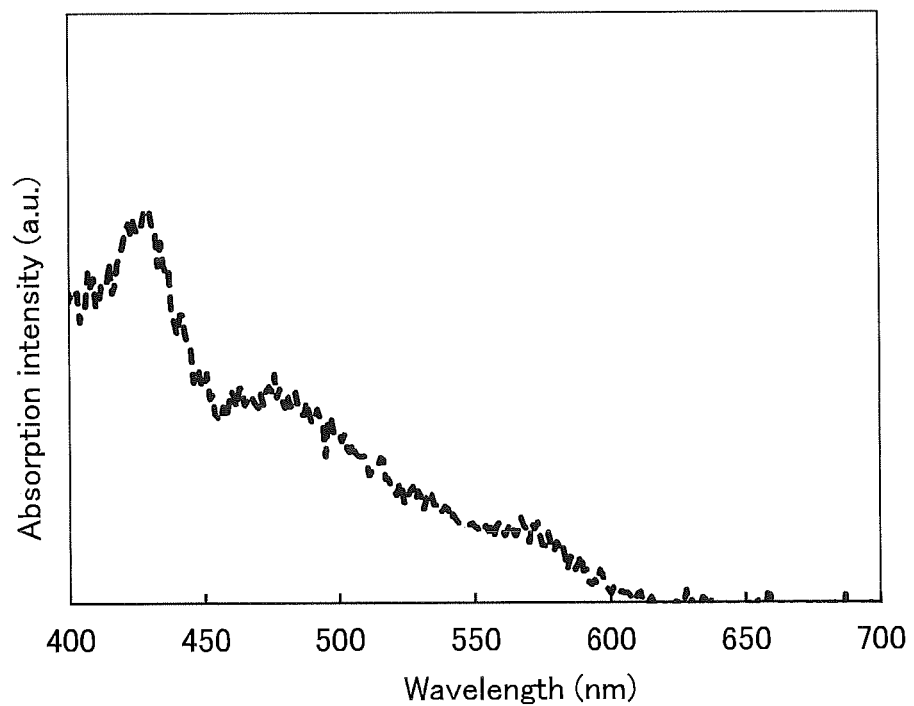
FIG. 26 is a graph explaining an absorption spectrum of an organic compound in Example.

As in the fractionation of the organic compound 613, as the results of LC-MS analysis ((S6) in FIG. 3), m/z=769.31 was detected from a peak 15 shown in FIG. 21. Thus, the separation conditions for the part of the peak 15 were re-examined and separation was performed. After the separation, in a chromatogram obtained with the IJV detector (observation wavelength: 254 nm), the absorption spectrum including the organic compound 769 in the retention time was measured with UltiMate 3000 manufactured by Thermo Fisher Scientific K.K. ((S6) in FIG. 3). The measured absorption spectrum is an absorption spectrum in a mixed solution with a ratio of acetonitrile: water=95:5. FIG. 26 shows the results.

Figure 27:
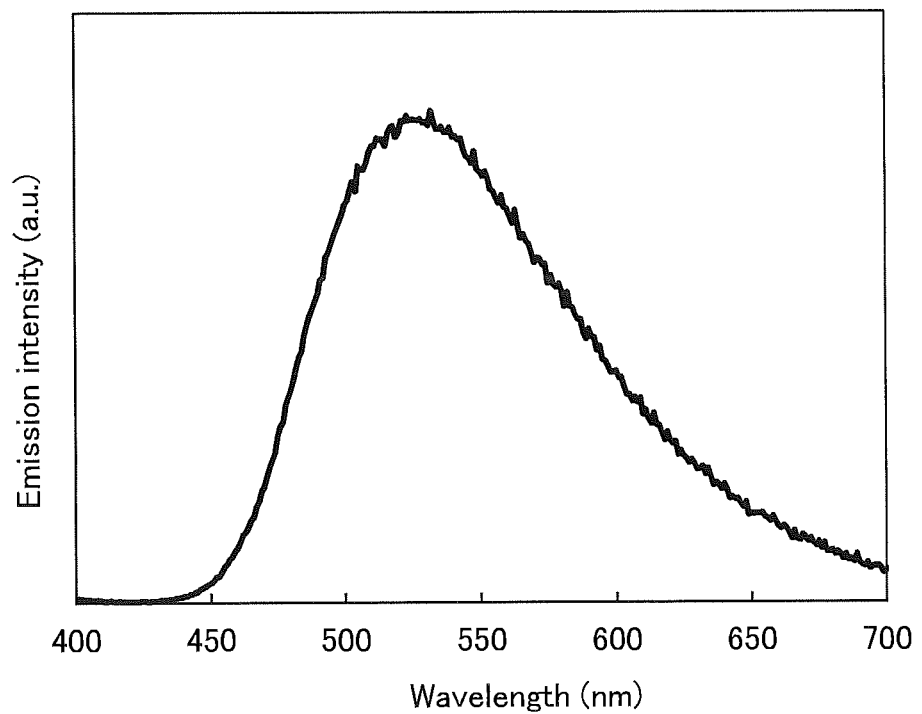
FIG. 27 is a graph explaining an absorption spectrum of an organic compound in Example.

Next, the light emission spectrum of the organic compound 613 was measured. A solid thin film was formed over a quartz substrate by a vacuum evaporation method. For the measurement of the light emission spectrum, a fluorophotometer (FS920 manufactured by Hamamatsu Photonics K.K.) was used. FIG. 27 shows the results.

Figure 28:
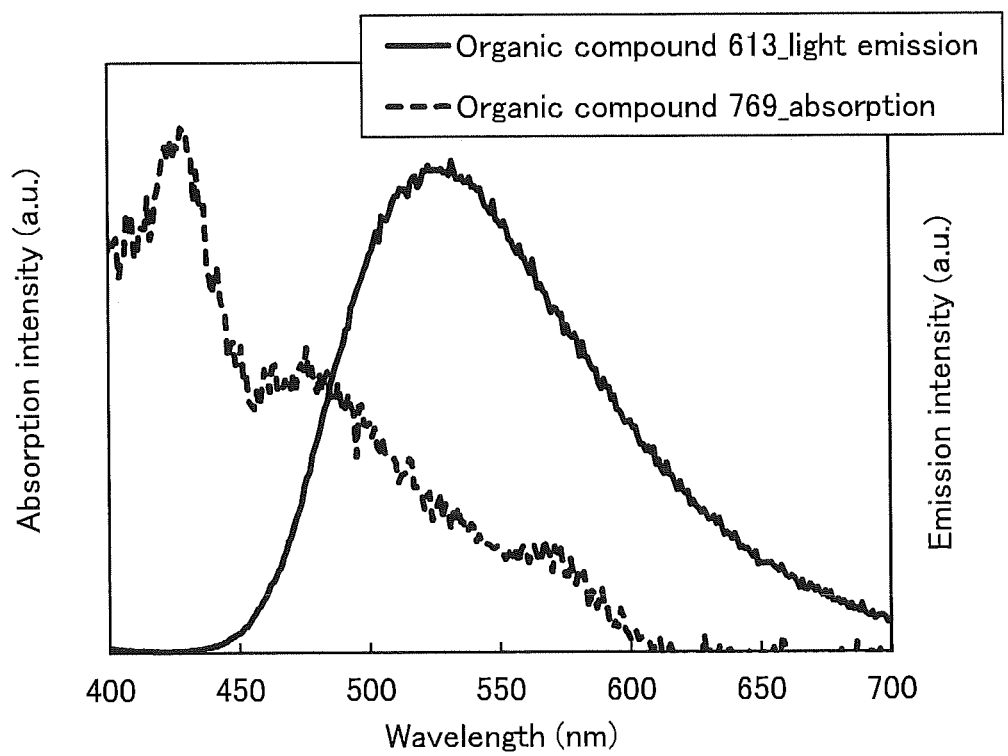
FIG. 28 is a graph explaining relations between an absorption spectrum and a light emission spectrum of an organic compound in Example.

FIG. 28 shows a graph obtained by superposing the absorption spectrum shown in FIG. 26 and the light emission spectrum shown in FIG. 27. From FIG. 28, it is found that the longest-wavelength-side absorption band (supposed to be MLCT absorption) of the organic compound 769, which is presumed to be a guest material, overlaps with the light emission spectrum of the organic compound 613. This suggests that in the R pixel of the light-emitting element 2, the energy of the organic compound 613 transfers to the organic compound 769, so that the organic compound 769 emits light.

<Analysis 2 of Light Emission Mechanism in R Pixel>

The analysis of an organic compound of the R pixel shown in Table 2, which is different from the above-described one, will be described below. The relation between the B layer, which is presumed to be a light-emitting layer in the R pixel as described above, and the adjacent C layer was analyzed.

First, the organic compound detected around m/z=638 from the C layer of the R pixel that is shown in Table 2 was isolated and obtained. The organic compound detected around m/z=638 is described as an organic compound 638 below.

As in the fractionation of the organic compound 613, as the result of LC-MS analysis ((S6) in FIG. 3), a peak was detected around m/z=638 from a peak 7 shown in FIG. 21; accordingly, a peak 7 part was fractionated; whereby the organic compound 638 was obtained.

Next, the light emission spectrum of the organic compound 638 in a thin film was measured. A solid thin film was formed over a quartz substrate by a vacuum evaporation method. The absorption spectrum of the thin film was measured with a spectrophotometer (U-4100 Spectrophotometer, manufactured by Hitachi High-Technologies Corporation).

Figure 29:
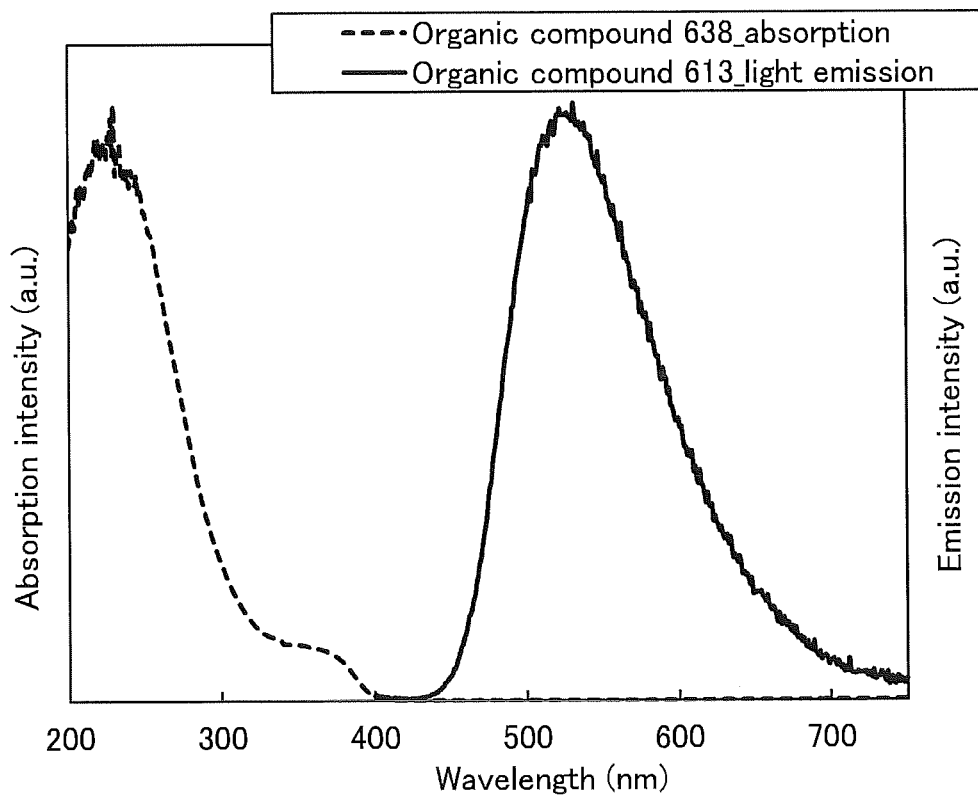
FIG. 29 is a graph explaining relations between an absorption spectrum and a light emission spectrum of an organic compound in Example.

FIG. 29 shows a graph obtained by superposing the measured absorption spectrum of the organic compound 638 and the light emission spectrum of the organic compound 613 shown in FIG. 27. FIG. 29 shows that the absorption spectrum of the organic compound 638 and the light emission spectrum of the organic compound 613 do not have an overlap. That is, it is found that the energy of the organic compound 613 is less likely to transfer to the organic compound 638. This implies that the C layer has a function of an exciton-blocking layer with respect to the B layer that is presumed to be a light-emitting layer.

<Measurement of Light Emission Lifetime of Organic Compound 613>

The light emission lifetime of the organic compound 613 detected from the B layer of the R pixel was measured. A picosecond fluorescence lifetime measurement system (manufactured by Hamamatsu Photonics K.K.) was used for the measurement. For the measurement, a thin film of the organic compound 613 was used and deposited on a quartz substrate by vacuum evaporation to a thickness of 30 nm.

Note that for the formation of the thin film, the organic compound 613 fractionated from the light-emitting element 2 was used. In this measurement, in order to measure the lifetime of fluorescence emitted from the thin film, the thin film was irradiated with pulsed laser, and light emission of the thin film which attenuated from the laser irradiation underwent time-resolved measurement using a streak camera. A nitrogen gas laser with a wavelength of 337 nm was used as the pulsed laser, and the thin film was irradiated with the pulsed laser with a pulse width of 500 ps at a frequency of 10 Hz. By integrating data obtained by repeated measurements, data with a high S/N ratio was obtained. The measurement was performed at room temperature (in an atmosphere kept at 23° C.).

Figure 30:
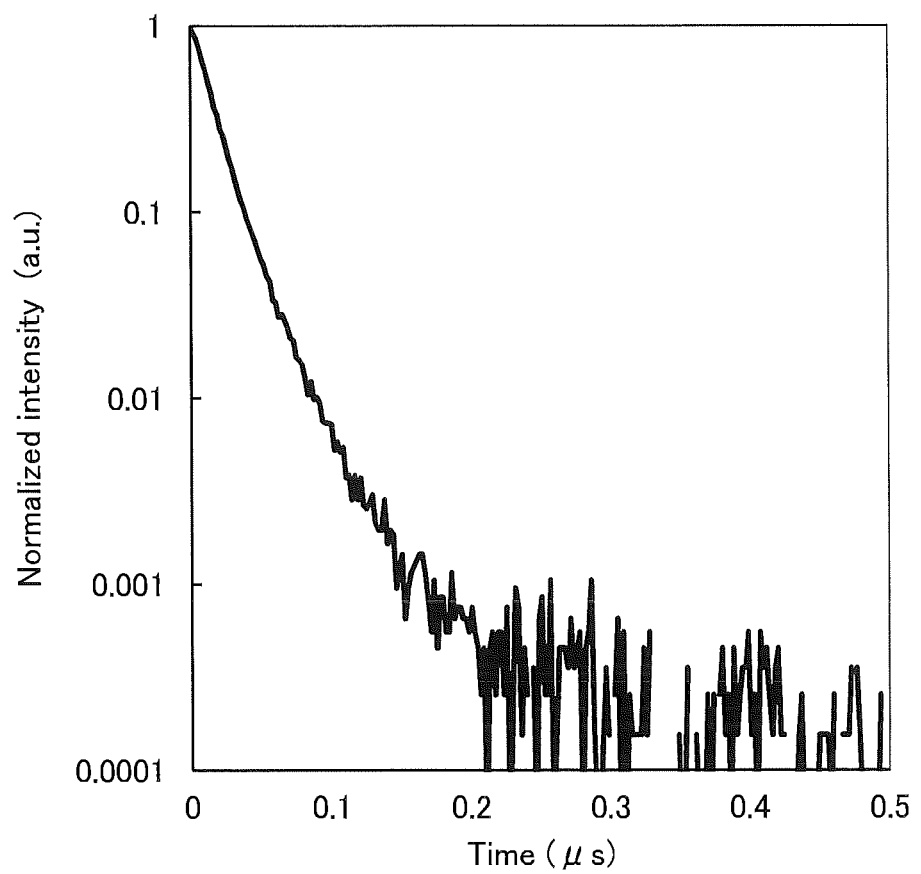
FIG. 30 is a graph explaining light emission lifetime characteristics of an organic compound in Example.

FIG. 30 shows the measurement results. As shown in FIG. 30, light emission lifetime characteristics with little noise can be measured using the organic compound fractionated from the light-emitting element 2.

<Measurement of Triplet Excited (T1) Level of Organic Compound 613>

The phosphorescence spectrum of the organic compound 613 detected from the B layer of the R pixel was measured to obtain the T1 level. For the measurement, the thin film used for the above-described light emission lifetime measurement and a PL microscope LabRAM HR-PL (HORIBA, Ltd.) were used, the measurement temperature was 10 K, a He—Cd laser (325 nm) was used as excitation light, and a CCD detector was used as a detector.

Figure 31:
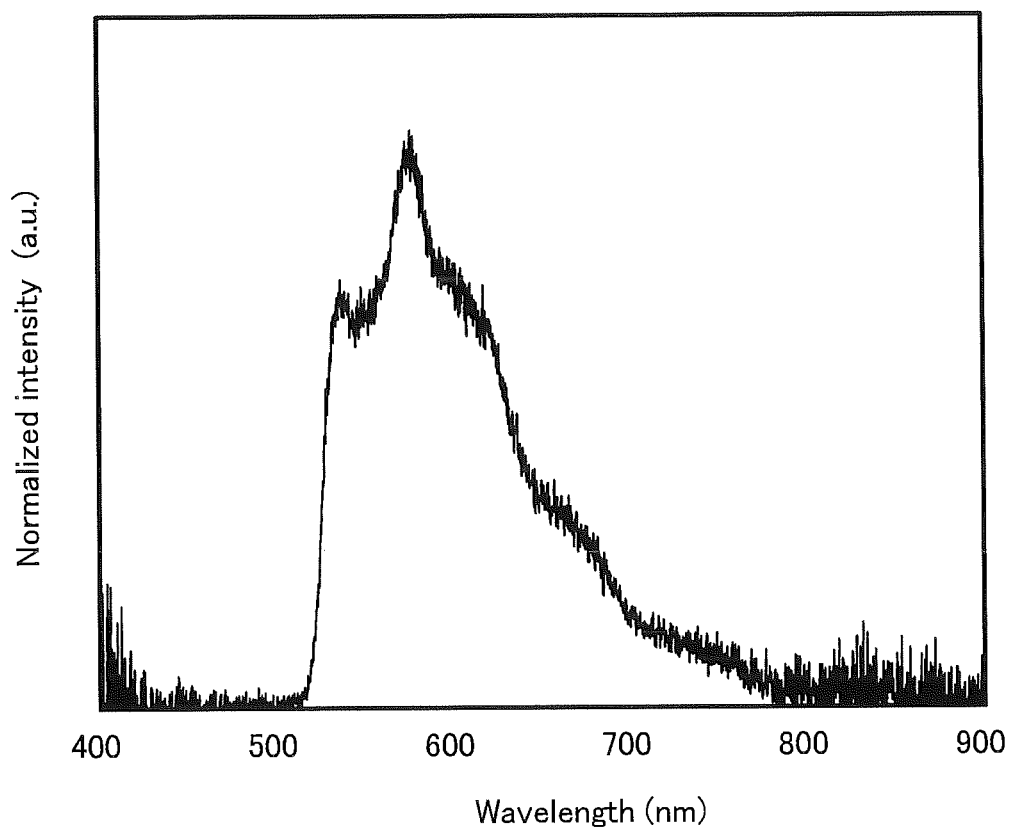
FIG. 31 is a graph explaining a phosphorescence spectrum of an organic compound in Example.

FIG. 31 shows the above-described measurement results. As shown in FIG. 31, phosphorescence spectrum with little noise can be measured using the organic compound fractionated from the light-emitting element 2. As shown in FIG. 31, a first peak of this phosphorescence on the short wavelength side is 536 nm; thus, the T1 level of the organic compound 613 was calculated to be 2.31 eV.

<Analysis of Light Emission Mechanism in G Pixel>

A method of analyzing the light emission mechanism of the B layer of the G pixel shown in Table 3 will be described below. As described above, the organic compound which is included in the B layer of the G pixel and from which m/z=782 is detected is an organic compound including Ir and is presumed to be a guest material, and the organic compounds detected at m/z=612 and 636 are presumed to be host materials. The organic compounds detected at m/z=782, 612, and 636 are described below as an organic compound 782, an organic compound 612, and an organic compound 636, respectively.

As shown in FIG. 21, m/z=783.30 was detected from a peak 1, m/z=612.24 was detected from a peak 6, and m/z=636.25 was detected from a peak 8. Thus, as in the isolation of the organic compound 613, rough division was performed on the vicinity of each peak, and fractionation (S7) was performed with an LC-MS fraction collector, whereby the organic compound 782, the organic compound 612, and the organic compound 636 were obtained. Note that the mass-to-charge ratio corresponding to the organic compound 782 is m/z=783.30, which is a value larger than the value measured by TOF-SIMS by 1. This is probably because of ionization by addition of protons in the LC-MS measurement; accordingly, the organic compound detected as m/z=782 in Table 3 is identical with an organic compound derived from an ion detected as m/z=783.30 by LC-MS measurement.

Figure 32:
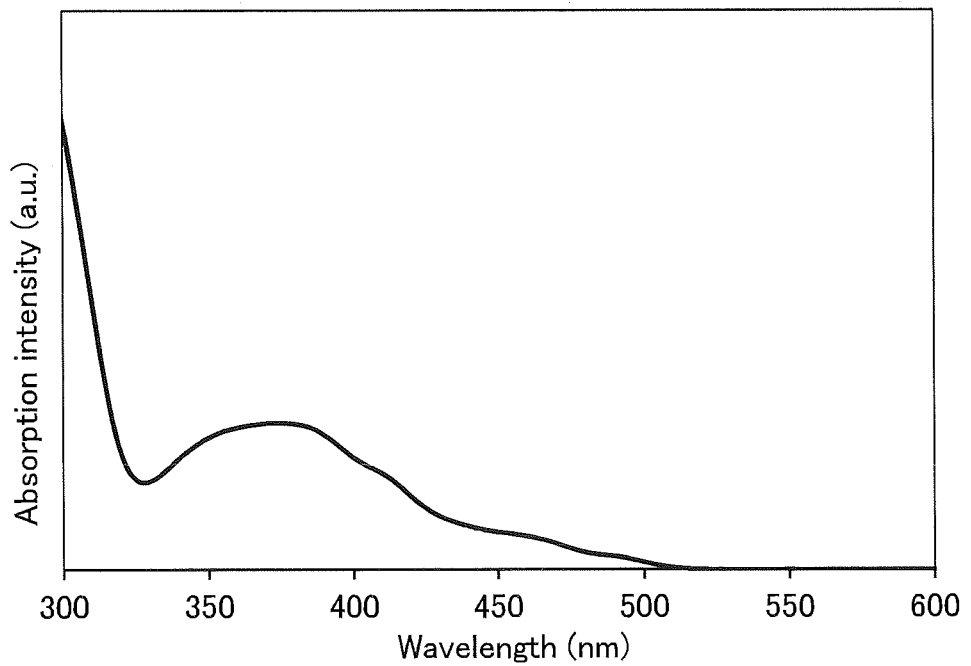
FIG. 32 is a graph explaining an absorption spectrum of an organic compound in Example.

The absorption spectrum of the isolated organic compound 782 in a toluene solution was measured. FIG. 32 shows the results. For the measurement of the absorption spectrum of the toluene solution, an ultraviolet-visible light spectrophotometer (V550, manufactured by JASCO Corporation) was used, and the spectrum of toluene alone in a quartz cell was subtracted.

Figure 33:
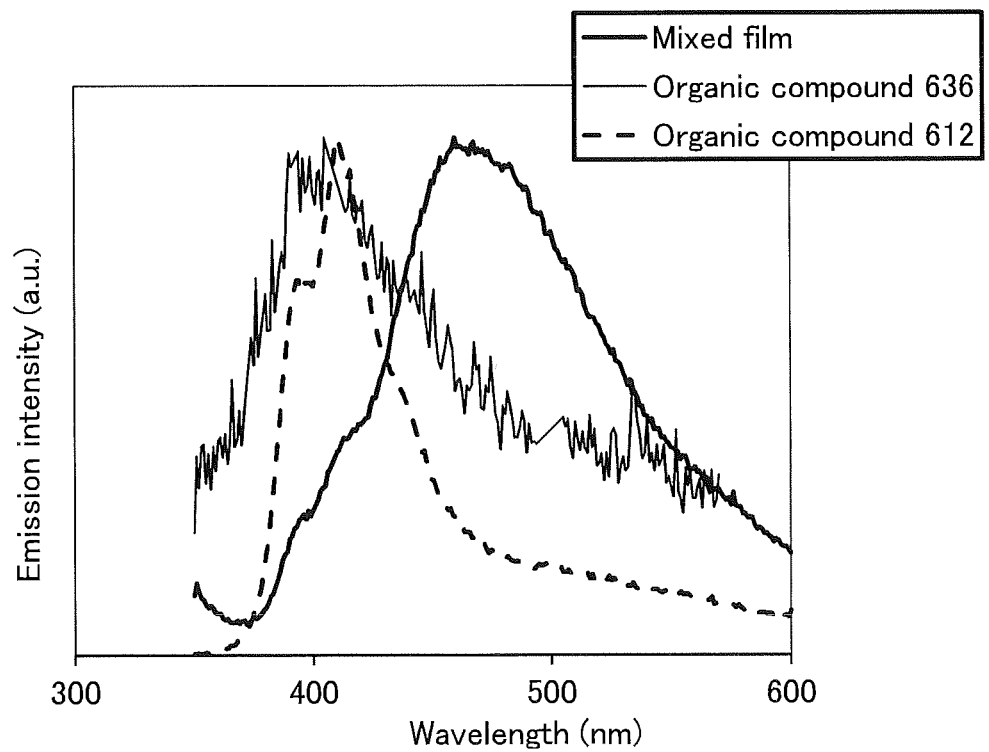
FIG. 33 is a graph explaining light emission spectra of an organic compound and a mixed film in Example.

Next, the light emission spectra of thin films of the organic compound 612 and the organic compound 636 were measured. The thin films were formed by dropping a toluene solution of each of the organic compounds onto a substrate, and evaporating the solvent. For the measurement of the light emission spectra, the above-described fluorophotometer was used. FIG. 33 shows the results.

A mixed film of the organic compound 612 and the organic compound 636 was formed, and the light emission spectrum thereof was measured. The mixed film was formed by mixing a toluene solution of the organic compound 612 and a toluene solution of the organic compound 636, dropping the mixture onto the same substrate, and evaporating the solvent. For the measurement of the light emission spectrum, the above-described fluorophotometer was used. FIG. 33 also shows the results.

Here, it is found from FIG. 33 that the light emission spectrum of the mixed film of the organic compound 612 and the organic compound 636 has a peak on a longer wavelength side than the light emission spectrum of each of the organic compounds. That is, it is found that the mixed film of the organic compound 612 and the organic compound 636 forms an exciplex.

Figure 34:
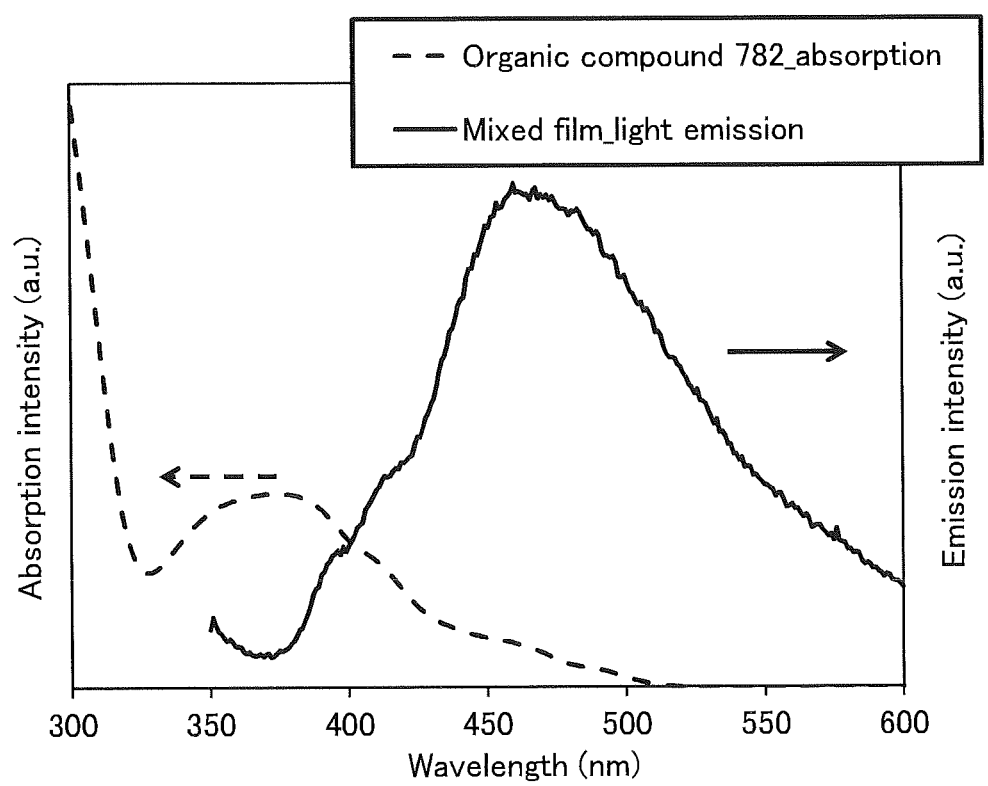
FIG. 34 is a graph explaining relations between an absorption spectrum of an organic compound and a light emission spectrum of a mixed film.

Next, an overlap between the absorption spectrum of the organic compound 782 in a toluene solution and the light emission spectrum of the mixed film of the organic compound 612 and the organic compound 636 was analyzed. FIG. 34 shows the results. From FIG. 34, it is found that light emission from the mixed film of the organic compound 612 and the organic compound 636, that is, light emission from the exciplex formed by the organic compound 612 and the organic compound 636 overlaps with the longest-wavelength-side absorption band (supposed to be MLCT absorption) of the organic compound 782, which is presumed to be a guest material. This indicates that in the G pixel of the light-emitting element 2, the energy of the exciplex formed by the organic compound 612 and the organic compound 636 transfers to the organic compound 782, so that the organic compound 782 emits light. In other words, it is indicated that ExTET occurs in the G pixel of the light-emitting element 2.

As described above, by the analysis method of the present invention, the organic compounds in the light-emitting element can be analyzed. It was also found that with use of the organic compounds in the light-emitting element, the molecular structures and various physical properties of the organic compounds can be measured.

Example 3 hi this example, an analysis example of an analysis method of one embodiment of the present invention will be described. In this example, described below is an example of analyzing a light-emitting element which is used for a smartphone manufactured by Company A and which uses an OLED device with an unknown structure. A light-emitting element used in this example is described as a light-emitting element 3 below.

First, as in Example 1 and Example 2, a substrate over which the light-emitting element 3 was not formed was separated ((S1) in FIG. 3). At this time, one of the electrodes was also separated together with the separated substrate. That is, the electrode was attached to the separated substrate.

Next, the electrode attached to the substrate was separated with use of an adhesive tape, whereby the electrode on the substrate side was exposed.

<TOF-SIMS Analysis of Light-Emitting Element>

Next, TOF-SIMS analysis was performed on the electrode on the substrate side ((S26) in FIG. 36). As a result, peaks were observed at m/z=483, 661, 803, and 818.

<Isolation of Organic Compound Used in Organic Layer of Electrode on Substrate Side>

Next, an organic compound used in the light-emitting element 2 was isolated ((S4) to (S7) in FIG. 36).

The sample of the separated electrode was dissolved using deuterated chloroform. Then, an unwanted substance was removed by filtration, so that a mixed solution was formed ((S4) in FIG. 36).

Figure 37:
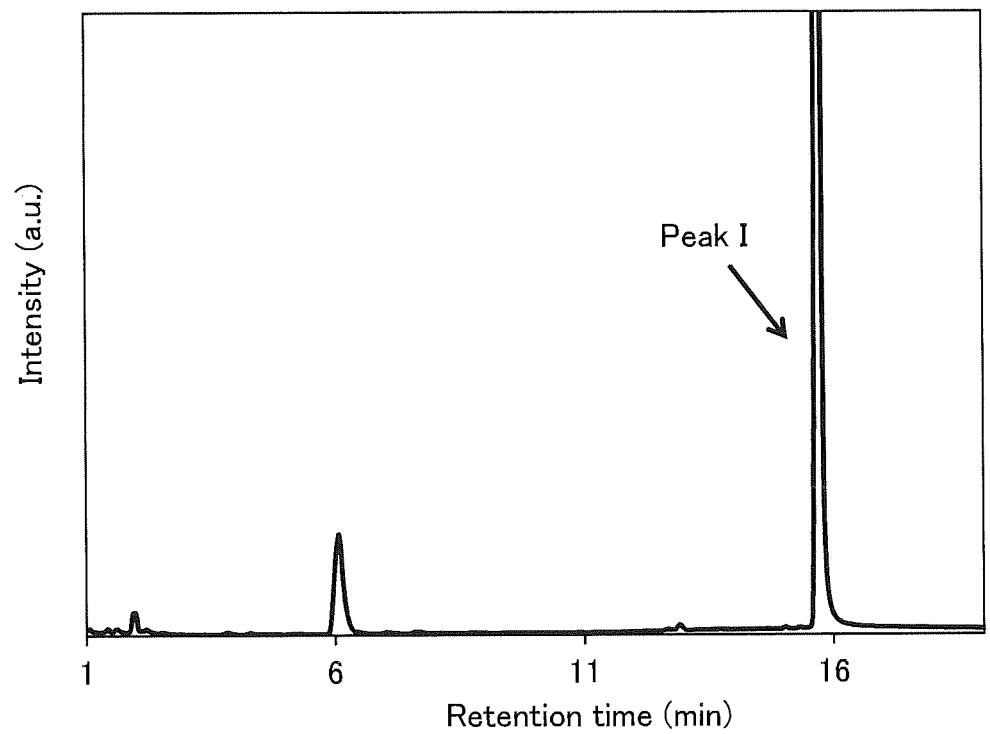
FIG. 37 is a graph explaining a chromatogram of LC in Example.

The prepared mixed solution was put into the LC-MS device and the organic compounds in the mixed solution were separated in the LC portion. FIG. 37 shows a chromatogram obtained with the UV detector (observation wavelength: 254 nm) by the LC analysis.

<Identification of Organic Compound Detected at m/z=818>

A method of identifying the structure of an organic compound detected around m/z=818 will be described below. The organic compound is described as an organic compound 818 below.

In FIG. 37, m/z=819.34 was detected from a peak I. Thus, rough division was performed on the peak I by HPLC, and fractionation ((S7) in FIG. 36) was performed with an LC-MS fraction collector, whereby the organic compound 818 was obtained.

Figure 38A:
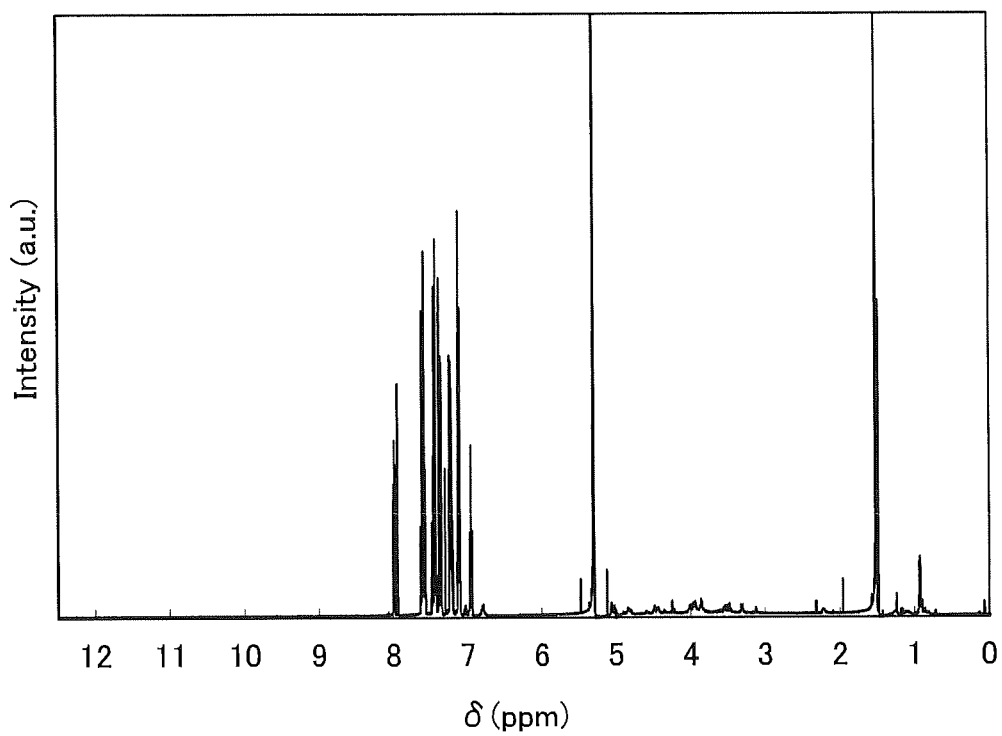
FIGS. 38a and 38b are graphs explaining NMR spectra of organic compounds in Example.
Figure 39A:
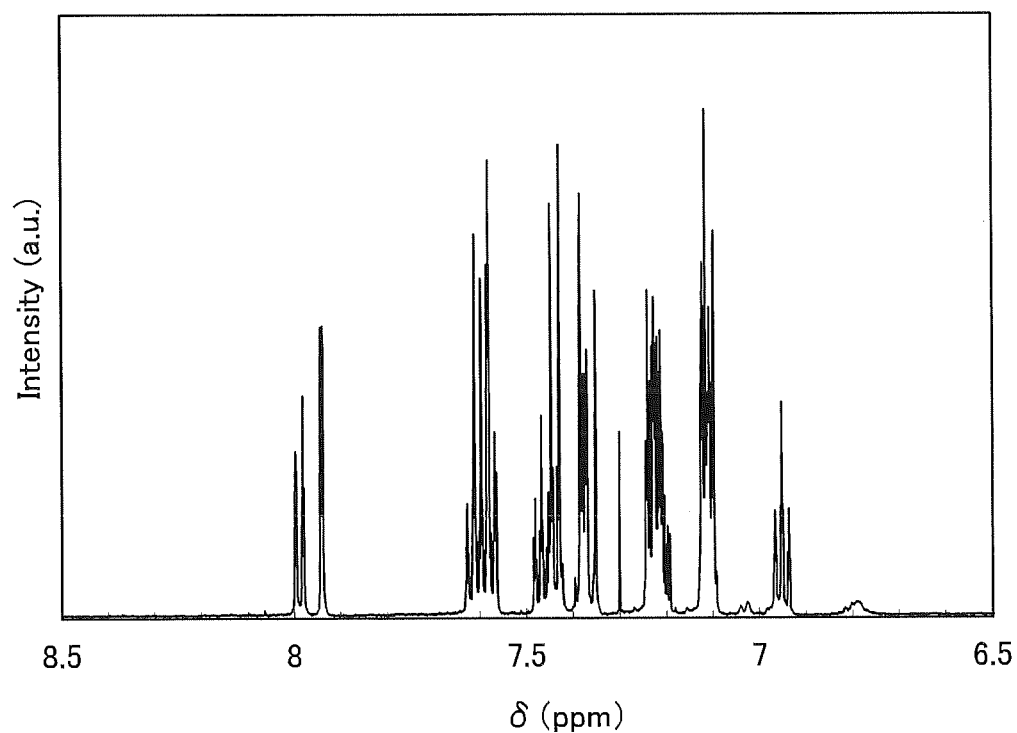
FIGS. 39a and 39b are graphs explaining NMR spectra of organic compounds in Example.

Next, $^1$H-NMR measurement was performed to analyze the structure of the organic compound 818. FIG. 38(a) and FIG. 39(a) show the results. FIG. 39(a) is an enlarged view of 6.5 ppm to 9.0 ppm in FIG. 38(a).

The molecular structure of the organic compound 818 was presumed from m/z=819.34 obtained by the above-described LC-MS measurement, FIG. 38(a), and FIG. 39(a). The organic compound was presumed to be N,N-diphenyl-N,N'-bis(9-phenyl-9-H-carbazol-3-yl)-(1,1'-biphenyl)-4,4'-diamine (abbreviation: BPPCA) shown below.

[Chemical 4]

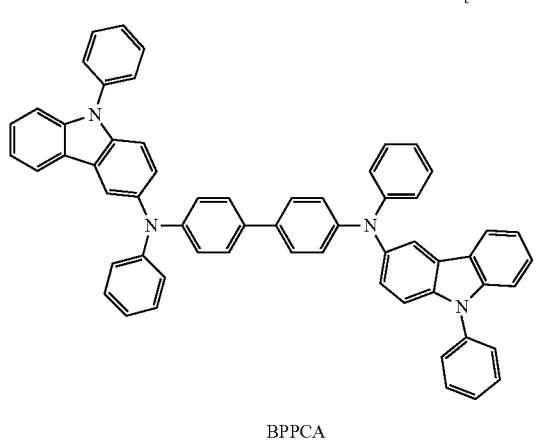

BPPCA

Figure 38B:
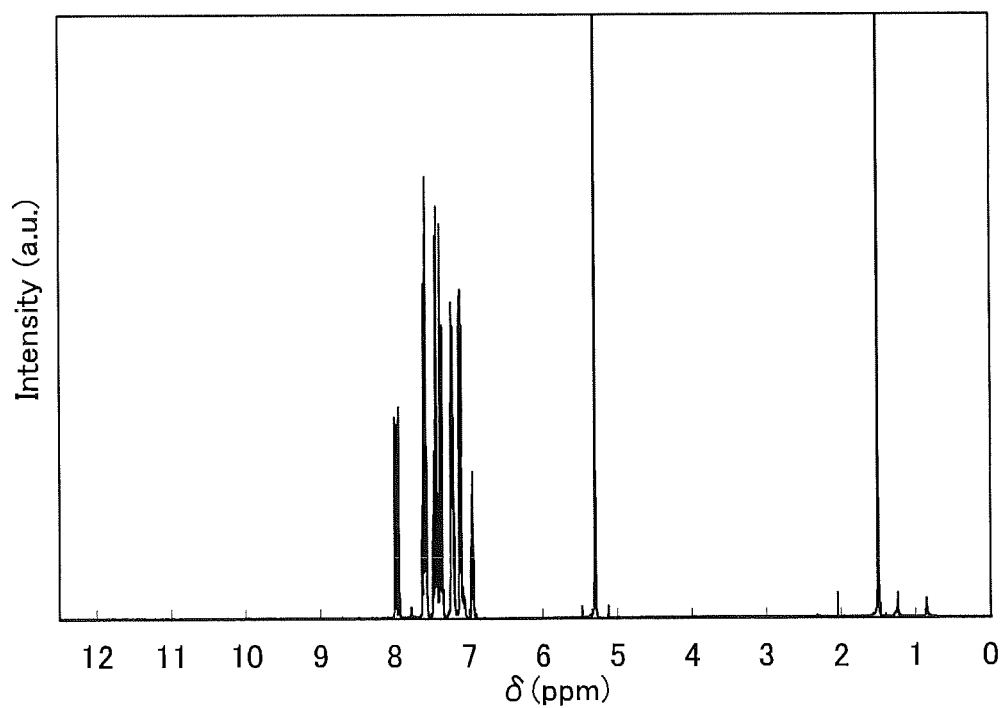
Figure 39B:
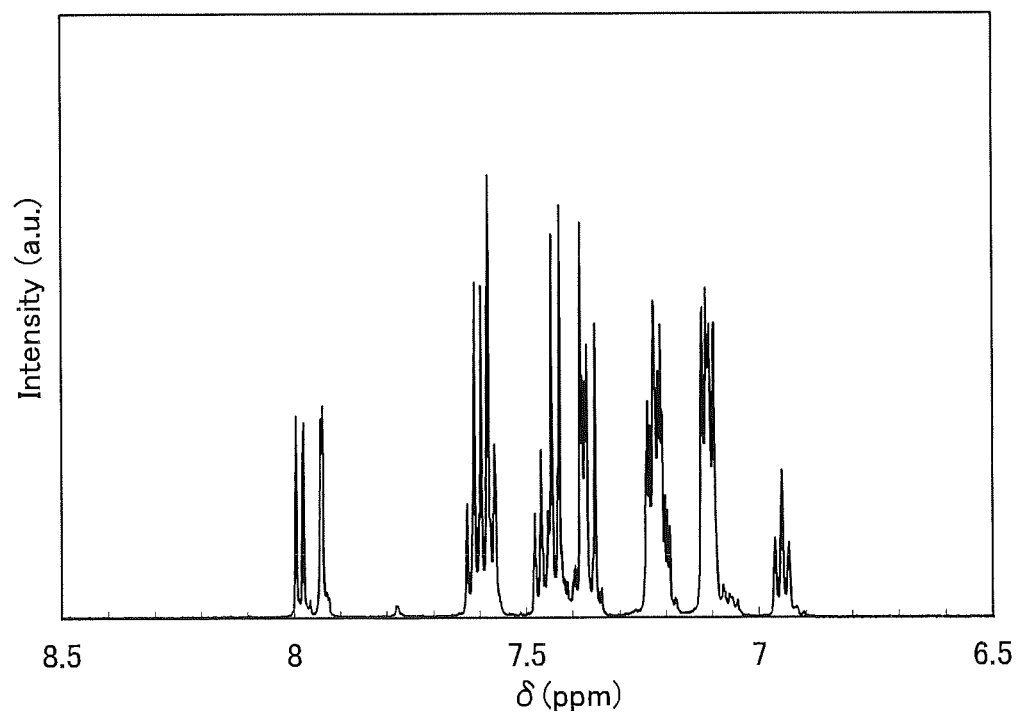

Next, BPPCA was actually synthesized ((S11) in FIG. 4).
The $^1$H-NMR spectrum of synthesized BPPCA was measured. FIG. 38(b) and FIG. 39(b) show the results. FIG. 39(b) is an enlarged view of 6.5 ppm to 9.0 ppm in FIG. 38(b).

According to FIG. 39 to FIG. 39, the $^1$H-NMR spectrum of the organic compound 818 and the $^1$H-NMR spectrum of BPPCA substantially coincide with each other. Therefore, the organic compound 818 was identified as BPPCA. That is, it was found that the electrode substrate side of the light-emitting element 3 includes BPPCA.

This application is based on Japanese Patent Application Serial No. 2017-074690 filed with Japan Patent Office on Apr. 4, 2017, the entire contents of which are hereby incorporated herein by reference.

REFERENCE NUMERALS 20 organic semiconductor layer, 50 organic semiconductor element, 100 EL layer, 101 electrode, 101a conductive layer, 101b conductive layer, 101c conductive layer, 102 electrode, 103 electrode, 103a conductive layer, 103b conductive layer, 104 electrode, 104a conductive layer, 104b conductive layer, 106 light-emitting unit, 110 light-emitting unit, 111 hole-injection layer, 112 hole-transport layer, 113 electron-transport layer, 114 electron-injection layer, 115 charge-generation layer, 116 hole-injection layer, 117 hole-transport layer, 118 electron-transport layer, 119 electron-injection layer, 120 light-emitting layer, 121 host material, 121_1 organic compound, 121_2 organic compound, 122 light-emitting material, 123B light-emitting layer, 123G light-emitting layer, 123R light-emitting layer, 130 light-emitting layer, 131 light-emitting material, 132 organic compound, 145 partition wall, 150 light-emitting element, 170 light-emitting layer, 190 light-emitting layer, 200 substrate, 210 substrate, 220 substrate, 221B region, 221G region, 221R region, 222B region, 222G region, 222R region, 223 light-blocking layer, 224B optical element, 224G optical element, 224R optical element, 250 light-emitting element, 252 light-emitting element, 260a light-emitting element, 260b light-emitting element, 262a light-emitting element, 262b light-emitting element, 400 substrate, 410 substrate, 420 cap film, 601 source side driver circuit, 602 pixel portion, 603 gate side driver circuit, 604 sealing substrate, 605 sealing material, 607 space, 608 wiring, 610 element substrate, 611 switching TFT, 612 current controlling TFT, 613 electrode, 614 insulator, 616 EL layer, 617 electrode, 618 light-emitting element, 623 n-channel TFT, 624 p-channel TFT, 800 substrate, 802 substrate, 810 electrode, 812 electrode, 831 hole-injection layer, 832 hole-transport layer, 833 electron-transport layer, 834 electron-injection layer, 835 charge-generation layer, 837 hole-transport layer, 838 electron-transport layer, 839 electron-injection layer, 840 charge-generation layer, 842 hole-transport layer, 843 electron-transport layer, 844 electron-injection layer, 850 light-emitting layer, 851 light-emitting layer, 852 light-emitting layer, 900 portable information terminal, 901 housing, 902 housing, 903 display portion, 905 hinge portion, 910 portable information terminal, 911 housing, 912 display portion, 913 operation button, 914 external connection port, 915 speaker, 916 microphone, 917 camera, 920 camera, 921 housing, 922 display portion, 923 operation button, 924 shutter button, 926 lens, 1001 substrate, 1002 base insulating film, 1003 gate insulating film, 1006 gate electrode, 1007 gate electrode, 1008 gate electrode, 1020 interlayer insulating film, 1021 interlayer insulating film, 1022 electrode, 1024B electrode, 1024G electrode, 1024R electrode, 1024W electrode, 1025B lower electrode, 1025G lower electrode, 1025R lower electrode, 1025W lower electrode, 1026 partition wall, 1028 EL layer, 1029 electrode, 1031 sealing substrate, 1032 sealing material, 1033 base material, 1034B coloring layer, 1034G coloring layer, 1034R coloring layer, 1036 overcoat layer, 1037 interlayer insulating film, 1040 pixel portion, 1041 driver circuit portion, 1042 peripheral portion, 3054 display portion, 3500 multifunction terminal, 3502 housing, 3504 display portion, 3506 camera, 3508 lighting, 3600 light, 3602 housing, 3608 lighting, 3610 speaker, 8501 lighting device, 8502 lighting device, 8503 lighting device, 8504 lighting device, 9000 housing, 9001 display portion, 9003 speaker, 9005 operation key, 9006 connection terminal, 9007 sensor, 9008 microphone, 9055 hinge, 9200 portable information terminal, 9201 portable information terminal, 9202 portable information terminal.

What is claimed is:

1. A method of analyzing an organic semiconductor element comprising an organic semiconductor layer comprising one or a plurality of layers between a pair of electrodes, comprising:
   a step of separating one of the electrodes of the organic semiconductor element;
   a step of analyzing at least one of a layer structure and a mixed state of the organic semiconductor layer exposed, by a first mass analysis method;
   a step of forming a solution by eluting one or a plurality of organic compounds included in layers in the organic semiconductor layer with a solvent;
   a step of isolating an organic compound included in the solution by liquid chromatography and analyzing the isolated organic compound by a second mass analysis method;
   a step of comparing a mass-to-charge ratio detected by the first mass analysis method and a mass-to-charge ratio detected by the second mass analysis method, and
   a step of measuring a physical property of the isolated organic compound.

2. The method of analyzing an organic semiconductor element, according to claim 1,
   wherein the physical property is at least any one of an NMR spectrum, an absorption spectrum, a light emission spectrum, and a light emission lifetime.

3. The method of analyzing an organic semiconductor element, according to claim 1, further comprising:
   a step of estimating a compositional formula from a mass-to-charge ratio of a first organic compound;
   a step of obtaining a first NMR spectrum of the first organic compound by NMR measurement of the first organic compound;
   a step of estimating a second organic compound with use of the compositional formula and the NMR spectrum;
   a step of synthesizing the second organic compound;
   a step of obtaining a second NMR spectrum of the second organic compound by the NMR measurement, and
   a step of comparing the first NMR spectrum and the second NMR spectrum,
   wherein by the second mass analysis method, at least the first organic compound is detected.

4. The method of analyzing an organic semiconductor element, according to claim 1, further comprising:
   a step of measuring $^1$H-NMR of the solution;
   a step of isolating at least two organic compounds;
   a step of measuring $^1$H-NMR of each of the at least two organic compounds, and
   a step of calculating molar ratios of the at least two organic compounds by comparing $^1$H-NMR of the solution and each $^1$H-NMR of the at least two organic compounds.

5. A method of analyzing an organic semiconductor element comprising an organic semiconductor layer comprising one or a plurality of layers between a pair of electrodes, comprising:
   a step of separating one of the electrodes of the organic semiconductor element;
   a step of analyzing at least one of a layer structure and a mixed state of the exposed organic semiconductor layer by a first mass analysis method;
   a step of identifying a first layer comprising a plurality of organic compounds by the first mass analysis method;
   a step of forming a solution by eluting one or a plurality of organic compounds included in layers in the organic semiconductor layer with a solvent;
   a step of isolating an organic compound included in the solution by liquid chromatography and analyzing the isolated organic compound by a second mass analysis method;
   a step of comparing a mass-to-charge ratio detected by the first mass analysis method and a mass-to-charge ratio detected by the second mass analysis method;
   a step of determining a first organic compound and a second organic compound, which are included in the first layer in the organic semiconductor layer, from isolated compounds;
   a step of measuring a first light emission spectrum of the first organic compound;
   a step of measuring a second light emission spectrum of the second organic compound, and
   a step of measuring a third light emission spectrum of a mixture of the first organic compound and the second organic compound.

6. A method of analyzing an organic semiconductor element comprising an organic semiconductor layer comprising one or a plurality of layers between a pair of electrodes, comprising:
   a step of separating one of the electrodes of the organic semiconductor element;
   a step of analyzing at least one of a layer structure and a mixed state of the exposed organic semiconductor layer by a first mass analysis method and identifying a first layer comprising a plurality of organic compounds;
   a step of forming a solution by eluting one or a plurality of organic compounds included in layers in the organic semiconductor layer with a solvent;
   a step of isolating an organic compound included in the solution by liquid chromatography and analyzing the isolated organic compound by a second mass analysis method;
   a step of comparing a mass-to-charge ratio detected by the first mass analysis method and a mass-to-charge ratio detected by the second mass analysis method and presuming a first organic compound and a second organic compound, which are included in the first layer of the organic semiconductor layer;
   a step of measuring a light emission lifetime of the first organic compound;
   a step of measuring an absorption spectrum of the first organic compound, and
   a step of measuring a light emission spectrum of the second organic compound.

7. A method of analyzing an organic semiconductor element comprising an organic semiconductor layer comprising one or a plurality of layers between a pair of electrodes, comprising:
   a step of separating one of the electrodes of the organic semiconductor element;

a step of analyzing at least one of a layer structure and a mixed state of the exposed organic semiconductor layer by a first mass analysis method and identifying a first layer comprising a plurality of organic compounds;

a step of forming a solution by eluting one or a plurality of organic compounds included in layers in the organic semiconductor layer with a solvent;

a step of isolating an organic compound included in the solution by liquid chromatography and analyzing the isolated organic compound by a second mass analysis method;

a step of comparing a mass-to-charge ratio detected by the first mass analysis method and a mass-to-charge ratio detected by the second mass analysis method to presuming a first organic compound, a second organic compound, and a third organic compound, which are included in the first layer of the organic semiconductor layer;

a step of measuring a light emission lifetime of the first organic compound;

a step of measuring an absorption spectrum of the second organic compound;

a step of measuring a first light emission spectrum of the second organic compound;

a step of measuring a second light emission spectrum of the third organic compound, and a step of measuring a third light emission spectrum of a mixture of the second organic compound and the third organic compound.

8. A method of analyzing an organic semiconductor element comprising an organic semiconductor layer comprising one or a plurality of layers between a pair of electrodes, comprising:

a step of separating one of the electrodes of the organic semiconductor element, a step of analyzing at least one of a layer structure and a mixed state of the exposed organic semiconductor layer by a first mass analysis method and identifying a first layer comprising a plurality of organic compounds;

a step of forming a solution by eluting one or a plurality of organic compounds included in layers in the organic semiconductor layer with a solvent;

a step of isolating an organic compound included in the solution by liquid chromatography and analyzing the isolated organic compound by a second mass analysis method;

a step of comparing a mass-to-charge ratio detected by the first mass analysis method and a mass-to-charge ratio detected by the second mass analysis method and presuming a first organic compound and a second organic compound, which are included in the first layer of the organic semiconductor layer;

a step of measuring an absorption spectrum of the first organic compound, and a step of measuring a light emission spectrum of the second organic compound, wherein the first organic compound comprises Ir.

9. The method of analyzing an organic semiconductor element according to claim 8, further comprising:

a step of comparing the mass-to-charge ratio detected by the first mass analysis method and a mass-to-charge ratio detected by the second mass analysis method and presuming a third organic compound, which is included in the first layer of the organic semiconductor layer;

a step of measuring a light emission spectrum of the third organic compound, and a step of measuring a light emission spectrum of a mixture of the second organic compound and the third organic compound.

10. The method of analyzing an organic semiconductor element, according to claim 1,
wherein the organic semiconductor element is an EL element.

11. The method of analyzing an organic semiconductor element, according to claim 1,
wherein the organic semiconductor element is a photo-electric conversion element.

12. The method of analyzing an organic semiconductor element, according to claim 1,
wherein the organic semiconductor layer is formed of a single organic compound.

13. The method of analyzing an organic semiconductor element, according to claim 1,
wherein the organic semiconductor layer comprises a first layer including a hole-transport material, a second layer including a light-emitting substance, and a third layer including an electron-transport material, and
wherein the first layer, the second layer, and the third layer are stacked in this order from an anode side, the first layer and the second layer are in contact with each other, and the second layer and the third layer are in contact with each other.

14. The method of analyzing an organic semiconductor element, according to claim 13,
wherein a phosphorescent compound is included as the light-emitting substance.

15. The method of analyzing an organic semiconductor element, according to claim 13,
wherein the second layer includes a phosphorescent substance, a first compound, and a second compound, and the first compound and the second compound form an exciplex.

16. The method of analyzing an organic semiconductor element, according to claim 13,
wherein the second layer includes a material exhibiting thermally activated delayed fluorescence.

17. The method of analyzing an organic semiconductor element, according to claim 1,
wherein the first mass analysis method is any one of GCIB-TOF-SIMS analysis, TOF-SIMS after oblique cutting, and MALDI-TOF-MS after oblique cutting.

18. The method of analyzing an organic semiconductor element, according to claim 1,
wherein the second mass analysis method is LC-MS analysis.

19. The method of analyzing an organic semiconductor element, according to claim 1,
wherein in the second mass analysis method, a mass-to-charge ratio detected is measured to three or more decimal places.

20. The method of analyzing an organic semiconductor element, according to claim 1,
wherein the thickness of the organic semiconductor layer is greater than or equal to 100 nm and less than or equal to 1 μm.

21. The method of analyzing an organic semiconductor element, according to claim 1, further comprising a step of processing the organic semiconductor element to have an area greater than or equal to 4 mm$^2$ and less than or equal to 100 cm$^2$.

22. The method of analyzing an organic semiconductor element, according to claim 1, wherein the area of the organic semiconductor element is greater than or equal to 4 mm$^2$ and less than or equal to 100 cm$^2$.

23. The method of analyzing an organic semiconductor element, according to claim 1,
   wherein the weight of the organic semiconductor layer per unit area is greater than or equal to 1 μg/cm$^2$ and less than or equal to 100 μg/cm$^2$.

24. The method of analyzing an organic semiconductor element, according to claim 1,
   wherein the weight of the organic semiconductor layer is greater than or equal to 0.04 μg and less than or equal to 1 mg.

* * * * *